US010254645B2

(12) United States Patent
Yoshida et al.

(10) Patent No.: US 10,254,645 B2
(45) Date of Patent: Apr. 9, 2019

(54) PHOTOSENSITIVE RESIN COMPOSITION, METHOD FOR PRODUCING CURED FILM, CURED FILM, LIQUID CRYSTAL DISPLAY DEVICE, ORGANIC ELECTROLUMINESCENT DISPLAY DEVICE, AND TOUCH PANEL

(71) Applicant: FUJIFILM Corporation, Tokyo (JP)

(72) Inventors: Kenta Yoshida, Haibara-gun (JP);
Takuma Amemiya, Haibara-gun (JP);
Satoru Yamada, Haibara-gun (JP);
Mikio Nakagawa, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/442,935

(22) Filed: Feb. 27, 2017

(65) Prior Publication Data

US 2017/0168391 A1    Jun. 15, 2017

Related U.S. Application Data

(63) Continuation of application No. PCT/JP2015/074955, filed on Sep. 2, 2015.

(30) Foreign Application Priority Data

Sep. 4, 2014    (JP) .................................. 2014-180049
Jul. 1, 2015    (JP) .................................. 2015-132978

(51) Int. Cl.
| | |
|---|---|
| *G03F 7/023* | (2006.01) |
| *G03F 7/40* | (2006.01) |
| *C08G 73/22* | (2006.01) |
| *G03F 7/039* | (2006.01) |
| *G06F 3/041* | (2006.01) |
| *H05B 33/10* | (2006.01) |
| *H05B 33/12* | (2006.01) |
| *H05B 33/22* | (2006.01) |
| *G03F 7/038* | (2006.01) |
| *G03F 7/16* | (2006.01) |
| *G03F 7/20* | (2006.01) |
| *G03F 7/32* | (2006.01) |
| *G03F 7/38* | (2006.01) |

(Continued)

(52) U.S. Cl.
CPC ........... *G03F 7/0233* (2013.01); *C08G 73/22* (2013.01); *G03F 7/038* (2013.01); *G03F 7/039* (2013.01); *G03F 7/0392* (2013.01); *G03F 7/162* (2013.01); *G03F 7/168* (2013.01); *G03F 7/2002* (2013.01); *G03F 7/322* (2013.01); *G03F 7/38* (2013.01); *G03F 7/40* (2013.01); *G06F 3/041* (2013.01); *G06F 3/044* (2013.01); *H05B 33/10* (2013.01); *H05B 33/12* (2013.01); *H05B 33/22* (2013.01); *G02F 1/133345* (2013.01); *H01L 27/3248* (2013.01); *H01L 27/3258* (2013.01); *H01L 51/56* (2013.01); *H01L 2227/323* (2013.01)

(58) Field of Classification Search
CPC ...................................................... G03F 7/0233
USPC ............................... 430/191, 192, 193, 326
See application file for complete search history.

(56) References Cited

U.S. PATENT DOCUMENTS

| | | | | |
|---|---|---|---|---|
| 8,815,489 | B2* | 8/2014 | Jeong .................... | H01L 23/293 430/165 |
| 9,519,216 | B2* | 12/2016 | Naiini ................... | G03F 7/0045 |
| 2004/0253542 | A1 | 12/2004 | Rushkin et al. | |

FOREIGN PATENT DOCUMENTS

| | | |
|---|---|---|
| JP | S 51-074704 A | 6/1976 |
| JP | H 05-125184 A | 5/1993 |

(Continued)

OTHER PUBLICATIONS

International Search Report for PCT/JP2015/074955 dated Dec. 8, 2015.

(Continued)

*Primary Examiner* — John S Chu
(74) *Attorney, Agent, or Firm* — Sughrue Mion, PLLC

(57) ABSTRACT

There are provided a photosensitive resin composition having excellent chemical resistance, light resistance, and solubility in a solvent, a method for producing a cured film, a cured film, a liquid crystal display device, an organic electroluminescent display device, and a touch panel. The photosensitive resin composition contains a polybenzoxazole precursor, a photoacid generator which generates an acid having a pKa of 3 or less or a quinone diazide compound, and a solvent, in which the polybenzoxazole precursor contains a total of 70 mol % or more of a repeating unit represented by the following Formula (1) and a repeating unit represented by the following Formula (2) with respect to the total repeating units, and a ratio between the repeating unit represented by Formula (1) and the repeating unit represented by Formula (2) is 9:1 to 3:7 in a molar ratio. $Y^1$ represents a cyclic aliphatic group having 3 to 15 carbon atoms, and $Y^2$ represents a linear or branched aliphatic group having 4 to 20 carbon atoms.

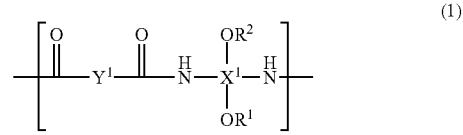

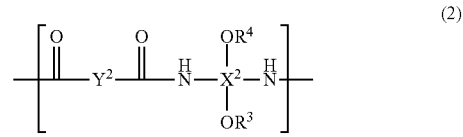

15 Claims, 4 Drawing Sheets

(51) Int. Cl.
   *G06F 3/044*   (2006.01)
   *G02F 1/1333*  (2006.01)
   *H01L 27/32*   (2006.01)
   *H01L 51/56*   (2006.01)

(56) References Cited

FOREIGN PATENT DOCUMENTS

| | | |
|---|---|---|
| JP | 2006-526812 A | 11/2006 |
| JP | 2008-224970 A | 9/2008 |
| JP | 2010-044143 A | 2/2010 |
| JP | 2011-203294 A | 10/2011 |
| JP | 2013-041300 A | 2/2013 |
| JP | 2013-167742 A | 8/2013 |
| WO | 2010-001780 A1 | 12/2011 |

OTHER PUBLICATIONS

Foreign Written Opinion for PCT/JP2015/074955 dated Dec. 8, 2015.
International Preliminary Report on Patentability issued from the International Bureau in counterpart International Application No. PCT/JP2015/074955, dated Mar. 16, 2017.
Office Action dated Jul. 2, 2018 from the Korean Patent Office in counterpart Korean Application No. 10-2017-7005340.

\* cited by examiner

PHOTOSENSITIVE RESIN COMPOSITION, METHOD FOR PRODUCING CURED FILM, CURED FILM, LIQUID CRYSTAL DISPLAY DEVICE, ORGANIC ELECTROLUMINESCENT DISPLAY DEVICE, AND TOUCH PANEL

CROSS-REFERENCE TO RELATED APPLICATIONS

This application is a Continuation of PCT International Application No. PCT/JP2015/074955 filed on Sep. 2, 2015, which claims priority under 35 U.S.C § 119(a) to Japanese Patent Application No. 2014-180049 filed on Sep. 4, 2014 and Japanese Patent Application No. 2015-132978 filed on Jul. 1, 2015. Each of the above application(s) is hereby expressly incorporated by reference, in its entirety, into the present application.

BACKGROUND OF THE INVENTION

1. Field of the Invention

The present invention relates to a photosensitive resin composition. More specifically, the present invention relates to a photosensitive resin composition that is suitable for the formation of a flattened film, a protective film or an interlayer insulating film for electronic components such as a liquid crystal display device, an organic electroluminescent display device, a touch panel, an integrated circuit element, and a solid-state imaging device. In addition, the present invention relates to a method for producing a cured film, a cured film formed by curing a photosensitive resin composition, an image display device such as a liquid crystal display device or an organic electroluminescent display device, and an input device such as a touch panel using a cured film.

2. Description of the Related Art

In image display devices such as a liquid crystal display device and an organic electroluminescent display device and input devices such as a touch panel, a pattern-formed interlayer insulating film is provided in many cases. In order to form the interlayer insulating film, from the viewpoint that the number of steps necessary to obtain a required pattern shape is small and, furthermore, sufficient flatness can be obtained, a photosensitive resin composition is widely used.

In recent years, in order to improve efficiency in production and improve the performance of an image display device, there has been an attempt to carry out a heat treatment or film formation at higher temperature than before (for example, about 300° C.). As a material having high heat resistance, a polybenzoxazole is known. An attempt to prepare a photosensitive resin composition using a polybenzoxazole precursor and form various fine patterns has been made (refer to JP2008-224970A and JP2006-526812A).

SUMMARY OF THE INVENTION

As required properties of a photosensitive resin composition formed using a polybenzoxazole precursor, the polybenzoxazole precursor is required to have excellent solubility in a solvent and to have excellent chemical resistance and light resistance when the composition is formed into a cured film, and the like. In the inventions described in JP2008-224970A and JP2006-526812A, light resistance is not sufficient when the composition is formed into a cured film.

Therefore, an object of the present invention is to provide a photosensitive resin composition having excellent chemical resistance, light resistance, and solubility in a solvent. In addition, another object of the present invention is to provide a method for producing a cured film, a cured film, a liquid crystal display device, an organic electroluminescent display device, and a touch panel.

As a result of investigations conducted by the present inventors, it has been found that the above problem can be solved by using a polybenzoxazole precursor containing a repeating unit represented by Formula (1) and a repeating unit represented by Formula (2), which will be described later, at a predetermined ratio. That is, the present invention provides the followings.

<1> A photosensitive resin composition comprising:
a polybenzoxazole precursor;
at least one selected from a photoacid generator which generates an acid having a pKa of 3 or less, and a quinone diazide compound; and
a solvent,
in which the polybenzoxazole precursor contains a total of 70 mol % or more of a repeating unit represented by the following Formula (1) and a repeating unit represented by the following Formula (2) with respect to the total repeating units in the polybenzoxazole precursor, and a ratio between the repeating unit represented by Formula (1) and the repeating unit represented by Formula (2) is 9:1 to 3:7 in a molar ratio,

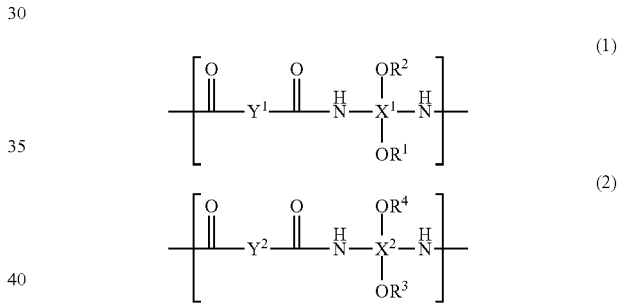

in Formulae (1) and (2), $X^1$ and $X^2$ each independently represent a tetravalent organic group,
$R^1$ to $R^4$ each independently represent a hydrogen atom, an alkyl group, an acid decomposable group or a group represented by —CORc, and at least one of $R^1$ to $R^4$ represents a hydrogen atom or an acid decomposable group,
Rc represents an alkyl group or an aryl group,
$Y^1$ represents a cyclic aliphatic group having 3 to 15 carbon atoms, and
$Y^2$ represents a linear or branched aliphatic group having 4 to 20 carbon atoms.

<2> The photosensitive resin composition according to <1>, in which the photosensitive resin composition comprises a photoacid generator which generates an acid having a pKa of 3 or less, and
10 to 60% of acid groups of the total repeating units of the polybenzoxazole precursor are protected with the acid decomposable group in the polybenzoxazole precursor.

<3> The photosensitive resin composition according to <1> or <2>, in which the polybenzoxazole precursor has a structure in which a terminal is sealed with a monofunctional acid chloride.

<4> The photosensitive resin composition according to any one of <1> to <3>, in which $Y^1$ in Formula (1) is a cyclohexylene group or a biscyclohexylene group.

<5> The photosensitive resin composition according to any one of <1> to <4>, in which $X^1$ in Formula (1) and $X^2$ in Formula (2) each independently represent one selected from the following Formulae (X-1) to (X-4) in the polybenzoxazole precursor,

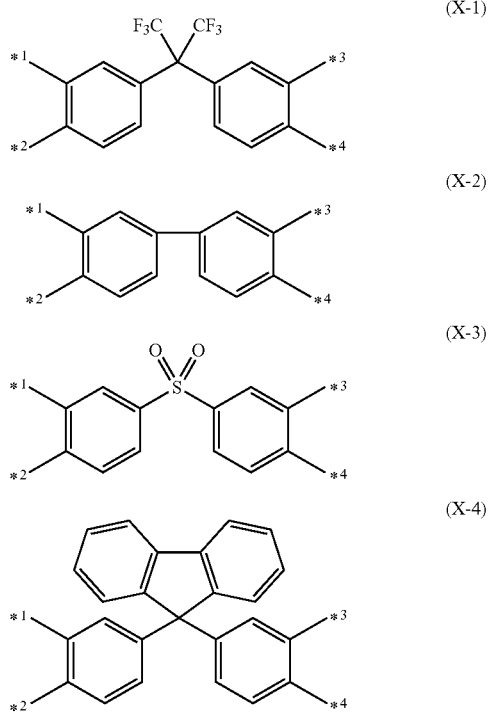

in Formulae (X-1) to (X-4), one of *1 or *2 represents a coupler hand with —$OR^1$ or —$OR^3$ and the other represents a coupler hand with a polymer main chain, and one of *3 or *4 represents a coupler hand with –$OR^2$ or —$OR^4$ and the other represents a coupler hand with a polymer main chain.

<6> A method for producing a cured film comprising:
applying the photosensitive resin composition according to any one of <1> to <5> to a substrate;
removing a solvent from the applied photosensitive resin composition;
exposing the photosensitive resin composition from which the solvent is removed to active radiation;
developing the exposed photosensitive resin composition with a developer; and
thermosetting the developed photosensitive resin composition.

<7> The method for producing a cured film according to <6>, further comprising: exposing the developed photosensitive resin composition after developing and before thermosetting.

<8> A cured film which is formed by curing the photosensitive resin composition according to any one of <1> to <5>.

<9> The cured film according to <8> which is an interlayer insulating layer.

<10> A liquid crystal display device comprising: the cured film according to <8> or <9>.

<11> An organic electroluminescent display device comprising: the cured film according to <8> or <9>.

<12> A touch panel comprising: the cured film according to <8> or <9>.

According to the present invention, it is possible to provide a photosensitive resin composition having excellent chemical resistance, light resistance, and solubility in a solvent. It is also possible to provide a method for producing a cured film, a cured film, a liquid crystal display device, an organic electroluminescent display device, and a touch panel using a photosensitive resin composition.

DESCRIPTION OF THE PREFERRED EMBODIMENTS

Figure 1:
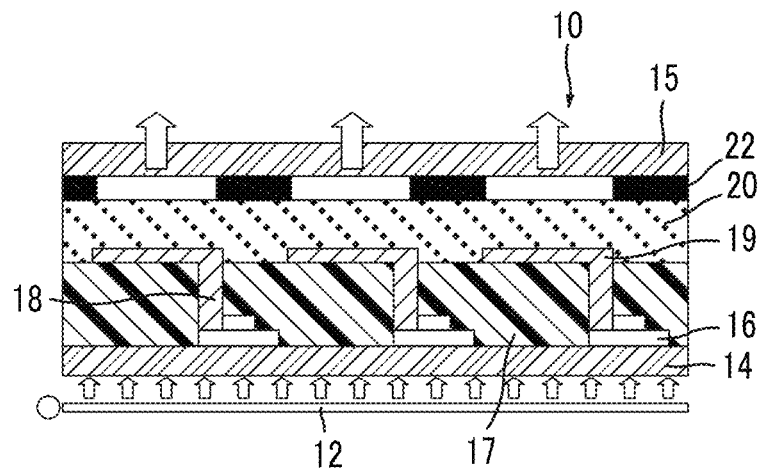
FIG. 1 is a schematic view showing an example of the configuration of a liquid crystal display device.

Hereinafter, the contents of the present invention will be described in detail. The description of the constitution requirements to be described below is made on the basis of representative embodiments of the present invention, but the present invention is not limited to these embodiments.

The numerical range represented by the term "to" in the present specification include the numerical values set forth before and after "to" as lower and upper limits, respectively.

With respect to the expression of a group (atomic group) used in the present specification, the expression even when there is no mention of "substituted and unsubstituted" encompasses groups not only having no substituent but also having substituents. For example, the expression "alkyl groups" encompasses not only alkyl groups having no substituent (unsubstituted alkyl groups) but also alkyl groups having substituents (substituted alkyl groups).

In the present specification, the expression "(meth)acrylate" denotes acrylate and methacrylate, "(meth)acrylic" denotes acrylic and methacrylic, and the expression "(meth)acryloyl" denotes acryloyl and methacryloyl.

In the present specification, the expression of a solid content is a solid content at 25° C.

In the present specification, the weight-average molecular weight and the number average molecular weight of a polymer is defined as values measured in terms of polystyrene by gel permeation chromatography (GPC). The weight-average molecular weight and the number average molecular weight of a polymer may be obtained by using, for example, HLC-8120 (manufactured by TOSOH CORPORATION) using TSK gel Multipore HXL-M (manufactured by TOSOH CORPORATION, 7.8 mm ID×30.0 cm) as a column and tetrahydrofuran (THF) as an eluent.

The photosensitive resin composition of the present invention contains a polybenzoxazole precursor (A), a photoacid generator (B1) which generates an acid having a pKa of 3 or less and/or a quinone diazide compound (B2), and a solvent (C). The polybenzoxazole precursor (A) contains a total of 70 mol % or more of a repeating unit represented by the following Formula (1) and a repeating unit represented by the following Formula (2) with respect to the total repeating units, and a ratio between the repeating unit represented by Formula (1) and the repeating unit represented by Formula (2) is 9:1 to 3:7 in a molar ratio.

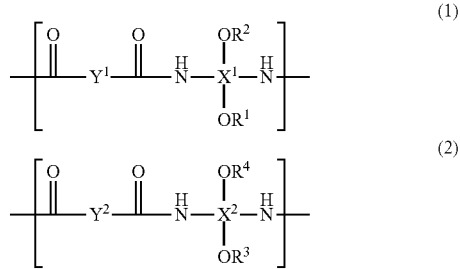

In Formulae (1) and (2), $X^1$ and $X^2$ each independently represent a tetravalent organic group, $R^1$ to $R^4$ each independently represent a hydrogen atom, an alkyl group, an acid decomposable group or a group represented by —CORc, and at least one of $R^1$ to $R^4$ represents a hydrogen atom or an acid decomposable group, Rc represents an alkyl group or an aryl group, $Y^1$ represents a cyclic aliphatic group having 3 to 15 carbon atoms, and $Y^2$ represents a linear or branched aliphatic group having 4 to 20 carbon atoms.

When the polybenzoxazole precursor includes the repeating unit represented by Formula (1), the chemical resistance and light resistance of a cured film can be improved. In addition, when the polybenzoxazole precursor includes the repeating unit represented by Formula (2), the solubility in a solvent can be improved. When the polybenzoxazole precursor includes a total of 70 mol % or more of the repeating unit represented by Formula (1) and the repeating unit represented by Formula (2) with respect to the total repeating units and a ratio between the repeating unit represented by Formula (1) and the repeating unit represented by Formula (2) is 9:1 to 3:7 in a molar ratio, good chemical resistance, light resistance, and solubility in a solvent are achieved and thus a photosensitive resin composition excellent in these properties can be obtained.

The photosensitive resin composition of the present invention may be preferably used as a positive photosensitive resin composition and particularly preferably used as a chemical amplification type positive photosensitive resin composition.

Hereinafter, the present invention will be described in detail.

[First Embodiment of Present Invention]

The photosensitive resin composition according to a first embodiment of the present invention contains a polybenzoxazole precursor (A1), a photoacid generator (B1) which generates an acid having a pKa of 3 or less, and a solvent (C). Each component will be described below.

<(A1) Polybenzoxazole Precursor>

The photosensitive resin composition according to the first embodiment of the present invention contains a polybenzoxazole precursor. The polybenzoxazole precursor contains a total of 70 mol % or more of a repeating unit represented by the following Formula (1) and a repeating unit represented by the following Formula (2) with respect to the total repeating units, and a ratio between the repeating unit represented by Formula (1) and the repeating unit represented by Formula (2) is 9:1 to 3:7 in a molar ratio.

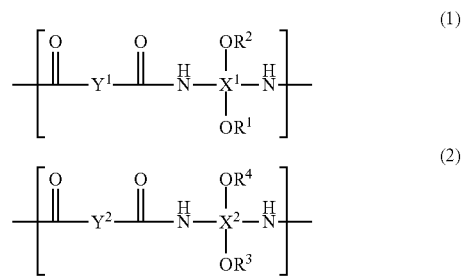

In Formulae (1) and (2), $X^1$ and $X^2$ each independently represent a tetravalent organic group, $R^1$ to $R^4$ each independently represent a hydrogen atom, an alkyl group, an acid decomposable group or a group represented by —CORc, and at least one of $R^1$ to $R^4$ represents a hydrogen atom or an acid decomposable group, Rc represents an alkyl group or an aryl group, $Y^1$ represents a cyclic aliphatic group having 3 to 15 carbon atoms, and $Y^2$ represents a linear or branched aliphatic group having 4 to 20 carbon atoms.

$X^1$ and $X^2$ each independently represent a tetravalent organic group. The tetravalent organic group is not particularly limited and preferably has at least one or more cyclic structures, more preferably has 1 to 10 cyclic structures, and still more preferably has 1 to 5 cyclic structures.

The cyclic structure may include any of an aromatic ring, a heterocyclic ring, and an aliphatic ring and preferably includes an aromatic ring or a heterocyclic ring and more preferably include an aromatic ring. When the tetravalent organic group has a cyclic structure, a cured film having excellent light resistance and chemical resistance is easily formed.

Examples of the aromatic ring include a benzene ring, a naphthalene ring, an anthracene ring, and a fluorene ring. Examples of the heterocyclic ring include a furan ring, a thiophene ring, a pyrrole ring, a pyrroline ring, a pyrrolidine ring, an oxazole ring, an isoxazole ring, a thiazole ring, an isothiazole ring, an imidazole ring, an imidazoline ring, an imidazolidine ring, a pyrazole ring, a pyrazoline ring, a pyrazolidine ring, a triazole ring, a furazane ring, a tetrazole ring, a pyran ring, a thiine ring, a pyridine ring, a piperidine ring, an oxazine ring, a morpholine ring, a thiazine ring, a pyridazine ring, a pyrimidine ring, a pyrazine ring, a piperazine ring and a triazine ring. Examples of the alicyclic ring include a cyclopentane ring, a cyclohexane ring, and a cycloheptane ring.

In the case in which the tetravalent organic group has plural cyclic structures, the rings may be condensed or plural rings may be singly bonded to each other or coupled with each other through a linking group. For example, the linking group is preferably a group composed of —O—, —S—, —C(CF$_3$)$_2$—, —CH$_2$—, —SO$_2$—, —NHCO—, and a combination thereof, more preferably a group composed of —SO$_2$—, —CH$_2$—, —C(CF$_3$)$_2$—, and a combination thereof, and even more preferably —C(CF$_3$)$_2$—.

It is more preferable that the tetravalent organic group is a group having plural cyclic structures and it is more preferable that 2 or more aromatic rings are singly bonded to each other or coupled with each other through a linking group.

Specific examples of $X^1$ and $X^2$ are as follows. Among the following formulae, one of *1 or *2 represents a coupler hand with —$OR^1$ or —$OR^3$ and the other represents a coupler hand with a polymer main chain, and one of *3 or *4 represents a coupler hand with —$OR^2$ or —$OR^4$ and the other represents a coupler hand with a polymer main chain.

$X^1$ and $X^2$ preferably represent (X-1) to (X-4), more preferably (X-1), (X-3), and (X-4), and particularly preferably (X-1). When $X^1$ and $X^2$ represent (X-1), a photosensitive resin composition having excellent solubility in a solvent and sensitivity is easily obtained.

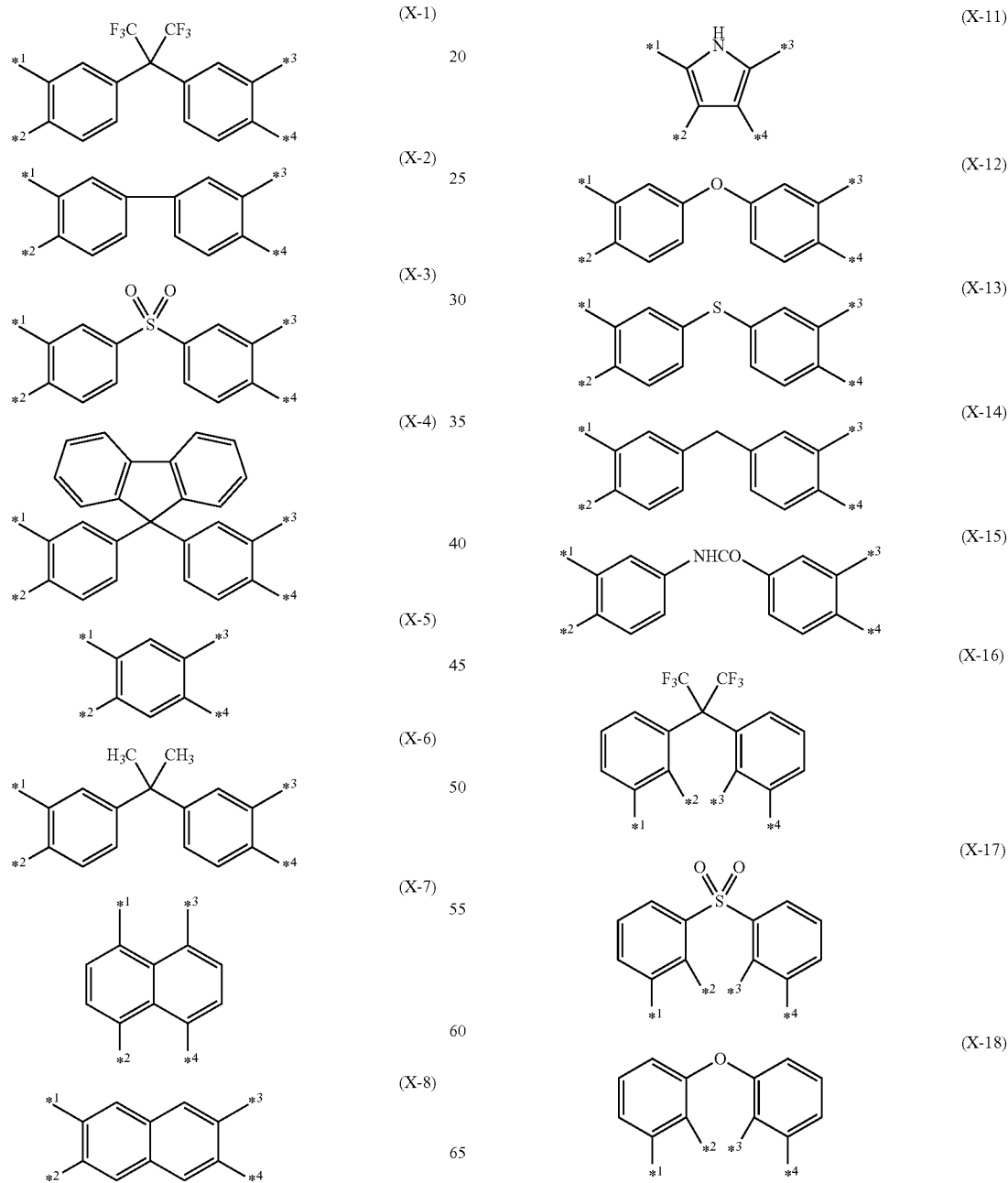

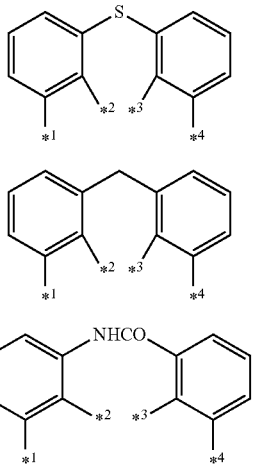

R[1] to R[4] each independently represent a hydrogen atom, an alkyl group, an acid decomposable group or —CORc, at least one of R[1] to R[4] represents a hydrogen atom or an acid decomposable group, and Rc represents an alkyl group or an aryl group. It is preferable that at least one of R[1] to R[4] is an acid decomposable group.

The alkyl group represented by R[1] to R[4] may be liner, branched, or cyclic. In the case of a linear alkyl group, the number of carbon atoms is preferably 1 to 20, more preferably 1 to 15, and still more preferably 1 to 10. In the case of a branched alkyl group, the number of carbon atoms is preferably 3 to 20, more preferably 3 to 15, and still more preferably 3 to 10. In the case of a cyclic alkyl group, the number of carbon atoms is preferably 3 to 15, more preferably 5 to 15, and still more preferably 5 to 10. Specific examples of the alkyl group include a methyl group, an ethyl group, a propyl group, an isopropyl group, a butyl group, an isobutyl group, an octyl group, a cyclopentyl group, a cyclohexyl group, a norbornyl group, and an adamantyl group. The alkyl group may have a substituent or may be unsubstituted.

Examples of the substituent include halogen atoms such as a fluorine atom, a chlorine atom, a bromine atom, and an iodine atom, cyano groups, amide groups, and sulfonyl amide groups.

For the acid decomposable group represented by R[1] to R[4], any acid decomposable group may be preferably used as long as the acid decomposable group is decomposed by action of acid to generate an alkali-soluble group such as a hydroxyl group or a carboxyl group. Examples thereof include an acetal group, a ketanyl group, a silyl group, a silyl ether group, a tertiary alkyl ester group. From the viewpoint of sensitivity, an acetal group is preferable.

Specific examples of the acid decomposable group include a tert-butoxycarbonyl group, an isopropoxycarbonyl group, a tetrahydropyranyl group, a tetrahydrofuranyl group, an ethoxyethyl group, a methoxyethyl group, an ethoxymethyl group, a trimethylsilyl group, a tert-butoxycarbonyl methyl group, and a trimethylsilyl ether group. From the viewpoint of sensitivity, an ethoxyethyl group and a tetrahydrofuranyl group are preferable.

Rc represents an alkyl group or an aryl group.

The alkyl group represented by Rc has the same meaning as the alkyl group in the description of R[1] to R[4], and the preferable range thereof is also the same. The alkyl group may have a substituent or may not be unsubstituted. As the substituent, the aforementioned examples may be used.

The aryl group represented by Rc is preferably an aryl group having 6 to 20 carbon atoms, more preferably an aryl group having 6 to 14 carbon atoms, and still more preferably an aryl group having 6 to 10 carbon atoms. Specific examples of the aryl group include a phenyl group, a toluyl group, a mesityl group, and a naphthyl group. The aryl group may have a substituent or may be unsubstituted. As the substituent, the aforementioned examples may be used.

In the photosensitive resin composition of the first embodiment of the present invention, the polybenzoxazole precursor preferably contains an acid decomposable group. It is preferable that 5 to 80% of the acid groups of the total repeating units of the polybenzoxazole precursor are protected with the acid decomposable group and it is more preferable that 10 to 60% of the acid groups of the total repeating units are protected with the acid decomposable group. The lower limit is still more preferably 15% or more. The upper limit is more preferably 50% or less and still more preferably 45% or less. According to this embodiment, a photosensitive resin composition having high sensitivity can be formed. Particularly, when the content of the acid decomposable group is controlled to be within the above range, sensitivity is further improved. The expression "acid groups of the total repeating units of the polybenzoxazole precursor used herein means acid groups of the total repeating groups of the polybenzoxazole precursor before being protected by the acid decomposable group. The acid group is preferably a hydroxyl group directly bonded to an aromatic ring and more preferably a phenolic hydroxyl group.

In Formula (1), Y[1] represents a cyclic aliphatic group having 3 to 15 carbon atoms. When Y[1] is a cyclic aliphatic group having 3 to 15 carbon atoms, a cured film having excellent light resistance and chemical resistance can be obtained.

Examples of the cyclic aliphatic group include a cyclic alkylene group, a cyclic alkenylene group, and a cyclic alkynylene group. The number of carbon atoms of the cyclic aliphatic group is 3 to 15 and preferably 6 to 12. When the number of carbon atoms is controlled to be within the above range, a cured film having excellent light resistance and chemical resistance can be obtained. The cyclic aliphatic group is preferably a 6-membered ring. The cyclic aliphatic group represented by Y[1] may have a substituent or may be unsubstituted. The cyclic aliphatic group is preferably unsubstituted.

Examples of the substituent include an alkyl group, an alkenyl group, an alkynyl group, an aryl group, an alkoxy group, an aryloxy group, and a halogen atom.

In the case in which the cyclic aliphatic group has a substituent, the number of carbon atoms of the cyclic aliphatic group is a value excluding the number of carbon atoms of the substituent.

Specific examples of Y[1] include a residue remaining after the removal of a carboxyl group from a cyclic aliphatic dicarboxylic acid (cyclic aliphatic group). Specifically, the groups shown below may be exemplified. A cyclopropylene group, a cyclobutylene group, a cyclopentylene group, a cyclohexylene group, a biscyclohexylene group, or an adamantylene group is preferable, and a cyclohexylene group or a biscyclohexylene group is more preferable.

-continued

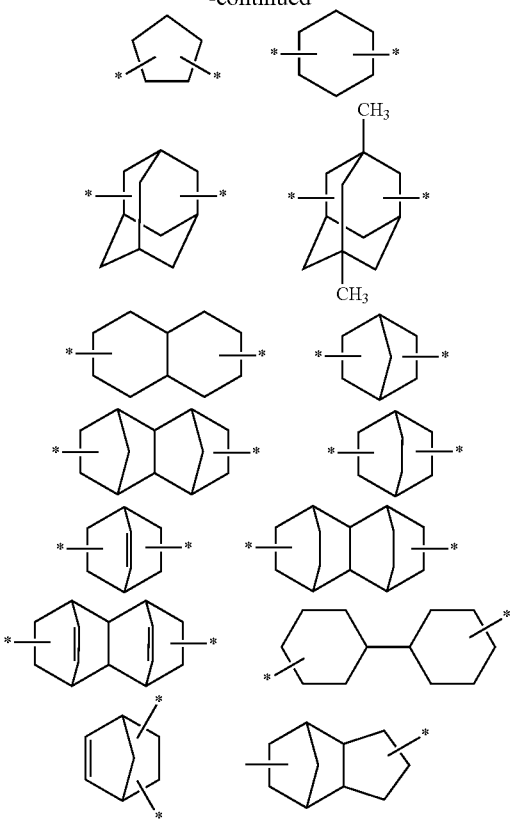

In Formula (2), $Y^2$ represents a linear or branched aliphatic group having 4 to 20 carbon atoms. A linear unsubstituted aliphatic group is preferable. When $Y^2$ is a linear or branched aliphatic group having 4 to 20 carbon atoms, excellent solubility in a solvent is achieved.

Examples of the linear or branched aliphatic group include an alkylene group, an alkenylene group, an alkynylene group, and a polyoxyalkylene group. An alkylene group, an alkenylene group, and an alkynylene group are preferable and an alkylene group is more preferable.

The number of carbon atoms of the linear or branched aliphatic group is 4 to 20, preferably 4 to 15, and more preferably 4 to 12. When the number of carbon atoms is controlled to be within the above range, good solubility in a solvent is obtained.

Specific examples of $Y^2$ include a residue remaining after the removal of a carboxylic group from a linear aliphatic dicarboxylic acid or a branched aliphatic dicarboxylic acid (aliphatic group).

Examples of the linear aliphatic dicarboxylic acid include adipic acid, pimelic acid, suberic acid, azelaic acid, sebacic acid, undecanedioic acid, dodecanedioic acid, tridecanedioic acid, tetradecanedioic acid, pentadecanedioic acid, hexadecanedioic acid, heptadecanedioic acid, octadecanedioic acid, nonadecanedioic acid, eicosanedioic acid, and docosanedioic acid.

Examples of the branched aliphatic dicarboxylic acid include 3-methylglutaric acid, 3,3-dimethylglutaric acid, 2-methyladipic acid, 2-ethyladipic acid, 2-propyladipic acid, 2-butyladipic acid, 3-methyladipic acid, 3-tert-butyladipic acid, 2,3-dimethyladipic acid, 2,4-dimethyladipic acid, 3,3-dimethyladipic acid, 3,4-dimethyladipic acid, 2,4,4-trimethyladipic acid, 2,2,5,5-tetramethyladipic acid, 2-methylpimelic acid, 3-methylpimelic acid, 3-methylsuberic acid, 2-methylsebacic acid, and nonane-2,5-dicarboxylic acid.

In the present invention, the polybenzoxazole precursor (A) contains a total of 70 mol % or more of the repeating units represented by Formulae (1) and (2) with respect to the total repeating units, preferably contains a total of 70 to 100 mol %, and more preferably contains a total of 80 to 100 mol %. It is still more preferable that the polybenzoxazole precursor is substantially composed of only the repeating unit represented by Formula (1) and the repeating unit represented by Formula (2). According to the embodiment, a cured film having excellent light resistance is easily obtained.

In the present invention, the expression "substantially composed of only the repeating unit represented by Formula (1) and the repeating unit represented by Formula (2)" means that the content of repeating units other than the repeating units represented by Formulae (1) and (2) is preferably, for example, 5 mol % or less and more preferably 1 mol % or less, and it is still more preferable that repeating units other than the repeating units represented by Formulae (1) and (2) are not contained in the polybenzoxazole precursor.

In the present invention, in the polybenzoxazole precursor (A), the ratio between the repeating unit represented by Formula (1) and the repeating unit represented by Formula (2) is preferably 9:1 to 3:7, more preferably 8.5:1.5 to 3.5:6.5, and still more preferably 8:2 to 4:6 in a molar ratio.

In addition, for example, in the case in which $Y^1$ in Formula (1) is a cyclohexylene group or a biscyclohexylene group and $Y^2$ in Formula (2) is a linear or branched aliphatic group having 4 to 20 carbon atoms, the ratio between the repeating unit represented by Formula (1) and the repeating unit represented by Formula (2) is preferably 8.5:1.5 to 4:6, more preferably 7.5:2.5 to 4:6, still more preferably 7.5:2.5 to 5:5, even still more preferably 7.5:2.5 to 5.5:4.5, and particularly preferably 7.5:2.5 to 6:4 in a molar ratio.

Further, for example, in the case in which $Y^1$ in Formula (1) is an adamantylene group and $Y^2$ in Formula (2) is a linear or branched aliphatic group having 4 to 20 carbon atoms, the ratio between the repeating unit represented by Formula (1) and the repeating unit represented by Formula (2) is preferably 6.5:3.5 to 4:6 and more preferably 6:4 to 5:5 in a molar ratio.

《Other Repeating Units》

The polybenzoxazole precursor may include repeating units other than the repeating unit represented by Formula (1) and the repeating unit represented by Formula (2) (also referred to as "other repeating units").

Examples of other repeating units include a repeating unit represented by Formula (a1) and a repeating unit represented by Formula (a2).

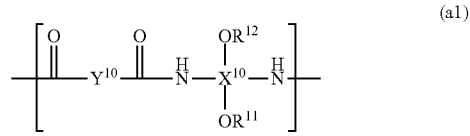 (a1)

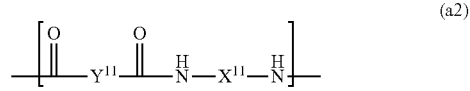 (a2)

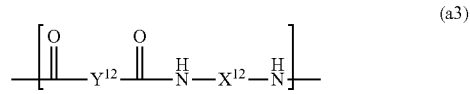 (a3)

In Formula (a1), $X^{10}$ represents a tetravalent organic group, $Y^{10}$ represents an aromatic ring group, $R^{11}$ and $R^{12}$ each independently represent a hydrogen atom, an alkyl group, an acid decomposable group, or —CORc.

In Formula (a1), the ranges of $X^{10}$, $R^{11}$, and $R^{12}$ are the same as the ranges of $X^1$, $X^2$, and $R^1$ to $R^4$ described in Formulae (1) and (2) and the preferable ranges thereof are also the same.

In Formula (a1), $Y^{10}$ represents an aromatic ring group. The aromatic ring group may be monocyclic or polycyclic. The aromatic ring group may be a heteroaromatic ring group including a hetero atom. Specific examples of the aromatic ring group include a benzene ring, a naphthalene ring, a phenanthrene ring, an indene ring, an azulene ring, a heptalene ring, an indesen ring, a perylene ring, a pentacene ring, an acenaphthalene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, and, a phenazine ring.

In Formula (a2), $Y^{11}$ represents an aromatic ring group, a cyclic aliphatic group, a linear aliphatic group, a branched aliphatic group, or a group formed by combination of these groups and at least one selected from —$CH_2$—, —O—, —S—, —$SO_2$—, —CO—, —NHCO—, and —$C(CF_3)_2$—, and $X^{11}$ represents an aromatic ring group, a cyclic aliphatic group, or a group formed by combination of these groups and at least one selected from —$CH_2$—, —O—, —S—, —$SO_2$—, —CO—, —NHCO—, and —$C(CF_3)_2$—.

As the aromatic ring group, the cyclic aliphatic group, the linear aliphatic group, and the branched aliphatic group, the aforementioned examples may be exemplified and the preferable ranges thereof are also the same.

In Formula (a3), $Y^{12}$ represents an aromatic ring group, a cyclic aliphatic group, a linear aliphatic group, a branched aliphatic group, or a group formed by combination of these groups and at least one of —$CH_2$—, —O—, —S—, —$SO_2$—, —CO—, —NHCO—, and —$C(CF_3)_2$—, and $X^{12}$ represents a group including a silicon atom.

As the aromatic ring group, the cyclic aliphatic group, the linear aliphatic group, and the branched aliphatic group, the aforementioned examples may be exemplified and the preferable ranges thereof are also the same.

It is preferable that the group represented by $X^{12}$ and including a silicon atom is a group represented as blow.

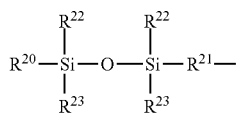

$R^{20}$ and $R^{21}$ each independently represent a divalent organic group and $R^{22}$ and $R^{23}$ each independently represent a monovalent organic group.

The divalent organic group represented by $R^{20}$ and $R^{21}$ is not particularly limited and specific examples thereof include a linear or branched alkylene group having 1 to 20 carbon atoms, an arylene group having 6 to 20 carbon atoms, a divalent cyclic aliphatic group having 3 to 20 carbon atoms, and a group formed by combination of these groups.

The number of carbon atoms of the linear or branched alkylene group is preferably 1 to 20, more preferably 1 to 10, and still more preferably 1 to 6. Specific examples thereof include a methylene group, an ethylene group, a propylene group, an isopropylene group, a butylene group, and a t-butylene group.

The number of carbon atoms of the arylene group is preferably 6 to 20, more preferably 6 to 14, and still more preferably 6 to 10. Specific examples of the arylene group include a 1,4-phenylene group, a 1,3-phenylene group, a 1,2-phenylene group, a naphthylene group, and an anthracenylene group.

The number of carbon atoms of the divalent cyclic aliphatic group is preferably 3 to 20, more preferably 3 to 10, and still more preferably 5 to 6. Examples of the divalent cyclic aliphatic group include a 1,4-cyclohexylene group, a 1,3-cyclohexylene group, a 1,2-cyclohexylene group.

The linear or branched alkylene group having 1 to 20 carbon atoms, the arylene group having 6 to 20 carbon atoms, and the divalent cyclic aliphatic group having 3 to 20 carbon atoms may have a substituent. Examples of the substituent include an alkyl group having 1 to 6 carbon atoms, a halogen atom, a cyano group, an amino group, and a sulfonylamide group.

The group formed by combination of the linear or branched alkylene group having 1 to 20 carbon atoms, the arylene group having 6 to 20 carbon atoms, or the divalent cyclic aliphatic groups having 3 to 20 carbon atoms are not particularly limited and are preferably groups formed by combining groups formed by combination of the divalent cyclic aliphatic group having 3 to 20 carbon atoms. Specific examples of groups formed by combination of linear or branched alkylene groups having 1 to 20 carbon atoms, arylene groups having 6 to 20 carbon atoms, and divalent cyclic aliphatic groups having 3 to 20 carbon atoms include the following groups. However, there is no limitation thereto.

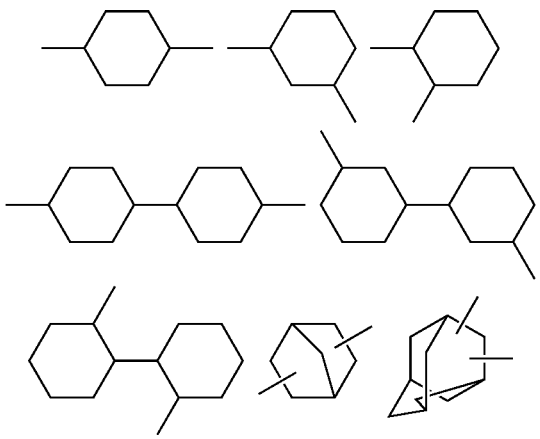

Examples of the monovalent organic group represented by $R^{22}$ and $R^{23}$ include a linear or branched alkyl group having 1 to 20 carbon atoms and an aryl group having 6 to 20 carbon atoms.

The number of carbon atoms of the linear or branched alkyl group is preferably 1 to 20, more preferably 1 to 10, and still more preferably 1 to 6. Specific examples of the alkyl group include a methyl group, an ethyl group, a propyl group, an isopropyl group, a butyl group, and a t-butyl group.

The number of carbon atoms of the aryl group is preferably 6 to 20, more preferably 6 to 14, and still more preferably 6 to 10. Specific examples of the aryl group include a phenyl group, a toluyl group, a mesityl group, and a naphthyl group.

The linear or branched alkyl group having 1 to 20 carbon atoms and the aryl group may have a substituent. Examples of the substituent include an alkyl group having 1 to 6 carbon atoms, a halogen atom, a cyano group, an amino group, and a sulfonylamide group.

The polybenzoxazole precursor in the present invention preferably has a structure in which the terminal is sealed with a monofunctional acid chloride. According to the embodiment, a cured film having a good transmittance is easily obtained. Examples of the monofunctional acid chloride include cetyl chloride, butyryl chloride, propionic acid chloride, 2-ethyl hexanoic acid chloride, cyclohexane carboxylic acid chloride, benzoyl chloride, naphthoyl chloride, acrylic acid chloride, heptanoic acid chloride, isobutyryl chloride, isononanoyl chloride, neodecanoyl chloride, octanoyl chloride, pivaloyl chloride, valeroyl chloride, methoxyacetyl chloride, acetoxyacetyl chloride, phenylacetyl chloride, cinnamoyl chloride, methacryloyl chloride, 2-furoyl chloride, 3-chloropropionyl chloride, 4-chlorobutyryl chloride, 5-chlorovaleroyl chloride, dimethylcarbamoyl chloride, methyl chloroformate, ethyl chloroformate, propyl chloroformate, n-butyl chloroformate, sec-butyl chloroformate, pentyl chloroformate, n-hexyl chloroformate, n-octyl chloroformate, 2-ethylhexyl chloroformate, cyclohexyl chloroformate, 4-tert-butylcyclohexyl chloroformate, cetyl chloroformate, benzyl chloroformate, and 2-chloromethyl chloroformate.

From the viewpoint of solubility in a solvent, acid chlorides having 3 or more carbon atoms are preferable. From the viewpoint of solvent resistance, acid chlorides having 12 or less carbon atoms are preferable. From the viewpoint of heat stability, carboxylic acid chlorides are preferable.

The polybenzoxazole precursor in the present invention preferably has a group represented by Formula (b1) at one terminal or both terminals thereof and more preferably has a group represented by Formula (b1) at both terminals thereof.

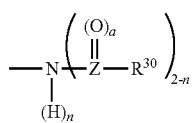

Formula (b1)

In Formula (b1), Z represents a single bond, a carbon atom, or a sulfur atom, $R^{30}$ represents a monovalent organic group, n represents 0 or 1, in the case in which Z is a single bond, a is 0, in the case in which Z is a carbon atom, a is 1, in the case in which Z is a sulfur atom, a is 2, and in the case in which n is 0, two $R^{30}$'s may be bonded to each other to form a ring.

Z represents a single bond, a carbon atom, or a sulfur atom and is preferably a single bond or a carbon atom.

$R^{30}$ represents a monovalent organic group. The monovalent organic group is not particularly limited and organic groups having a formula weight per molecule of 20 to 500 are exemplified. In addition, the atom constituting the monovalent organic group is preferably selected from a carbon atom, an oxygen atom, a nitrogen atom, a hydrogen atom, and a sulfur atom and more preferably selected from a carbon atom, an oxygen atom, a nitrogen atom, and a hydrogen atom.

Specifically, an alkyl group (preferably having 1 to 10 carbon atoms and more preferably having 1 to 6 carbon atoms), an alkenyl group (preferably having 2 to 10 carbon atoms and more preferably 2 to 6 carbon atoms), an alkynyl group (preferably having 2 to 10 carbon atoms and more preferably having 2 to 6 carbon atoms), an aryl group (preferably having 6 to 20 carbon atoms and more preferably having 6 to 10 carbon atoms), an alkoxy group (preferably having 1 to 10 carbon atoms and more preferably having 1 to 6 carbon atoms), a carboxyl group, a crosslinking group, and a group formed by combination of an oxygen atom, a carbonyl group, a sulfonyl group, an arylene group (preferably having 6 to 20 carbon atoms and more preferably having 6 to 10 carbon atoms), an alkylene group (preferably having 1 to 10 carbon atoms and more preferably having 1 to 6 carbon atoms), an alkenylene group (preferably having 2 to 10 carbon atoms and more preferably having 2 to 6 carbon atoms), and an alkynylene group (preferably having 2 to 10 carbon atoms and more preferably having 2 to 6 carbon atoms) with an alkenyl group, an alkynyl group, an aryl group, a carbonyl group, a carboxyl group, an oxygen atom, an alkylene group, an alkynylene group or an arylene group are preferable.

These groups may have a substituent and examples of the substituent include a hydroxyl group, an alkyl group, a halogen atom, a cyano group, an amide group, and a sulfonyl amide group.

Specific examples of the group represented by Formula (b1) include the followings. However, there is no limitation thereto. In the formula, Ph represents a phenyl group and n-Pr represents an n-propylene group.

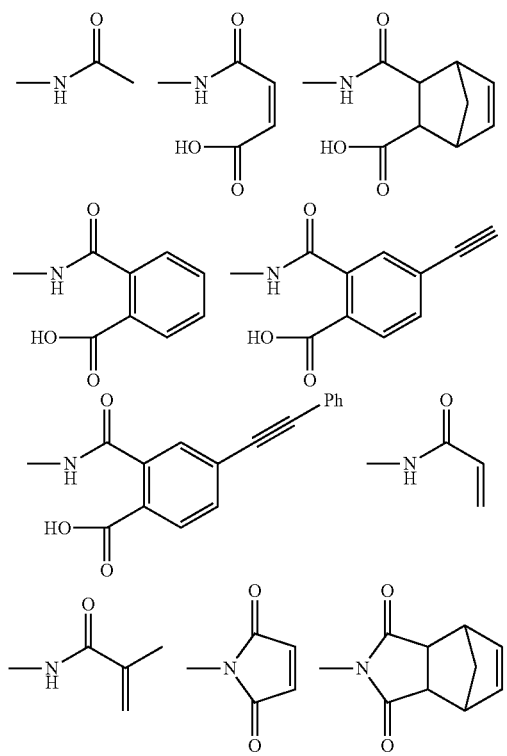

17
-continued
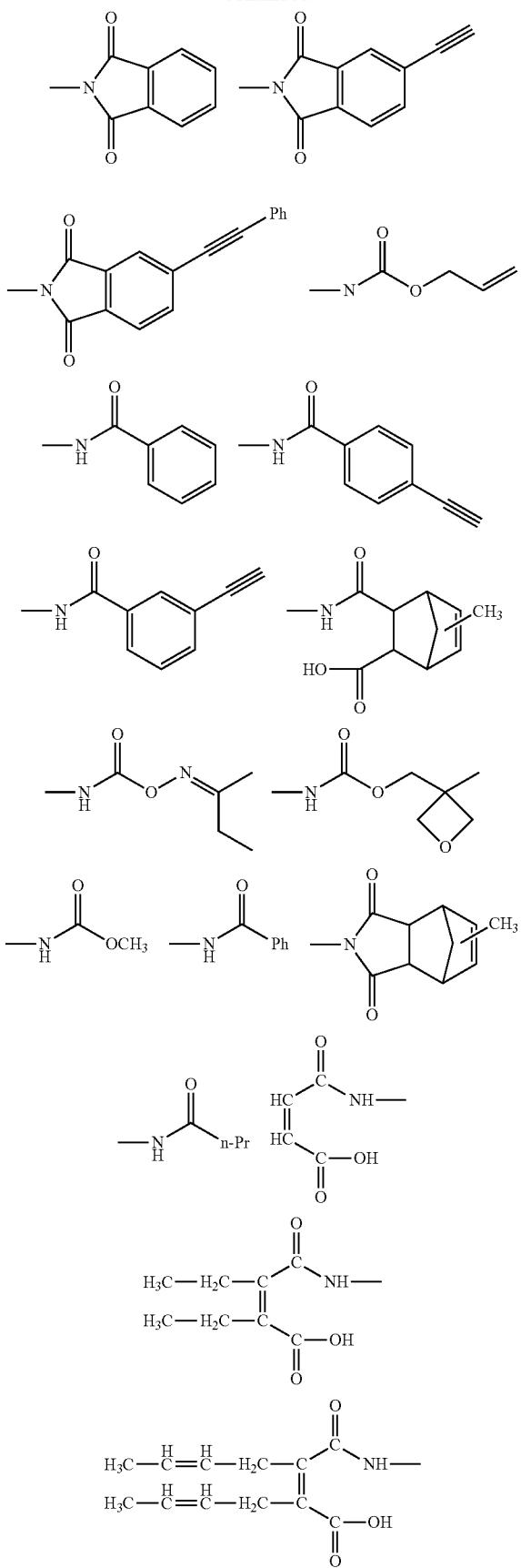
18
-continued
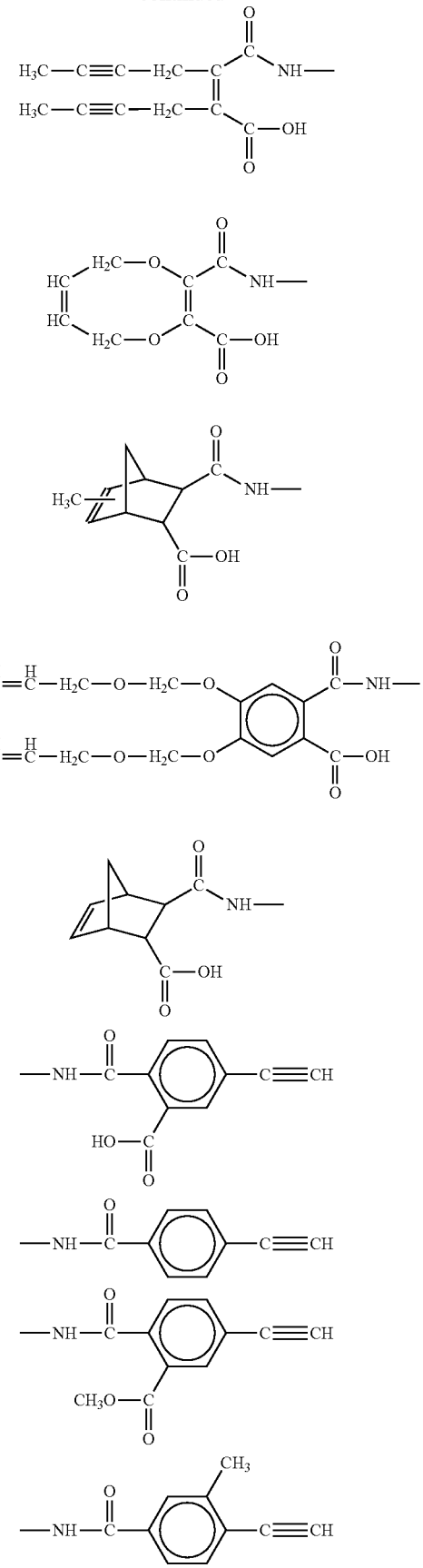

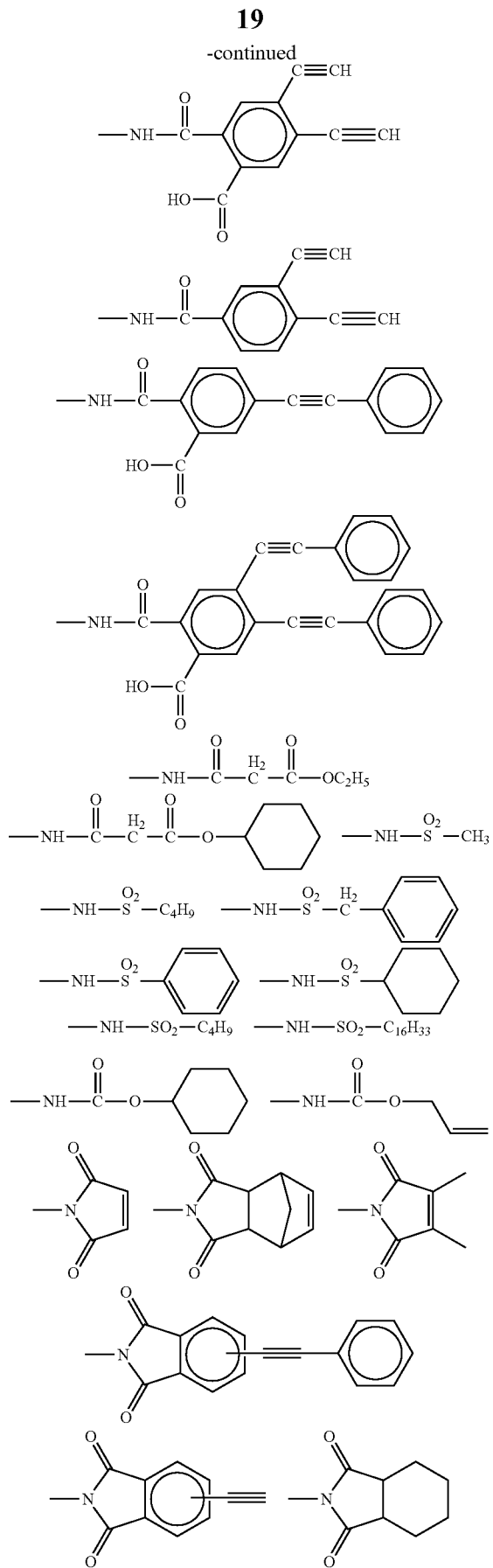
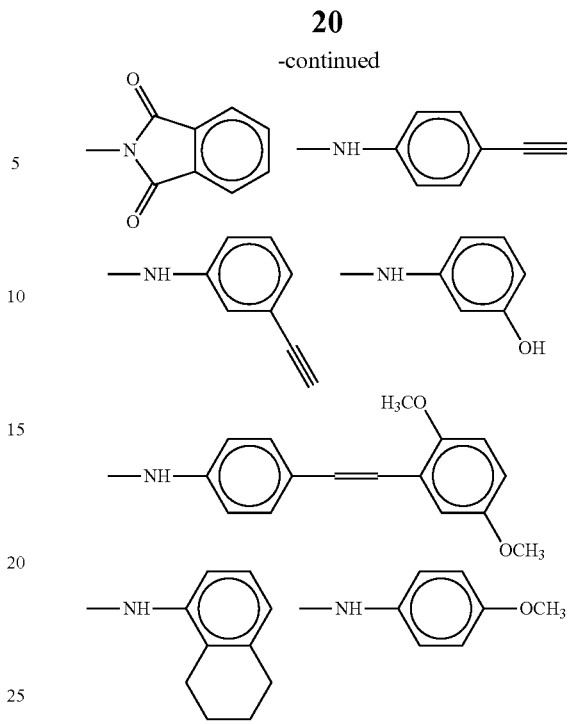

The weight-average molecular weight (Mw) of the polybenzoxazole precursor is preferably 3,000 to 200,000. The lower limit is preferably 4,000 or more and more preferably 5,000 or more. The upper limit is preferably 100,000 or less and more preferably 50,000 or less. In addition, the number average molecular weight (Mn) is preferably 1,000 to 50,000. The lower limit is preferably 2,000 or more and more preferably 3,000 or more. The upper limit is preferably 40,000 or less and more preferably 30,000 or less. In addition, the dispersion degree (Mw/Mn) is preferably 1.0 to 5.0 and more preferably 1.5 to 3.0. Within these ranges, excellent lithography performance and cured film physical properties can be obtained.

The content of the polybenzoxazole precursor in the photosensitive resin composition according to the first embodiment of the present invention is preferably 50 parts by mass or more, more preferably 60 parts by mass or more, and particularly preferably 70 parts by mass or more with respect to 100 parts by mass of the total solid content of the photosensitive resin composition. The upper limit is preferably, for example, 99 parts by mass or less. In the case in which two or more polybenzoxazole precursors are used, it is preferable that the total amount thereof is set to be within the above range.

«Method for Producing Polybenzoxazole Precursor»

The polybenzoxazole precursor used in the present invention may be synthesized with reference to the description of JP2008-224970A. In addition, in the present invention, it is preferable that the terminal is sealed with a monofunctional acid chloride. The sealing of the terminal with a monofunctional acid chloride may be carried out at once by synthesizing the polybenzoxazole precursor by, for example incorporating a monofunctional acid chloride during a polymerization reaction.

<Photoacid Generator (B1)>

The photosensitive resin composition according to the first embodiment of the present invention contains a photoacid generator which generates an acid having a pKa of 3 or less. It is preferable that the photoacid generator generates an acid having a pKa of 2 or less. In the present invention, the pKa basically refers to a pKa in water at 25° C. When the pKa cannot be measured in water, the pKa refers to a value obtained by measuring the pKa by chaining the water to a solvent suitable for measurement. Specifically, the pKa described in Handbook of Chemistry or the like may be referred to. As the acid having a pKa of 3 or less, sulfonic acid or phosphonic acid is preferable and phosphonic acid is more preferable.

The photoacid generator is preferable a compound which responds to actinic rays at a wave length of 300 nm or more and preferably at a wavelength of 300 to 450 nm and generates an acid. However, there is no limitation in the chemical structure thereof. In addition, regarding a photoacid generator which does not directly respond to actinic rays at a wavelength of 300 nm or more, a compound which responds to actinic rays at a wavelength of 300 nm or more to generate an acid when being used together with a sensitizer, the photoacid generator may be preferably used with a sensitizer in combination.

Examples of the photoacid generator include onium salt compounds, trichloromethyl-s-triazines, sulfonium salts, iodonium salts, quaternary ammonium salts, diazomethane compounds, imide sulfonate compounds, and oxime sulfonate compounds. Among these, onium salt compounds, imide sulfonate compounds, and oxime sulfonate compounds are preferable and onium salt compounds and oxime sulfonate compounds are particularly preferable. The photoacid generator may be used alone or in combination of two or more thereof.

Specific examples of the trichloromethyl-s-triazines, diaryl iodonium salts, triarylsulfonium salts, quaternary ammonium salts, and diazomethane compounds include compounds described in paragraphs 0083 to 0088 of JP2011-221494A and compounds described in paragraphs 0013 to 0049 of JP2011-105645A, the contents of which are incorporated into the present specification.

Specific examples of the imide sulfonate compounds include compounds described in paragraph 0065 to 0075 of WO2011/087011, the content of which is incorporated herein.

Examples of the onium salt compounds include diphenyl iodonium salts, triaryl sulfonium salts, sulfonium salts, benzothiazonium salts, and tetrahydrothiophenium salts.

Examples of diphenyl iodonium salts include diphenyliodonium tetrafluoroborate, diphenyliodonium hexafluorophosphonate, diphenyliodonium hexafluoroarsenate, diphenyliodonium trifluoromethanesulfonate, diphenyliodonium trifluoroacetate, diphenyliodonium-p-toluenesulfonate, diphenyliodonium butyltris(2,6-difluorophenyl)borate, 4-methoxyphenylphenyliodonium tetrafluoroborate, bis(4-tert-butylphenyl)iodonium tetrafluoroborate, bis(4-tert-butylphenyl)iodonium hexafluoroarsenate, bis(4-tert-butylphenyl)iodonium trifluoromethane sulfonate, bis(4-tert-butylphenyl)iodonium trifluoroacetate, bis(4-tert-butylphenyl)iodonium-p-toluene sulfonate, and bis(4-t-butylphenyl)iodonium camphorsulfonate.

Examples of the triaryl sulfonium salts include triphenylsulfonium tosylate, triphenylsulfonium trifluoromethanesulfonate, triphenylsulfonium camphorsulfonate, triphenylsulfonium tetrafluoroborate, triphenylsulfonium trifluoroacetate, triphenylsulfonium-p-toluene sulfonate, and triphenylsulfonium butyltris(2, 6-difluorphenyl)borate. It is also preferable to use triaryl sulfonium salts having the following structures.

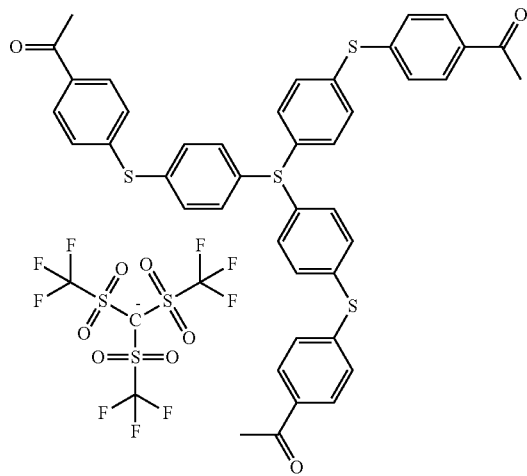

Examples of the sulfonium salts include alkylsulfonium salts, benzylsulfonium salts, dibenzylsulfonium salts, and substituted benzylsulfonium salts.

Examples of the alkylsulfonium salts include 4-acetoxyphenyl dimethyl sulfonium hexafluoroantimonate, 4-acetoxyphenyl dimethyl sulfonium hexafluoroarsenate, dimethyl-4-(benzyloxycarbonyl)phenyl sulfonium hexafluoroantimonate, dimethyl-4-(benzoyloxy) phenyl sulfonium hexafluoroantimonate, dimethyl-4-(benzoyloxy) phenyl sulfonium hexafluoroarsenate, and dimethyl-3-chloro-4-acetoxyphenyl sulfonium hexafluoroantimonate.

Examples of the benzylsulfonium salts include benzyl-4-hydroxyphenyl methyl sulfonium hexafluoroantimonate, benzyl-4-hydroxyphenyl methyl sulfonium hexafluorophosphate, 4-acetoxyphenyl benzyl methyl sulfonium hexafluoroantimonate, benzyl-4-methoxyphenyl methyl sulfonium hexafluoroantimonate, benzyl-2-methyl-4-hydroxyphenyl methyl sulfonium hexafluoroantimonate, benzyl-3-chloro-4-hydroxyphenyl methyl sulfonium hexafluoroarsenate, and 4-methoxybenzyl-4-hydroxyphenyl methyl sulfonium hexafluorophosphate.

Examples of the dibenzylsulfonium salts include dibenzyl-4-hydroxyphenyl sulfonium hexafluoroantimonate, dibenzyl-4-hydroxyphenyl sulfonium hexafluorophosphate, 4-acetoxyphenyl dibenzyl sulfonium hexafluoroantimonate, dibenzyl-4-methoxyphenyl sulfonium hexafluoroantimonate, dibenzyl-3-chloro-4-hydroxyphenyl sulfonium hexafluoroarsenate, dibenzyl-3-methyl-4-hydroxy-5-t-butylphenyl sulfonium hexafluoroantimonate, and benzyl-4-methoxybenzyl-4-hydroxyphenyl sulfonium hexafluoroantimonate.

Examples of the substituted dibenzylsulfonium salts include p-chlorobenzyl-4-hydroxyphenyl methyl sulfonium hexafluoroantimonate, p-nitrobenzyl-4-hydroxyphenyl methyl sulfonium hexafluoroantimonate, p-chlorobenzyl-4-hydroxyphenyl methyl sulfonium hexafluorophosphate, p-nitrobenzyl-3-methyl-4-hydroxyphenyl methyl sulfonium hexafluoroantimonate, 3,5-dichlorobenzyl-4-hydroxyphenyl sulfonium hexafluoroantimonate, and o-chlorobenzyl-3-chloro-4-hydroxyphenyl methyl sulfonium hexafluoroantimonate.

Examples of the benzothiazonium salts include 3-benzylbenzothiazonium hexafluoroantimonate, 3-benzylbenzothiazonium hexafluorophosphate, 3-benzy benzothiazonium tetrafluoroborate, 3-(p-methoxybenzyl)benzothiazonium hexafluoroantimonate, 3-benzyl-2-methylthiobenzothiazonium hexafluoroantimonate, and 3-benzyl-5-chlorobenzothiazonium hexafluoroantimonate.

Examples of the tetrahydrothiophenium salts include 4,7-di-n-botoxy-1-tetrahydrothiophenium trifluoromethanesulfonate, 1-(4-n-butoxynaphthalene-1-yl)tetrahydrothiophenium trifluoromethanesulfonate, 1-(4-n-butoxynaphthalene-1-yl)tetrahydrothiophenium nonafluoro-n-buthanesulfonate, 1-(4-n-butoxynaphthalene-1-yl)tetrahydrothiophenium-1,1,2,2-tetrafluoro-2-(norbornane-2-yl) ethanesulfonate, 1-(4-n-butoxynaphthalene-1-yl)tetrahydrothiophenium-2-(5-t-butoxycarbonyloxy bicyclo[2.2.1]heptane-2-yl)-1,1,2,2-tetrafluoroethanesulfonate, and 1-(4-n-butoxynaphthalene-1-yl)tetrahydrothiophenium-2-(6-t-butoxycarbonyloxy bicyclo[2.2.1]heptane-2-yl)-1,1,2,2-tetrafluoroethane sulfonate.

As the oxime sulfonate compound, that is, as a compound having an oxime sulfonate structure, a compound having an oxime sulfonate structure represented by Formula (B1-1) below may be preferably exemplified.

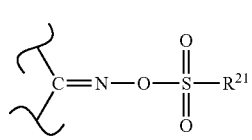

Formula (B1-1)

In Formula (B1-1), $R^{21}$ represents an alkyl group or an aryl group. The wavy line represents a position to be bonded to other groups.

In Formula (B1-1), any group may be substituted and the alkyl group in $R^{21}$ may be linear, branched, or cyclic. Allowable substituents will be described below.

It is preferable that the alkyl group in $R^{21}$ is a linear or branched alkyl group having 1 to 10 carbon atoms. The alkyl group in $R^{21}$ may be a halogen atom, an aryl group having 6 to 11 carbon atoms, an alkoxy having 1 to 10 carbon atoms, or a cycloalkyl group (preferably a bicycloalkyl group including a bridged alicyclic group such as a 7,7-dimethyl-2-oxonorbornyl group or the like).

It is preferable that the aryl group in $R^{21}$ is an aryl group having 6 to 11 carbon atoms, a phenyl group or a naphthyl group. The aryl group in $R^{21}$ may be a lower alkyl group, an alkoxy group, or a halogen atom.

It is preferable that the compound containing an oximsulfonate structure represented by Formula (B1-1) above includes oximsulfonate compounds described in paragraphs 0108 to 0133 described in JP2014-238438A.

As the imide sulfonate-based compound, a naphthalene imide-based compound is preferable and the description of WO1/087011 may be referred to, the content of which is incorporated into the present specification. In the present invention, particularly, a compound represented by the following formula is more preferable.

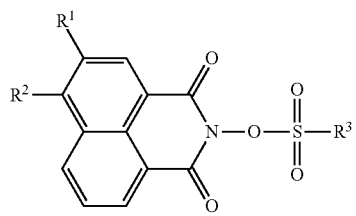

In the formula, $R^1$ and $R^2$ each represent a group represented by Formula (A) below or a hydrogen atom. $R^3$ represents an aliphatic hydrocarbon group having 1 to 18 carbon atoms which may be substituted with one or more of a halogen atom, an alkylthio group, and an alicyclic hydrocarbon group, an aryl group having 6 to 20 carbon atoms which may be substituted with one or more of a halogen atom, an alkylthio group, an alkyl group, and an acyl group, an aryl alkyl group having 7 to 20 carbon atoms which may be substituted with a halogen atom and/or an alkylthio group, a 10-camphoryl group, or a group represented by Formula (B) below.

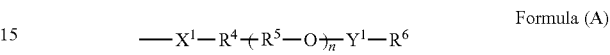

Formula (A)

In Formula (A), $X^1$ represents an oxygen atom or a sulfur atom, $Y^1$ represents a single bond or an alkylene group having 1 to 4 carbon atoms, $R^4$ represents a hydrocarbon group having 1 to 12 carbon atoms, $R^5$ represents an alkylene group having 1 to 4 carbon atoms, and $R^6$ represents a hydrogen atom, an alkyl group having 1 to 4 carbon atoms, which may be branched, an alicyclic hydrocarbon group having 3 to 10 carbon atoms, a heterocyclic group, or a hydroxyl group. n represents an integer of 0 to 5, and in the case in which n is an integer of 2 to 5, plural existing $R^5$'s may be the same or different from each other.

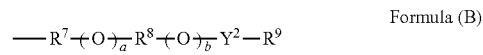

Formula (B)

In Formula (B), $Y^2$ represents a single bond or an alkylene group having 1 to 4 carbon atoms, $R^7$ represents an alkylene group having 2 to 6 carbon atoms, a halogenated alkylene group having 2 to 6 carbon atoms, an arylene group having 6 to 20 carbon atoms, or a halogenated arylene group having 6 to 20 carbon atoms, $R^8$ represents a single bond, an alkylene group having 2 to 6 carbon atoms, a halogenated alkylene group having 2 to 6 carbon atoms, an arylene group having 6 to 20 carbon atoms, or a halogenated arylene group having 6 to 20 carbon atoms, and $R^9$ represents an alkyl group having 1 to 18 carbon atoms, which may be branched, a halogenated alkyl group having 1 to 18 carbon atoms, which may be branched, an aryl group having 6 to 20 carbon atoms, a halogenated aryl group having 6 to 20 carbon atoms, an aryl alkyl group having 7 to 20 carbon atoms, or a halogenated aryl alkyl group having 7 to 20 carbon atoms. a and b each independently represent 0 or 1 and at least one of a orb is 1.

Hereinafter, examples of the imide sulfonate-based compound that can be preferably used in the present invention will be shown but it is needless to say that the present invention is not limited thereto.

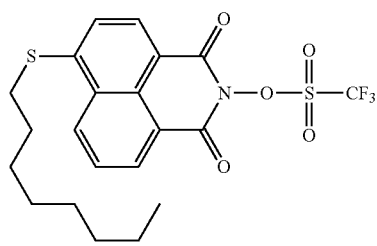

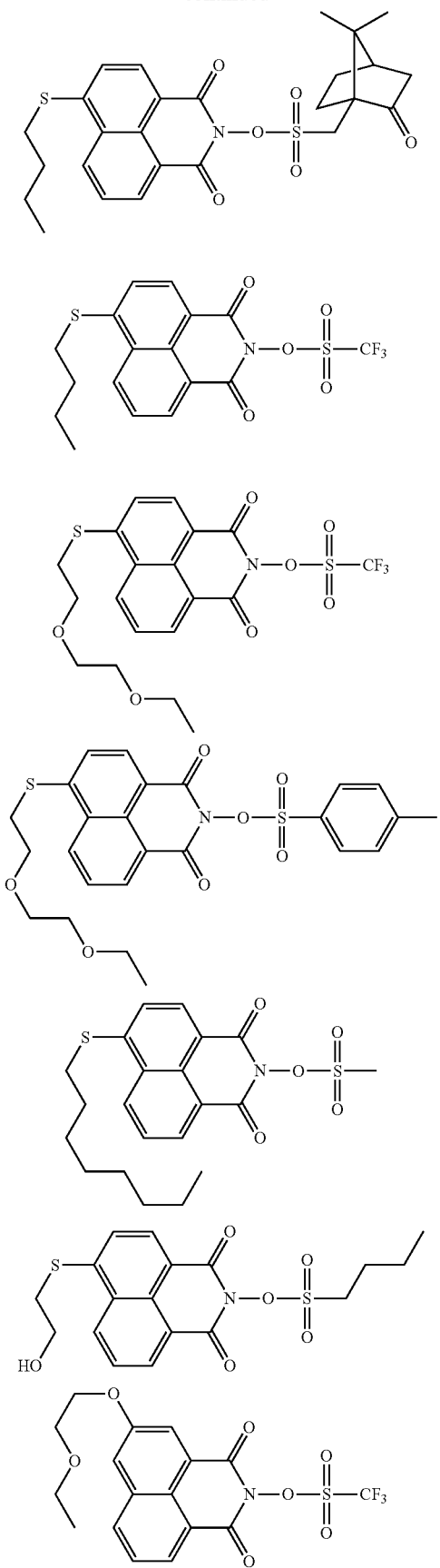
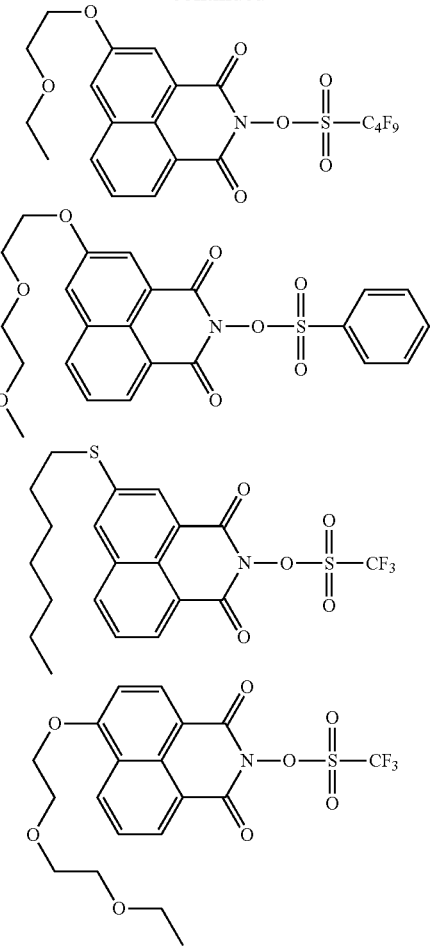

The content of the photoacid generator in the photosensitive resin composition of the present invention is preferably 0.1 to 20 parts by mass with respect to the 100 parts by mass of the total solid content of the photosensitive resin composition. The lower limit is more preferably, for example, 0.2 parts by mass or more and still more preferably 0.5 parts by mass or more. The upper limit is more preferably, for example, 10 parts by mass or less and still more preferably 5 parts by mass or less. The photoacid generator may be used alone or in combination of two or more thereof. In the case in which two or more photoacid generators are used, it is preferable that the total amount thereof is within the above range.

<Solvent (C)>

The photosensitive resin composition according to the first embodiment of the present invention contains a solvent. It is preferable that the photosensitive resin composition of the present invention is prepared in the form of solution obtained by dissolving the required components of the present invention and furthermore, arbitrarily components, which will be described later, in a solvent. The solvent is preferably a solvent which is capable of dissolving the required components and arbitrarily components and does not react with each component.

In the present invention, as the solvent, known solvents may be used.

Examples thereof include ethylene glycol monoalkyl ethers, ethylene glycol dialkyl ethers, ethylene glycol monoalkyl ether acetates, propylene glycol monoalkyl ethers, propylene glycol dialkyl ethers, propylene glycol monoalkyl ether acetates, diethylene glycol dialkyl ethers (for example, diethylene glycol diethyl ether, diethylene glycol methyl ethyl ether, and the like), diethylene glycol monoalkyl ether acetates, dipropylene glycol monoalkyl ethers, dipropylene glycol dialkyl ethers, dipropylene glycol monoalkyl ether acetates, esters, ketones, amides, and lactones. Solvents described in paragraphs of 0174 to 0178 of JP2011-221494A and solvents described in paragraphs 0167 and 0168 of JP2012-194290A may be also used, the contents of which are incorporated into the present specification.

In addition to these solvents, as required, solvents such as benzyl ethyl ether, dihexyl ether, ethylene glycol monophenyl ether acetate, diethylene glycol monomethyl ether, diethylene glycol monoethyl ether, isophorone, caproic acid, caprylic acid, 1-octanol, 1-nonal, benzyl alcohol, anisole, benzyl acetate, ethyl benzoate, diethyl oxalate, diethyl maleate, ethylene carbonate, and propylene carbonate may be added. These solvents may be used alone or as a mixture of two or more thereof.

One solvent may be used or two or more solvents may be used. In the case in which two or more solvents are used, it is preferable to use, for example, propylene glycol monoalkyl ether acetates and dialkyl ethers, diacetates and diethylene glycol dialkyl ethers, or esters and butylene glycol alkyl ether acetates in combination.

It is preferable that the solvent is a solvent having a boiling point of 130° C. or higher and lower than 160° C., a solvent having a boiling point of 160° C. or higher, or a mixture of these solvents.

Examples of the solvent having a boiling point of 130° C. or higher and lower than 160° C. include propylene glycol monomethyl ether acetate (boiling point: 146° C.), propylene glycol monoethyl ether acetate (boiling point: 158° C.), propylene glycol methyl-n-butyl ether (boiling point: 155° C.), and propylene glycol methyl-n-propyl ether (boiling point: 131° C.).

Examples of the solvent having a boiling point of 160° C. or higher include ethyl-3-ethoxy propionate (boiling point: 170° C.), diethylene glycol methyl ethyl ether (boiling point: 176° C.), propylene glycol monomethyl ether propionate (boiling point: 160° C.), dipropylene glycol methyl ether acetate (boiling point: 213° C.), 3-methoxybutyl ether acetate (boiling point: 171° C.), diethylene glycol diethyl ether (boiling point: 189° C.), diethylene glycol dimethyl ether (boiling point: 162° C.), propylene glycol diacetate (boiling point: 190° C.), diethylene glycol monoethyl ether acetate (boiling point: 220° C.), dipropylene glycol dimethyl ether (boiling point: 175° C.), and 1,3-butylene glycol diacetate (boiling point: 232° C.).

The content of the solvent in the photosensitive resin composition of the present invention is preferably 50 to 95 parts by mass with respect to 100 parts by mass of the total components in the photosensitive resin composition. The lower limit is more preferably 60 parts by mass or more. The upper limit is more preferably 90 parts by mass or less. Only one solvent may be used or two or more solvents may be used. In the case in which two or more solvents are used, it is preferable that the total content thereof is within the above range.

<Adhesion Enhancer>

The photosensitive resin composition according to the first embodiment of the present invention may contain an adhesion enhancer. As the adhesion enhancer, an alkoxy silane compound or the like may be used. The alkoxy silane compound is preferably a compound for improving adhesiveness between inorganic substances, for example, silicon compounds such as silcon, silicon oxide, and silicon nitride, metals such as gold, copper, molybdenum, titanium, and aluminum, which becomes a substrate, and an insulating film.

Specific examples of the adhesion enhancer include γ-glycidoxypropyl trilkoxysilane such as γ-aminopropyl trimethoxysilane, γ-aminopropyl triethoxysilane, 3-glycidoxypropyl trimethoxysilane, 3-glycidoxypropyl triethoxysilane, or γ-glycidoxypropyl trimethoxysilane, γ-methacryloxypropyl tiralkoxysilane such as γ-glycidoxypropyl dialkoxysilane, or 3-methacryloxypropyl methyldimethoxysilane, γ-methacryloxypropyl dialkoxysilane, γ-chloropropyl tiralkoxysilane, γ-mercaptopropyl trialkoxysilane, β-(3,4-epoxycyclohexyl) ethyltrialkoxysilane, vinyl trialkoxysilane, and 2-(3,4-epoxycyclohexyl)ethyltrimethoxysilane. Among these, γ-glycidoxypropyl trialkoxysilane and γ-methacryloxypropyl trialkoxysilane are preferable, γ-glycidoxypropyl trialkoxysilane is more preferable, and 3-methacryloxypropyl methyldimethoxysilane and 3-glycidoxypropyl trimethoxysilane are still more preferable. These may be used alone or in combination of two or more thereof.

The content of the adhesion enhancer is preferably 0.001 to 15 parts by mass and more preferably 0.005 to 10 parts by mass with respect to 100 parts by mass of the total solid content of the photosensitive resin composition. Only one adhesion enhancer may be used or two or more adhesion enhancers may be used. In the case in which two or more adhesion enhancers are used, it is preferable that the total amount thereof is within the above range.

<Sensitizer>

The photosensitive resin composition according to the first embodiment of the present invention may contain a sensitizer. The sensitizer absorbs actinic rays and attains an electronically excited state. The sensitizer in the electronically excited state contacts the photoacid generator and causes an action such as electron transfer, energy transfer, or generation of heat. Thus, a chemical change of the photoacid generator is caused and decomposition and generation of an acid occur. Therefore, when the photosensitive resin composition contains the sensitizer, the decomposition of the photoacid generator may be promoted. Preferable examples of the sensitizer include the following compounds that have an absorption wavelength in the range of 350 to 450 nm.

Polynuclear aromatic compounds (for example, pyrene, perylene, triphenylene, anthracene, 9,10-dibutoxyanthracene, and 9,10-diethoxyanthracene, 3,7-dimethoxyanthracene, 9,10-dipropyloxyanthracene), xanthenes (for example, fluorescein, eosine, erythrosine, rhodamine B, and rose bengal), xanthones (for example, xanthone, thioxanthone, dimethylthioxanthone, and diethylthioxanthone), cyanines (for example, thiacarbocyanine, and oxacarbocyanine), merocyanines (for example, merocyanine, and carbomerocyanine), rhodacyanines, oxonols, thiazines (for example, thionine, methylene blue, and toluidine blue), acridines (for example, acridine orange, chloroflavine, and acriflavine), acridones (for example, acridone, and 10-butyl-2-chloroacridone), anthraquinones (for example, anthraquinone), squaryliums (for example, squarylium), styryls, styryl-based compounds (for example, 2-[2-[4-(dimethylamino)phenyl]ethenyl]benzoxazole), and coumarins (for example, 7-diethylamino-4-methylcoumarin, 7-hydroxy-4-methylcoumarin, 2,3,6,7-tetrahydro-9-methyl-1H,5H, and 11H-[1]benzopyrano[6,7,8-ij]quinolizin-11-one).

Among these sensitizers, polynuclear aromatic compounds, acridones, styryls and styryl-based compounds, and coumarins are preferable, and polynuclear aromatic compounds are more preferable. Among polynuclear aromatic compounds, anthracene derivatives are most preferable.

In the case in which the photosensitive resin composition of the present invention contains a sensitizer, the content of the sensitizer is preferably 0.001 to 100 parts by mass with respect to 100 parts by mass of the total solid content in the photosensitive resin composition. The lower limit is more preferably, for example, 0.1 parts by mass or more and still more preferably 0.5 parts by mass or more. The upper limit is more preferably, for example, 50 parts by mass or less and still more preferably 20 parts by mass or less. Two or more sensitizers may be used in combination. In the case in which two or more sensitizers are used in combination, it is preferable that the total amount thereof is within the above range.

<Crosslinking Agent>

The photosensitive resin composition according to the first embodiment of the present invention may contain a crosslinking agent. When the photosensitive resin composition contains a crosslinking agent, a stronger cured film can be obtained.

The crosslinking agent is not particularly limited as long as the crosslinking agent causes a crosslinking reaction by heat. Examples of the crosslinking agent include a compound having two or more epoxy groups or oxetanyl groups in a molecule, a blocked isocyanate compound, an alkoxymethyl group-containing crosslinking agent, and a compound having ethylenically unsaturated double bonds.

«Compound Having Two or More Epoxy Groups or Oxetanyl Groups in Molecule»

The compound having two or more epoxy groups or oxetanyl groups in a molecule include a bisphenol A-type epoxy resin, a bisphenol F-type epoxy resin, a phenol novolac-type epoxy resin, a cresol novolac-type epoxy resin, and an aliphatic epoxy resin.

These are available as a commercially available product. Examples thereof include commercially available products described in paragraph 0189 of JP2011-221494A, such as JER152, JER157S70, JER157S65, JER806, JER828, and JER1007 (manufactured by Mitsubishi Chemical Corporation). Other examples thereof include DENACOL EX-611, EX-612, EX-614, EX-614B, EX-622, EX-512, EX-521, EX-411, EX-421, EX-313, EX-314, EX-321, EX-211, EX-212, EX-810, EX-811, EX-850, EX-851, EX-821, EX-830, EX-832, EX-841, EX-911, EX-941, EX-920, EX-931, EX-212L, EX-214L, EX-216L, EX-321L, EX-850L, DLC-201, DLC-203, DLC-204, DLC-205, DLC-206, DLC-301, and DLC-402 (all manufactured by Nagase ChemteX Corporation), and YH-300, YH-301, YH-302, YH-315, YH-324, and YH-325 (all manufactured by NIPPON STEEL & SUMIKIN CHEMICAL CO., LTD.). These may be used alone or in combination of two or more thereof.

Among these, a bisphenol A-type epoxy resin, a bisphenol F-type epoxy resin, a phenol novolac-type epoxy resin, a cresol novolac-type epoxy resin, and an aliphatic epoxy resin are more preferable and a bisphenol A-type epoxy resin is particularly preferable.

As the compound having two or more epoxy groups or oxetanyl groups in a molecule, ARONOXETANE OXT-121, OXT-221, OX-SQ, and PNOX (all manufactured by TOAGOSEI CO., LTD.) can be used.

The compound including an oxetanyl group may be used alone or a mixture with a compound including an epoxy group.

«Blocked Isocyanate Compound»

In the photosensitive resin composition of the present invention, a blocked isocyanate compound may be preferably adopted for the crosslinking agent. From the viewpoint of curability, the blocked isocyanate compound is preferably a compound having two or more blocked isocyanate groups in a molecule.

The blocked isocyanate group in the present invention is a group capable of generating an isocyanate group by heat, and for example, a group in which the isocyanate group is protected by allowing a blocking agent and the isocyanate group to react is preferably used. In addition, the blocked isocyanate group is preferably a group capable of generating an isocyanate group by heat at 90° C. to 250° C.

The blocked isocyanate compound is not particularly limited in its skeleton and any blocked isocyanate compound may be used as long as two isocyanate groups are present in a molecule. Examples thereof include aliphatic, alicyclic, or aromatic polyisocyanate. Specific examples thereof include isocyanate compounds such as 2,4-tolylene diisocyanate, 2,6-tolylene diisocyanate, isophorone diisocyanate, 1,6-hexamethylene diisocyanate, 1,3-trimethylene diisocyanate, 1,4-tetramethylene diisocyanate, 2,2,4-trimethylhexamethylene diisocyanate, 2,4,4-trimethylhexamethylene diisocyanate, 1,9-nonamethylene diisocyanate, 1,10-decamethylene diisocyanate, 1,4-cyclohexane diisocyanate, 2,2'-diethyl ether diisocyanate, diphenylmethane-4,4'-diisocyanate, o-xylene diisocyanate, m-xylene diisocyanate, p-xylene diisocyanate, methylene bis(cyclohexyl isocyanate), cyclohexane-1,3-dimethylene diisocyanate, cyclohexane-1,4-dimethylene diisocyanate, 1,5-naphthalene diisocyanate, p-phenylene diisocyanate, 3,3'-methyleneditolylene-4,4'-diisocyanate, 4,4'-diphenyl ether diisocyanate, tetrachlorophenylene diisocyanate, norbornane diisocyanate, hydrogenated 1,3-xylylene diisocyanate, and hydrogenated 1,4-xylylene diisocyanate, and compounds having a prepolymer type skeleton derived from these compounds. Among these, tolylene diisocyanate (TDI), diphenylmethane diisocyanate (MDI), hexamethylene diisocyanate (HDI), and isophorone diisocyanate (IPDI) are preferable.

Examples of the mother structure of the blocked isocyanate compound include biuret-type mother structures, isocyanurate-type mother structures, adduct-type mother structures, bifunctional prepolymer-type mother structures, and the like.

Examples of the blocking agent that forms the block structure of the blocked isocyanate compound include oxime compounds, lactam compounds, phenol compounds, alcohol compounds, amine compounds, active methylene compounds, pyrazole compounds, mercaptan compounds, imidazole-based compounds, and imide-based compounds. Among them, a blocking agent selected from oxime compounds, lactam compounds, phenol compounds, alcohol compounds, amine compounds, active methylene compounds, and pyrazole compounds is particularly preferable.

Examples of the oxime compounds include oximes and ketoximes and specific εexamples thereof include acetoxime, formaldoxime, cyclohexane oxime, methyl ethyl ketone oxime, cyclohexanone oxime, and benzophenone oxime.

Examples of the lactam compounds include ε-caprolactam and γ-butyrolactam.

Examples of the phenol compounds include phenol, naphthol, cresol, xylenol, and halogen-substituted phenol.

Examples of the alcohol compounds include methanol, ethanol, propanol, butanol, cyclohexanol, ethylene glycol monoalkyl ether, propylene glycol monoalkyl ether, and alkyl lactate.

Examples of the amine compounds include primary amines and secondary amines, the amine compounds may be any of aromatic amines, aliphatic amines, and alicyclic amines and specific examples thereof include aniline, diphenylamine, ethylene imine, and polyethylene imine.

Examples of the active methylene compounds include diethyl malonate, dimethyl malonate, ethyl acetoacetate, and methyl acetoacetate.

Examples of the pyrazole compounds include pyrazole, methylpyrazole, and dimethylpyrazole.

Examples of the mercaptan compounds include alkyl mercaptans, and aryl mercaptan.

The blocked isocyanate compound may be used from commercially available products and, for example, CORONATE AP Stable M, CORONATE 2503, 2515, 2507, 2513, and 2555, and MILLIONATE MS-50 (all manufactured by Nippon Polyurethane Industry Co., Ltd.), TAKENATE B-830, B-815N, B-820NSU, B-842N, B-846N, B-870N, B-874N, and B-882N all manufactured by Mitsui Chemicals, Inc.), DURANATE 17B-60PX, 17B-60P, TPA-B80X, TPA-B80E, MF-B60X, MF-B60B, MF-K60X, MF-K60B, MFA-100, E402-B80B, SBN-70D, SBB-70P, and K6000 (all manufactured by Sumika Asahi-Kasei Chemicals Corporation), DESMODUR BL100, BL1265 MPA/X, BL3575/1, BL3272MPA, BL3370MPA, BL3475BA/SN, BL5375MPA, VPLS2078/2, BLA265SN, PL340, and PL350, and SUMIJULE BL3175 (all manufactured by Bayer Urethane Co., Ltd.) may be used.

《Other Crosslinking Agent》

As other crosslinking agents, alkoxy methyl group-containing crosslinking agents and compounds having ethylenically unsaturated double bonds described in paragraphs 0107 to 0108 of JP2012-8223A, and crosslinking agents described in paragraph 0040 of JP2015-064526A may be preferably used, the contents of which are incorporated into the present specification. As the compounds having ethylenically unsaturated double bonds, compounds including two or more methacryloyl groups or acryloyl groups in a molecule are preferable. As a commercially available product, KAYARAD DPHA (manufactured by Nippon Kayaku Co., Ltd.) may be used. As the alkoxy methyl group-containing crosslinking agent, alkoxy methylated glycol uryl is preferable. As a commercially available product, NICALACK Mx-270 (manufactured by Sanwa Chemical Co., Ltd.) may be used.

In the case in which the photosensitive resin composition of the present invention includes a crosslinking agent, the content of the crosslinking agent is preferably 0.01 to 50 parts by mass with respect to a total 100 parts by mass of the polymer component (A). The lower limit is more preferably, for example, 0.1 part by mass or more and still more preferably 0.5 parts by mass or more. The upper limit is more preferably, for example, 30 parts by mass or less and still more preferably 20 parts by mass or less. When the content is controlled to be within this range, a cured film having excellent mechanical strength and solvent resistance can be obtained. Only one crosslinking agent may be used or two or more crosslinking agents may be used. In the case in which two or more crosslinking agents are used, it is preferable that the total amount thereof is within the above range.

<Basic Compound>

The photosensitive resin composition according to the first embodiment of the present invention may contain a basic compound. The basic compound may be arbitrarily selected from basic compounds that may be used as a chemical amplification type resist. Examples thereof include aliphatic amines, aromatic amines, heterocyclic amines, quaternary ammonium hydroxides, and quaternary ammonium salts of carboxylic acid. Specific examples thereof include the compounds described in paragraphs 0204 to 0207 of JP2011-221494A, the content of which is incorporated into the present specification.

Specific examples of the aliphatic amines include trimethylamine, diethylamine, triethylamine, di-n-propylamine, tri-n-propylamine, di-n-pentylamine, tri-n-pentylamine, diethanolamine, triethanolamine, dicyclohexylamine, and dicyclohexylmethylamine.

Examples of the aromatic amines include aniline, benzylamine, N,N-dimethyl aniline, and diphenylamine.

Examples of the heterocyclic amines include pyridine, 2-methylpyridine, 4-methylpyridine, 2-ethylpyridine, 4-ethylpyridine, 2-phenylpyridine, 4-phenylpyridine, N-methyl-4-phenylpyridine, 4-dimethylaminopyridine, imidazole, benzimidazole, 4-methylimidazole, 2-phenylbenzimidazole, 2,4,5-triphenylimidazole, nicotine, nicotinic acid, nicotinamide, quinoline, 8-oxyquinoline, pyrazine, pyrazole, pyridazine, purine, pyrrolidine, piperidine, piperazine, morpholine, 4-methylmorpholine, N-cyclohexyl-N'-[2-(4-morpholinyl)ethyl]thiourea, 1,5-diazabicyclo[4.3.0]-5-nonene, and 1,8-diazabicyclo[5.3.0]-7-undecene.

Examples of the quaternary ammonium hydroxides include tetramethylammonium hydroxide, tetraethylammonium hydroxide, tetrapropylammonium hydroxide, benzyltrimethylammonium hydroxide, tetra-n-butylammonium hydroxide, and tetra-n-hexyl ammonium hydroxide.

Examples of the quaternary ammonium salts of carboxylic acid include tetramethylammonium acetate, tetramethylammonium benzoate, tetra-n-butylammonium acetate, and tetra-n-butylammonium benzoate.

In the case in which the photosensitive resin composition of the present invention includes a basic compound, the content of the basic compound is preferably 0.001 to 3 parts by mass and more preferably 0.005 to 1 parts by mass with respect to 100 parts by mass of the total solid content in the photosensitive resin composition. The basic compound may be used alone or in combination of two or more thereof. When two or more basic compounds are used, it is preferable that the total amount thereof is within the above range.

<Surfactant>

The photosensitive resin composition according to the first embodiment of the present invention may contain a surfactant. As the surfactant, any of an anionic surfactant, a cationic surfactant, a nonionic surfactant, and an amphoteric surfactant can be used, but a nonionic surfactant is preferable. As the surfactant, for example, those described in paragraphs 0201 to 0205 of JP2012-88459A, those described in paragraphs 0185 to 0188 of JP2011-215580A can be used, the contents of which are incorporated into the present specification.

Examples of the nonionic surfactant include polyoxyethylene higher alkyl ethers, polyoxyethylene higher alkyl phenyl ethers, higher fatty acid diesters of polyoxyethylene glycol, silicone-based surfactants, and fluorine-based surfactants. In addition, examples of commercially available products of the nonionic surfactant include KP-341 and X-22-822 (manufactured by Shin-Etsu Chemical Co., Ltd.), POLYFLOW No. 99C (manufactured by Kyoeisha Chemical Co., Ltd.), F-TOP (manufactured by Mitusbishi Materials Electronic Chemiclas Co., Ltd.), MEGAFACE F-554 (manufactured by DIC Corporation), FLORADE NOVEC FC-4430 (manufactured by 3M Limited), SURFLON S-242 (manufactured by AGC SEIMI CHEMICAL Co., Ltd.), PolyFox PF-6320 (manufactured by OMNOVA Solutions Inc.), SH-8400 (manufactured by Dow Corning Toray Co., Ltd.), and FTERGENT FTX-218G (manufactured by NEOS COMPANY LIMITED).

In addition, preferable examples of the surfactant include copolymers which includes a constitutional unit A and a constitutional unit B represented by Formula (I-1-1) and has a weight-average molecular weight (Mw), which is calculated through gel permeation chromatography in the case in which tetrahydrofuran (THF) is used as a solvent, in a range of 1,000 to 10,000 in terms of polystyrene. The weight-average molecular weight (Mw) is preferably 1,500 to 5,000.

Formula (I-1-1)

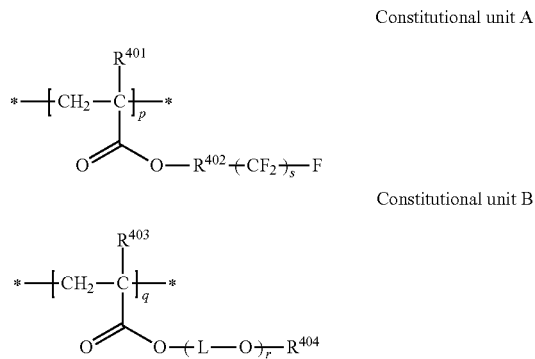

In Formula (I-1-1), $R^{401}$ and $R^{403}$ each independently represent a hydrogen atom or a methyl group, $R^{402}$ represents a linear alkylene group having 1 to 4 carbon atoms, $R^{404}$ represents a hydrogen atom or an alkyl group having 1 to 4 carbon atoms, L represents an alkylene group having 3 to 6 carbon atoms, p and q represent a mass percentage indicating a weight ratio, p represents a numerical value of 10% by mass or more and 80% by mass or less, q represents a numerical value of 20% by mass or more and 90% by mass or less, r represents an integer of 1 to 18, and s represents an integer of 1 to 10.

It is preferable that L above is branched alkylene group represented by Formula (I-1-2) below.

In Formula (I-1-2), $R^{405}$ represents an alkyl group having 1 to 4 carbon atoms and is preferably an alkyl group having 1 to 3 carbon atoms and more preferably an alkyl group having 2 or 3 carbon atoms from the viewpoint of compatibility and wettability with respect to a surface to be coated. The total of p and q is preferably 100.

Formula (I-1-2)

The surfactant may be used alone or as a combination of two or more thereof.

In the case in which the photosensitive resin composition of the present invention includes a surfactant, the content of the surfactant is preferably 10 parts by mass or less, more preferably 0.001 to 10 parts by mass, and still more preferably 0.01 to 3 parts by mass with respect to 100 parts by mass of the total solid content of the photosensitive resin composition.

<Antioxidant>

The photosensitive resin composition according to the first embodiment of the present invention may contain an antioxidant. The composition may contain a known antioxidant as the antioxidant. By adding the antioxidant, coloration of a cured film can be prevented. Further, a decrease in film thickness caused by decomposition may be reduced and thus there is an advantage that heat resistant transparency is excellent.

Examples of such an antioxidant include phosphorus-based antioxidants, amides, hydrazides, hindered amine-based antioxidants, sulfur-based antioxidant, phenol-based antioxidants, ascorbic acids, zinc sulfate, saccharides, nitrites, sulfites, thiosulfates, and hydroxylamine derivatives. Among these, from the viewpoint of coloration of a cured film and a decrease in film thickness, phenol-based antioxidants, hindered amine-based antioxidants, phosphorous-based antioxidants, amide-based antioxidants, hydrazide-based antioxidants, and sulfur-based antioxidant are preferable and phenol-based antioxidants are most preferable. These may be used alone or in combination of two or more thereof.

Specific examples thereof include compounds described in paragraphs 0026 to 0031 of JP2005-29515A, and compounds described in paragraphs 0106 to 0116 of JP2011-227106A, the contents of which are incorporated into the present specification.

Examples of preferable commercially available products include ADK STAB AO-20, ADK STAB AO-60, ADK STAB AO-80, ADK STAB LA-52, ADK STAB LA-81, ADK STAB AO-412S, ADK STAB PEP-36, IRGANOX 1035, IRGANOX 1098, and TINUVIN 144.

In the case in which the photosensitive resin composition of the present invention includes an antioxidant, the content of the antioxidant is preferably 0.1 to 10 parts by mass, more preferably 0.2 to 5 parts by mass, and particularly preferably 0.5 to 4 parts by mass with respect to 100 parts by mass of the total solid content of the photosensitive resin composition. When the content is controlled to be within this range, a film to be formed can attain sufficient transparency and good sensitivity during pattern formation.

<Acid-Proliferating Agent>

In the photosensitive resin composition according to the first embodiment of the present invention, an acid-proliferating agent may be used in order to improve sensitivity.

The acid-proliferating agent is a compound which is capable of further generating an acid through an acid catalyst reaction so as to increase the acid concentration in a reaction system and remains stable present in the absence of an acid.

Specific examples of the acid-proliferating agent include acid-proliferating agents described in paragraphs 0226 to 0228 of JP2011-221494A, the content of which is incorporated into the present specification.

In the case in which the photosensitive resin composition of the present invention contains an acid-proliferating agent, the content of the acid-proliferating agent is preferably 10 to 1,000 parts by mass, more preferably 20 to 500 parts by mass with respect to 100 parts by mass of the photoacid generator from the viewpoint of dissolution contrast between exposed portions and non-exposed portions. The acid-proliferating agent may be used alone or in combination of two or more thereof. In the case in which two or more acid-proliferating agents are used, it is preferable that the total amount thereof is within the above range.

<Development Accelerator>

The photosensitive resin composition according to the first embodiment of the present invention may contain a development accelerator.

Regarding the development accelerator, paragraphs 0171 and 0172 in JP2012-042837A may be referred to, the content of which is incorporated into the present specification.

The development accelerator may be used alone or in combination of two or more thereof.

In the case in which the photosensitive resin composition of the present invention includes a development accelerator, the amount of the development accelerator added is preferably 0 to 30 parts by mass, more preferably 0.1 to 20 parts by mass, and most preferably 0.5 to 10 parts by mass with respect to 100 parts by mass of the total solid content of the photosensitive resin composition from the viewpoint of sensitivity and residual film rate.

<Other Components>

To the photosensitive resin composition according to the first embodiment of the present invention, as required, known additives such as a thermal radical generator, a thermal acid generator, an ultraviolet absorber, a thickener, an organic or inorganic precipitation inhibitor, and polymers other than the polybenzoxazole precursor may be added. These components may be each independently added alone or in combination of two or more thereof. Examples of the polymers other than the polybenzoxazole precursor include acrylic polymers. Examples thereof include copolymers of methacrylic acid and glycidyl methacrylate, and dicyclopentanyl methacrylate and styrene. In addition, as other additives, trimellitic acid and the like may be used.

For example, as these compounds, compounds described in paragraphs 0201 to 0224 of JP2012-88459A may be used, the content of which is incorporated into the present specification.

In addition, it is possible to use thermal radical generators described in paragraphs 0120 to 0121 of JP2012-8223A, and nitrogen-containing compounds and -thermal acid generators described in WO2011/136074A1, the contents of which are incorporated into the present specification.

[Second Embodiment of Present Invention]

Next, a second embodiment of the photosensitive resin composition of the present invention will be described.

The photosensitive resin composition according to the second embodiment of the present invention contains a polybenzoxazole precursor (A2), a quinone diazide compound (B2), and a solvent (C).

<Polybenzoxazole Precursor (A2)>

The photosensitive resin composition according to the second embodiment of the present invention contains a polybenzoxazole precursor. The polybenzoxazole precursor contains a total of 70 mol % or more of a repeating unit represented by Formula (1) and a repeating unit represented by Formula (2) with respect to the total repeating units, and a ratio between the repeating unit represented by Formula (1) and the repeating unit represented by Formula (2) is 9:1 to 3:7 in a molar ratio.

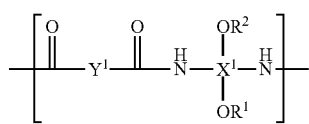

(1)

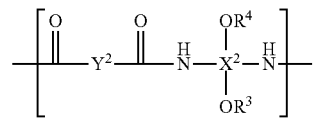

(2)

In Formulae (1) and (2), $X^1$ and $X^2$ each independently represent a tetravalent organic group, $R^1$ to $R^4$ each independently represent a hydrogen atom, an alkyl group, an acid decomposable group, or —CORc, and at least one of $R^1$ to $R^4$ represents a hydrogen atom or an acid decomposable group, Rc represents an alkyl group or an aryl group, $Y^1$ represents a cyclic aliphatic group having 3 to 15 carbon atoms, and $Y^2$ represents a linear or branched aliphatic group having 4 to 20 carbon atoms.

$X^1$, $X^2$, $Y^1$, and $Y^2$ have the same ranges as in the first embodiment and the preferable ranges thereof are also the same.

$R^1$ to $R^4$ each independently represent a hydrogen atom, an alkyl group, an acid decomposable group, or —CORc, at least one of $R^1$ to $R^4$ represents a hydrogen atom or an acid decomposable group, and Rc represents an alkyl group or an aryl group.

The alkyl group, the acid decomposable group, and Rc have the same ranges as in the first embodiment and the preferable ranges thereof are also the same.

In the polybenzoxazole precursor of the photosensitive resin composition according to the second embodiment of the present invention, at least one of $R^1$ to $R^4$ preferably represents a hydrogen atom, 5 to 100% of $R^1$ to $R^4$ included in the total repeating units is preferably a hydrogen atom, and 60 to 95% thereof is more preferably a hydrogen atom. The lower limit is further preferably 70% or more. The upper limit is preferably 90% or less. When at least one of $R^1$ to $R^4$ is a hydrogen atom, a photosensitive resin composition having high sensitivity can be obtained. Particularly, when the content of the hydrogen atom is within the above range, the sensitivity is further improved.

Preferable ranges of the total of the repeating unit represented by Formula (1) and the repeating unit represented by Formula (2) in the total repeating units of the polybenzoxazole precursor and the molar ratio of the both repeating units are the same as the ranges described in the first embodiment, and the preferable ranges are the same.

The polybenzoxazole precursor may include repeating units other than the repeating unit represented by Formula (1) and the repeating unit represented by Formula (2) (also referred to as other repeating units). Other repeating units include the same repeating units described in the first embodiment.

The content of the polybenzoxazole precursor in the photosensitive resin composition according to the second embodiment of the present invention is preferably 50 parts by mass or more, more preferably 60 parts by mass or more, and particularly preferably 70 parts by mass or more with respect to 100 parts by mass of the total solid content of the photosensitive resin composition. The upper limit is preferably, for example, 99 parts by mass or less. In the case in which two or more polybenzoxazole precursors are used, it is preferable that the total amount thereof is within the above range.

<Quinone Diazide Compound (B2)>

The photosensitive resin composition according to the second embodiment of the present invention contains a quinone diazide compound. As the quinone diazide compound, a 1,2-quinone diazide compound which generates a carboxylic acid by irradiation with actinic rays may be preferably used. As the 1,2-quinone diazide compound, a condensate of a phenolic compound or an alcoholic compound (hereinafter, also referred to as "mother nucleus"), and a 1,2-naphthoquinone diazide sulfonic acid halide and the like can be used. Regarding specific examples of these compound, for example, paragraphs 0075 to 0078 of JP2012-088459A may be referred to, the content of which is incorporated into the present specification.

In the condensation reaction of a phenolic compound or an alcoholic compound (mother nucleus) and a 1,2-naphthoquinone diazide sulfonic acid halide, the 1,2-naphthoquinone diazide sulfonic acid halide may be used in an amount corresponding to preferably 30 to 85 mol %, more preferably 50 to 70 mol % of the number of OH groups in the phenolic compound or the alcoholic compound. The condensation reaction may be conducted by a known method.

As the 1,2-quinone diazide compound, 1,2-naphthoquinone diazide sulfonic acid amides in which an ester bond in the mother nucleus exemplified above is changed to, for example, 2,3,4-triaminobenzophenone-1,2-naphthoquinone diazide-4-sulfonic acid amide, are also suitably used. In addition, a condensate of 4,4'-[1-[4-[1-[4-hydroxyphenyl]-1-methylethyl]phenyl]ethylidene]bisphenol (1.0 mol) and a 1,2-naphthoquinone diazide-5-sulfonic acid chloride (3.0 mol), a condensate of 1,1,1-tri(p-hydroxyphenyl)ethane (1.0 mol) and a 1,2-naphthoquinone diazide-5-sulfonic acid chloride (2.0 mol), a condensate of 2,3,4,4'-tetrahydroxybenzophenone (1.0 mol) and a 1,2-naphthoquinone diazide-5-sulfonic acid ester (2.44 mol), and the like can be used.

These quinone diazide compounds may be used alone or in combination of two or more thereof. The content of the quinone diazide compound in the photosensitive resin composition of the present invention is preferably 1 to 50 parts by mass with respect to the 100 parts by mass of the total solid content in the photosensitive resin composition. The lower limit is more preferably, for example, 2 parts by mass or more and still more preferably 10 parts by mass or more. The upper limit is preferably, for example, 40 parts by mass or less and still more preferably 30 parts by mass or less. When the content of the quinone diazide compound is controlled to be within the above range, with respect to an alkali solution, which becomes a developer, a difference in solubility between irradiated portions and non-irradiated portions with actinic rays increases and patterning performance is improved. Thus, the solvent resistance of a cured film is improved.

<Solvent (C)>

The photosensitive resin composition according to the second embodiment of the present invention contains a solvent. As the solvent, the solvents described in the above photosensitive resin composition according to the first embodiment may be used, and the preferable range is also the same.

The content of the solvent is preferably 50 to 95 parts by mass with respect to 100 parts by mass of the total solid content in the photosensitive resin composition. The lower limit is more preferably 60 parts by mass or more. The upper limit is more preferably 90 parts by mass or less. Only one solvent may be used or two or more solvents may be used. In the case in which two or more solvents are used, it is preferable that the total amount thereof is within the above range.

<Other Components>

To the photosensitive resin composition according to the second embodiment of the present invention, in addition to the above components, within the range not impairing the effect of the present invention, as required, known additives such as a crosslinking agent, a basic compound, a surfactant, a antioxidant, a development accelerator, a plasticizer, a thermal radical generator, a thermal acid generator, an ultraviolet absorber, a thickener, an organic or inorganic precipitation inhibitor, and polymers other than the polybenzoxazole precursor may be added. These components are the same as in the first embodiment and the preferable ranges thereof are also the same. These components may be each independently used alone or in combination of two or more thereof.

<Impurities>

In the photosensitive resin composition of the present invention, the lower the content of impurities is, the more preferable it is, because there is a possibility that impurities may cause deterioration in the storage stability of the composition or device contamination.

Specific examples of impurities include sodium, potassium, magnesium, calcium, iron, manganese, copper, aluminum, titanium, chromium, cobalt, nickel, zinc, tin, or ions thereof, and free halogen or halide ions, The content of these impurities is preferably 1,000 ppb or less, more preferably 500 ppb or less, and still more preferably 100 ppb or less in the photosensitive resin composition of the present invention. Particularly, regarding metal impurities, the content thereof is particularly preferably 20 ppb or less. Although not particularly limited, the lower limit may be set 10 ppt or more or 100 ppt or more from the viewpoint of the actually reducible limit and measurement limit.

For the method for reducing impurities as described above, by using materials, such as resin or additives, not having such impurities are used so that these impurities are not incorporated during the synthesis of the composition, and washing the composition in the case in which these impurities are incorporated, the amount of impurities may be controlled to be within the above range. The amount of these impurities may be measured by a known method, for example, an inductively coupled plasma (ICP) emission spectroscopic analysis method or an atomic absorption spectroscopic analysis method.

In addition, it is preferable that the photosensitive resin composition of the present invention does not include compounds such as benzene, formaldehyde, trichloroethylene, 1,3-butadiene, carbon tetrachloride, chloroform, N,N-dimethylformamide, N,N-dimethylacetamide, and hexane.

The content of these compounds in the photosensitive resin composition of the present invention is preferably 500 ppm or less, more preferably 10 ppm or less, and still more preferably 1 ppm or less. Although not particularly limited, the lower limit may be set to 0.1 ppb or more and also set to 1 ppb or more from the viewpoint of the actually reducible limit and measurement limit.

The content of these impurities can be reduced in the same method as the method for reducing the metal impurities and the amount thereof may be measured by a known measurement method.

<Method for Preparing Photosensitive Resin Composition>

The photosensitive resin composition of the present invention may be prepared by mixing each component at a predetermined ratio in an arbitrary method and dissolving the components under stirring. For example, the photosensitive resin composition may be prepared by preparing solutions of each component dissolved in a solvent respectively in advance and then mixing the resulting solutions at a predetermined ratio. The composition solution prepared as described above prepared may be filtered using a filter having a pore size of, for example, 0.2 μm or the like and then used. The pore size of the filter may be appropriately selected according to desired purity or the like and in addition to 0.2 μm, pore sizes of 0.05 μm, 0.1 μm, 0.3 μm, and 0.5 μm may be used. The material for the filter can be appropriately selected according to a solvent to be used for the composition. For example, polypropylene, polyethylene, polyester, nylon, polytetrafluoroethylene, metals, activated carbon, cellulose, and the like may be used. Further, filtration can be repeatedly carried out. For example, filtration may be carried out two times, five times, or multiple times by circulating filtration.

The concentration of solid contents, viscosity, and surface tension of the photosensitive resin composition of the present invention may be adjusted according to the purpose.

In the case of slit coating, the concentration of the solid contents of the photosensitive resin composition is preferably 2 to 40% by mass, more preferably 3 to 30% by mass, and still more preferably 4 to 20% by mass. The viscosity of the composition in the case of slit coating is preferably 1 to 40 mPa·s, more preferably 2 to 25 mPa·s, and most preferably 3 to 20 mPa·s.

In the case of slit coating, the concentration of the solid contents of the composition is preferably 5 to 60% by mass, more preferably 7 to 50% by mass, and still more preferably 10 to 40% by mass. The viscosity of the composition in the case of slit coating is preferably 5 to 100 mPa·s, more preferably 8 to 70 mPa·s, and most preferably 10 to 50 mPa·s. The surface tension is preferably 10 to 100 mN/m, more preferably 15 to 80 mN/m, and most preferably 20 to 50 mN/m from the viewpoint of coatability.

The viscosity in the present invention is a value measured at 25° C.

<Method for Storing Photosensitive Resin Composition>

The photosensitive resin composition of the present invention may be stored by a known method. The photosensitive resin composition can be stored in an airtight container of glass or metal. The photosensitive resin composition can be stored in an atmosphere of air or nitrogen. From the viewpoint of preventing unexpected oxidation of the photosensitive resin composition, a nitrogen atmosphere is preferable. The storage temperature may be set to a known temperature. For example, room temperature (20° C. to 25° C.), cold storage (0° C. to 5° C.), and refrigeration (−50° C. to −10° C.) may be exemplified. From the viewpoint of preventing unexpected oxidation of the photosensitive resin composition, refrigeration or cold storage is preferable and refrigeration is more preferable. Specifically, 5° C., −10° C., −20° C., and −30° C. may be exemplified and −20° C. is preferable.

<Method for Producing Cured Film>

It is preferable that the method for producing a cured film according to the present invention includes the following steps of (1) to (5).

(1) Step of applying the photosensitive resin composition of the present invention to a substrate (coating step)

(2) Step of removing a solvent from the applied photosensitive resin composition (solvent removing step)

(3) Step of exposing the photosensitive resin composition from which the solvent is removed to actinic rays (exposure step)

(4) Step of developing the exposed photosensitive resin composition with a developer (development step)

(5) Step of thermosetting the developed photosensitive resin composition (post-bake step)

Hereinafter, each step will be described sequentially.

In the step of (1), it is preferable that the photosensitive resin composition of the present invention is applied to a substrate to form a wet film including a solvent.

In the step of (1), before the photosensitive resin composition is applied to a substrate, the substrate may be subjected to cleaning such as alkali cleaning or plasma cleaning. In addition, the substrate after cleaning may be subjected to a substrate surface treatment with hexamethyldisilazane. Although not particularly limited, the method for the substrate surface treatment with hexamethyldisilazane includes, for example, a method including exposing a substrate to the vapor of hexamethyldisilazane and the like.

The substrate may be an inorganic substrate, a resin substrate or a resin composite material substrate or the like.

Examples of the inorganic substrate include a glass substrate, a quartz substrate, a silicon substrate, a silicon nitride substrate, and composite substrates obtained by depositing the vapor of molybdenum, titanium, aluminum, copper or the like on such substrates.

Examples of the resin substrate include substrates made of synthetic resins such as polybutylene terephthalate, polyethylene terephthalate, polyethylene naphthalate, polybutylene naphthalate, polystyrene, polycarbonate, polysulfone, polyethersulfone, polyallylate, allyl diglycol carbonate, polyamide, polyimide, polyamide imide, polyetherimide, polybenzazol, polyphenylene sulfide, polycycloolefine, norbornene resins, fluororesins such as polychlorotrifluoroethylene, liquid crystal polymers, acrylic resins, epoxy resins, silicone resins, ionomer resins, cyanate resins, crosslinked fumaric acid diesters, cyclic polyolefins, aromatic ether, maleimide olefins, cellulose, episulfide compounds and the like. In the case of using a resin substrate, a so-called roll-to-roll process may be used.

These substrates are rarely used as such, and for example, a multilayer structure such as a thin film transistor (TFT) element is formed thereon depending on the form of the final products.

The size of the substrate is not particularly limited. From the viewpoint of productivity and coatability, the area of the substrate is preferably 10,000 mm² or more and 10,000,000 mm² or less. For example, a 300 mm×400 mm square size and a 1,000 mm×1,100 mm square size may be adopted.

The method for applying the photosensitive resin composition to the substrate is not particularly limited and for example, methods such as a slit coating method, a spray method, a roll coating method, a spin coating method, a cast coating method, and a slit-and-spin method may be used.

In the case of a slit coating method, it is preferable that the relative movement speed between a substrate and a slit die is set to 50 to 120 mm/sec. From the viewpoint of being capable of achieving effectively coating of a large substrate and excellent productivity, slit coating is preferable. The large substrate refers to a substrate having an area of 300,000 mm² or more and 10,000,000 mm² or less.

The thickness of the wet film formed when the photosensitive resin composition is applied is not particularly limited and the photosensitive resin composition may be applied to have a film thickness according to the purpose. For example, the film thickness is preferably 0.5 to 10 μm.

Before the photosensitive resin composition of the present invention is applied to the substrate, a so-called pre-wet method described in JP2009-145395A can be applied.

In the step of (2), a solvent is removed from the wet film, which is formed by applying the photosensitive resin composition to the substrate, in reduced pressure (vacuum) and/or by heating to form a dry film on the substrate. The heating of the solvent removing step is preferably carried out under the condition of a temperature of 70° C. to 130° C. for about 30 to 300 seconds. In the case in which the temperature and the time are within the above ranges, there is a tendency that the adhesiveness of a pattern is further improved and the residue can be further reduced. The film thickness of the dry film may be selected according to the purpose and is not particularly limited. From the viewpoint of ease of solvent removal, the film thickness is preferably 0.01 to 20 μm, more preferably 0.1 to 10 μm, and most preferably 0.1 to 5.0 μm.

In the step of (3), the substrate provided with a dry film thereon is irradiated with actinic rays having a predetermined pattern. In this step, in exposed portion, a carboxyl group or a phenolic hydroxyl group is generated and the solubility in a developer in the exposed portions is improved. That is, in the embodiment including a polymer component including a constitutional unit having a group in which an acid group that is protected with an acid decomposable group, and a photoacid generator, the photoacid generator is decomposed by irradiation with actinic rays to generate an acid. Then, the acid decomposable group included in the coating components hydrolyzed by the catalytic action of the generated acid to generate a carboxyl group or phenolic hydroxyl group. In addition, in the embodiment including a quinone diazide compound, a carboxyl group is generated from the quinone diazide compound by irradiation with actinic rays.

Light sources of actinic rays that may be used include low pressure mercury lamps, high pressure mercury lamps, ultra-high pressure mercury lamps, chemical lamps, light emitting diode (LED) light sources, and excimer laser oscillators, and actinic rays having a wavelength of 300 nm or more and 450 nm or less, such i-line (365 nm), h-line (405 nm), and g-line (436 nm), can be preferably used. Further, the irradiation light can be adjusted through spectral filters such as long-wavelength cut-off filters, short-wavelength cut-off filters, band pass filters and the like as appropriate. The exposure dose is preferably 1 to 500 mJ/cm$^2$.

Exposure devices that may be used include various types of exposure devices such as mirror projection aligners, steppers, scanners, proximity systems, contact systems, microlens arrays, and laser exposure systems. In addition, exposure using so-called super-resolution techniques can be carried out. Examples of the super-resolution techniques include multiple exposure that exposure is carried out multiple times, a method using a phase difference shift mask, and an annular illumination method. A highly fine pattern can be formed by using these super-resolution techniques, which is preferable.

In the step of (4), a copolymer having a free carboxyl group or phenolic hydroxyl group is developed using a developer. By removing the exposed portions having a carboxyl group and/or a phenolic hydroxyl group that is easily dissolved in the developer, a positive image is formed.

The developer that is used in the development step preferably includes an aqueous solution of a basic compound. As the basic compound, for example, alkali metal hydroxides such as lithium hydroxide, sodium hydroxide, and potassium hydroxide; alkali metal carbonates such as sodium carbonate, potassium carbonate, and cesium carbonate; alkali metal bicarbonates such as sodium bicarbonate and potassium bicarbonate; tetraalkyl ammonium hydroxides such as tetramethyl ammonium hydroxide, tetraethyl ammonium hydroxide, tetrapropyl ammonium hydroxide, tetrabutyl ammonium hydroxide, and diethyldimethyl ammonium hydroxide; (hydroxyalkyl) trialkyl ammonium hydroxides such as choline; silicates such as sodium silicate and sodium metasilicate; alkyl amines such as ethylamine, propylamine, diethylamine, and triethylamine; alcohol amines such as dimethylethanol amine and triethanol amine; and alicyclic amines such as 1,8-diazabicyclo[5.4.0]-7-undecene, and 1,5-diazabicyclo[4.3.0]-5-nonene may be used.

Among these, sodium hydroxide, potassium hydroxide, tetramethyl ammonium hydroxide, tetraethyl ammonium hydroxide, tetrapropyl ammonium hydroxide, tetrabutyl ammonium hydroxide, and choline(2-hydroxyethyltrimethyl ammonium hydroxide) are preferable.

It is also possible to use an aqueous solution obtained by adding an appropriate amount of a water soluble organic solvent such as methanol or ethanol or a surfactant to the above aqueous solution of an alkali as the developer.

The pH of the developer is preferably 10.0 to 14.0.

The development time is preferably 30 to 500 seconds, and the method for development may be any of a liquid puddle method (puddle method), a shower method, and a dip method.

A rinsing step may be carried out after development. In the rinsing step, removal of attached developer and removal of development residue are carried out by washing the substrate with pure water or the like after development. As a rinsing method, a known method may be used. Examples thereof include shower rinsing and dip rinsing.

A cured film may be formed such a manner that the acid decomposable group is decomposed to generate a carboxyl group or a phenolic hydroxyl group by heating the obtained positive image in the step of (5), and crosslinking the group with a crosslinking group, a crosslinking agent or the like. Regarding the heating, a heating treatment is preferably carried out using a heating device such as a hot plate or an oven at a predetermined temperature, for example, 180° C. to 250° C. for a predetermined time, for example, for 5 to 90 minutes in the case of using a hot plate, and for 30 to 120 minutes in the case of using an oven. By advancing the crosslinking reaction as described above, a protective film and an interlayer insulating film having excellent heat resistance, hardness, and the like may be formed. In addition, in the present invention, even in the embodiment which does not include a crosslinking group, a crosslinking agent, and the like, the polybenzoxazole precursor may be ring-closed (cured) by heating so as to form a cured film. The heating temperature for ring-closing (curing) the polybenzoxazole precursor is preferably 180° C. to 400° C. and more preferably 220° C. to 350° C. The heating time is preferably 15 to 120 minutes.

In addition, when the heating treatment is carried out in a nitrogen atmosphere, transparency can be further improved. The lower the oxygen concentration of the heating atmosphere is, the more preferable it is. In the case of heating in a nitrogen-substituted atmosphere, from the viewpoint of transparency of a cured film, the oxygen concentration of the heating atmosphere (in terms of mol) is preferably 1.0 ppt to 10%, more preferably 1.0 ppb to 5%, and most preferably 1.0 ppm to 3%.

Post-baking may be carried out after carrying out baking at a relatively low temperature before post-baking (addition of a middle-bake step). In the case of carrying out middle-baking, it is preferable that heating is carried out at 90° C. to 150° C. for 1 to 60 minutes and then post-baking is carried out at a high temperature of 200° C. or higher. In addition, it is also possible to carry out middle-baking and post-baking in multiple stages of three or more stages in a divided manner. Designing the middle-baking and post-baking in this manner enables the taper angle of a pattern to be adjusted. The above heating may be carried out by using a known heating method such as a hot plate, an oven, or an infrared heater.

As the post-bake step, for example, heating is carried out sequentially at 90° C. for 30 minutes, at 120° C. for 30 minutes, 180° C. for 40 minutes, and 320° C. for 60 minutes in an oven in which the oxygen partial pressure is set to 1,000 ppm by nitrogen purging.

Before post-baking the whole surface of the substrate on which a pattern is formed is re-exposed (post-exposed) to actinic rays and then post-baked so that an acid is generated from the photoacid generator present in non-exposed portions. The acid may function as a catalyst for accelerating a crosslinking step and the curing reaction of the film may be accelerated. In the case of the method including a post-exposure step, a preferable exposure dose is preferably 100 to 3,000 mJ/cm$^2$ and particularly preferably 100 to 500 mJ/cm$^2$. In the case of carrying out a post-exposure step, a taper angle of a pattern when the pattern is formed may be set to be large. In contrast, in the case of not carrying out a post-exposure step, a taper angle of a pattern may be set to be small. Whether a post-exposure step is carried out or not and the exposure dose when a post-exposure is carried out may be appropriately adjusted according to a taper angle of a desired pattern. The taper angle of a pattern can be, for example, 15°, 30°, 45°, 60°, 75°, and 90°. In the case of using the cured film as an insulating film, the taper angle is preferably 30°, 45°, 60°, and 75°.

The cured film obtained from the photosensitive resin composition of the present invention may be used as a dry etching resist. In the case of using the cured film obtained through thermosetting by the post-baking step as dry etching resist, as an etching treatment, etching treatments such as ashing, plasma etching, and ozone etching may be carried out.

<Cured Film>

The cured film of the present invention is a cured film which is obtained by curing the above-described photosensitive resin composition of the present invention. In addition, the cured film of the present invention is preferably a cured film which is obtained by the above-described method for forming a cured film of the present invention.

The cured film of the present invention may be suitably used as an interlayer insulating film.

Even in the case in which the photosensitive resin composition of the present invention is baked at a high temperature, an interlayer insulating film having high transparency can be obtained. The interlayer insulating film formed using the photosensitive resin composition of the present invention has high transparency and is useful for applications to a liquid crystal display device, an organic electroluminescent display device, a touch panel, and the like.

The cured film of the present invention may have various physical properties according to applications.

In the case of using the film as an interlayer insulating film for a semiconductor element or the like, from the viewpoint of reducing the parasitic capacitance generated in the element, it is preferable that the specific dielectric constant is low. In this case, the specific dielectric constant is preferably 1.5 to 4.0 and more preferably 2.2 to 3.2.

In the case of using the cured film of the present invention as an insulating film, from the viewpoint of improving insulting properties, it is preferable that the volume resistance is high. The volume resistance is preferably $1.0 \times 10^{10}$ to $1.0 \times 10^{20}$ Ω·cm and more preferably $1.0 \times 10^{13}$ to $1.0 \times 10^{18}$ Ω·cm.

In the case in which the cured film of the present invention is used for an application requiring antistatic performance, the volume resistance is preferably $1.0 \times 10^4$ to $1.0 \times 10^{13}$ Ω·cm and more preferably $1.0 \times 10^6$ to $1.0 \times 10^{11}$ Ω·cm.

When an electronic element is formed using the cured film, from the viewpoint of improving the durability of the electronic element, it is preferable that the Young's modulus of the cured film is high. The Young's modulus is preferably, for example, 0.5 to 8.0 GPa or 1.0 to 4.0 GPa.

When an electronic element is formed using the cured film, from the viewpoint of improving the durability of the electronic element, it is preferable that the breaking elongation of the cured film is high. The breaking elongation is preferably, for example, 20 to 200% or 50 to 150%.

When an electronic element is formed using the cured film, from the viewpoint of improving the durability of the electronic element, it is preferable that the glass transition temperature (Tg) of the cured film is high. Tg is preferably, for example, 100° C. to 400° C.

Form the viewpoint of preventing the warping of the substrate on which the cured film is formed, it is preferable that the linear expansion coefficient of the cured film is close to the linear expansion coefficient of the substrate. For example, in the case of using a metal substrate, a glass substrate, and a silicon substrate having a linear expansion coefficient within a range of 2 to 20 ppm/° C., the linear expansion coefficient of the cured film is preferably 10 to 100 ppm/° C. and more preferably 15 to 65 ppm/° C. In this case, specific examples of linear expansion coefficient of the cured film include 15 ppm/° C. and 25 ppm/° C. For example, in the case of using a resin substrate having a linear expansion coefficient within a range of 20 to 120 ppm/° C., the linear expansion coefficient of the cured film is preferably 20 to 120 ppm/° C. and more preferably 40 to 80 ppm/° C. In this case, specific examples of linear expansion coefficient of the cured film include 48 ppm/° C., 59 ppm/° C., and 69 ppm/° C. The above linear expansion coefficient means a linear expansion coefficient at a temperature of equal to or lower than Tg in the case in which the cured film has Tg.

In the case of using the cured film of the present invention as a lens material, it is preferable that the refractive index is high. In this case, for example, the refractive index at 400 nm is preferably 1.5 to 2.0 and more preferably 1.6 to 1.8.

In the case of using the cured film of the present invention as an antireflection film, it is preferable that the refractive index is low. In this case, for example, the refractive index at 400 nm is preferably 1.0 to 1.6 and more preferably 1.2 to 1.4.

<Liquid Crystal Display Device>

The liquid crystal display device of the present invention has the cured film of the present invention.

The liquid crystal display device of the present invention is not particularly limited except that the liquid crystal display device has a flattened film or an interlayer insulating film that is formed using the photosensitive resin composition of the present invention and known liquid crystal display devices adopting various structures may be used.

Examples of a TFT that can be adopted by the liquid crystal display device of the present invention include an amorphous silicon-TFT, a low temperature polysilicon-TFT, and an oxide semiconductor TFT. Examples of the oxide semiconductor include so-called IGZO (amorphous semiconductors composed of indium, gallium, zinc, and oxygen). The cured film of the present invention has excellent electrical properties, and thus, may be preferably used in combination with these TFTs.

Examples of a liquid crystal driving mode that can be adopted by the liquid crystal display device of the present invention include a twisted nematic (TN) mode, a vertical alignment (VA) mode, an in-plane-switching (IPS) mode, and a fringe field switching (FFS) mode, an optically compensated bend (OCB) mode.

Regarding the panel configuration, even in a color filter on array (COA) mode liquid crystal display device, the cured film of the present invention may be used. For example, the cured film can be used as an organic insulating film (115) of JP2005-284291A and in organic insulating film (212) of JP2005-346054A. In addition, the specific alignment mode of a liquid crystal alignment layer that can be adopted by the liquid crystal display device of the present invention includes a rubbing alignment method and a photoalignment method. Further, polymer alignment support may be achieved by the polymer sustained alignment (PSA) technology described in JP2003-149647A and JP2011-257734A.

In addition, the photosensitive resin composition of the present invention and the cured film of the present invention are not limited to the above applications and may be used for various applications. For example, the photosensitive resin composition and the cured film may be suitably used for, in addition to a flattened film or an interlayer insulating film, a protective film for a color filter, a spacer for keeping the thickness of a liquid crystal layer in a liquid crystal display device constant, or a microlens provided on a color filter in a solid-state imaging device.

FIG. 1 is a schematic configuration view showing an example of an active matrix type liquid crystal display device 10. The color liquid crystal display device 10 is a panel having a backlight unit 12 on the rear surface thereof and in the liquid crystal panel, elements of TFTs 16 corresponding to all pixels that are disposed between two glass substrates 14 and 15 to which a polarizing film is attached are disposed. An indium tin oxide (ITO) transparent electrode 19 forming a pixel electrode is wired to each element formed on the glass substrate through a contact hole 18 formed in a cured film 17. A liquid crystal 20 layer and an RGB color filter 22 having a black matrix disposed thereon are provided on the ITO transparent electrode 19.

The light source of the backlight is not particularly limited and a known light source may be used. For example, white light, LEDs, multicolor LEDs of blue light, red light, and green light, fluorescent light (cold cathode fluorescent lamp), organic electroluminescents (organic ELs), and the like may be used.

In addition, the liquid crystal display device can employ a liquid crystal display device of 3D (stereoscopic) type or touch panel type. Further, a liquid crystal display device of flexible type can be also employed. The liquid crystal display device may be used as a second interlayer insulating film (48) described in JP2011-145686A, an interlayer insulating film (520) described in JP2009-258758A, and an organic insulating film (PAS) described in FIG. 1 of JP2007-328210A.

Furthermore, by applying the present invention to a liquid crystal display device of a static driving mode, a pattern having high designability can be displayed. For example, as described in JP2001-125086A, the present invention may be suitably used as a polymer network type liquid crystal insulating film.

The liquid crystal display device shown in FIG. 1 of JP2007-328210A will be described using FIG. 2.

Figure 2:
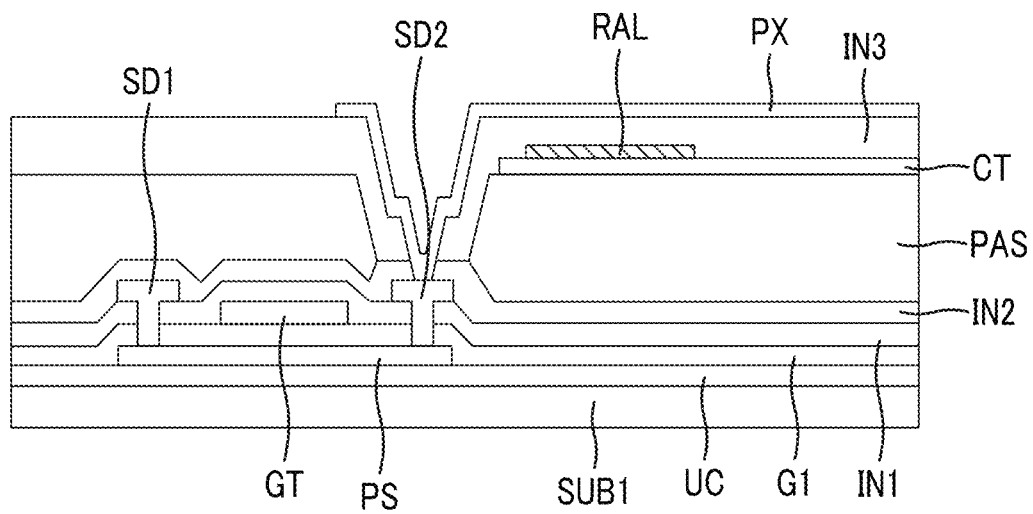
FIG. 2 is a schematic view showing another example of the configuration of a liquid crystal display device.

In FIG. 2, the reference numeral SUB1 represents a glass substrate, and the substrate has plural scanning signal lines and plural image signal lines intersecting the plural scanning signal lines. A TFT is provided near each interaction.

On the glass substrate SUB1, a base film UC, a semiconductor film PS of silicon or the like, a gate insulating film GI, a gate electrode GT of the TFT, and a first interlayer insulating film IN1 are formed in this order from the lower side. On the first interlayer insulating film IN1, a drain electrode SD1 of the TFT and a source electrode SD2 of the TFT are formed.

The drain electrode SD1 is connected to the drain region of the TFT through contact holes formed in the gate insulating film GI and the first interlayer insulating film IN1. The source electrode SD2 is connected to the source region of the TFT though contact holes formed in the gate insulating film GI and the first interlayer insulating film IN.

On the drain electrode SD1 and the source electrode SD2, a second interlayer insulating film IN2 is formed. On the second interlayer insulating film IN2, an organic insulating film PAS is formed. The organic insulating film PAS may be formed using the photosensitive resin composition of the present invention.

On the organic insulating film PAS, a counter electrode CT and a reflection film RAL are formed.

On the counter electrode CT and the reflection film RAL, a third interlayer insulating film IN3 is formed. On the third interlayer insulating film IN3, a pixel electrode PX is formed. The pixel electrode PX is connected to the source electrode SD2 of the TFT through contact holes formed in the second interlayer insulating film IN2 and the third interlayer insulating film IN3.

In the case in which the organic insulating film PAS is formed using the photosensitive resin composition of the present invention, the heat resistance of the organic insulating film PAS is improved and thus the film formation temperature of the third interlayer insulating film IN3 can be increased. Thus, a denser film can be formed.

The first interlayer insulating film IN1, the second interlayer insulating film IN2, and the third interlayer insulating film IN3 can be formed using the photosensitive resin composition of the present invention.

The details of the liquid crystal display device shown in FIG. 2 may be referred to the description of JP2007-328210A, the content of which is incorporated into the present specification.

<Organic Electroluminescent Display Device>

The organic electroluminescent (organic EL) display device of the present invention has the cured film of the present invention.

The organic EL display device of the present invention is not particularly limited except that a flattened film and an interlayer insulating film formed using the photosensitive resin composition of the present invention are provided and various known organic EL display devices and liquid crystal display devices adopting various structures may be used.

Examples of a TFT that can be adopted by the organic EL display device of the present invention include an amorphous silicon-TFT, a low temperature polysilicon-TFT, and an oxide semiconductor TFT. The cured film of the present invention has excellent electrical properties, and thus, may be preferably used in combination with these TFTs.

Figure 3:
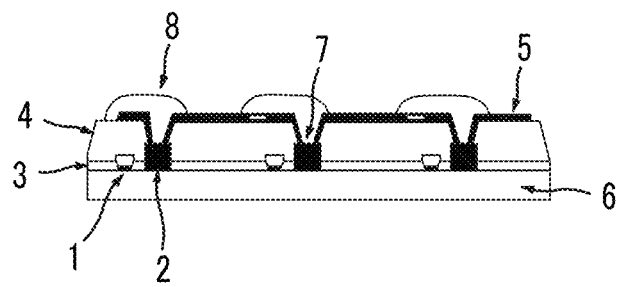
FIG. 3 is a schematic view showing an example of a configuration of an organic EL display device.

FIG. 3 is a schematic configuration view showing an example of an organic EL display device. FIG. 3 is a schematic cross-sectional view showing a substrate of a bottom emission type organic EL display device and a flattened film 4 is provided.

A bottom gate type TFT 1 is formed on a glass substrate 6, and an insulating film 3 made of $Si_3N_4$ is formed in a state in which the insulating film covers the TFT 1. A contact hole (not shown) is formed in the insulating film 3 and then a wiring 2 (having a height of 1.0 µm) which is connected to the TFT 1 through the contact hole is formed on the insulating film 3. The wiring 2 is provided to connect the TFTs 1 or an organic EL element which is to be formed in the subsequent step, and the TFT 1.

Further, in order to flatten roughness resulting from the formation of the wiring 2, a flattened film 4 is formed on the insulating film 3 in a state in which roughness resulting from the wiring 2 is embedded.

A bottom emission type organic EL element is formed on the flattened film 4. That is, a first electrode 5 made of ITO is formed on the flattened film 4 to be connected to the wiring 2 through a contact hole 7. In addition, the first electrode 5 corresponds to an anode of an organic EL element.

An insulating film 8 is formed so as to cover the edge of the first electrode 5 and providing the insulating film 8 enables a short circuit between the first electrode 5 and a second electrode formed in a subsequent step to be prevented.

Moreover, although not shown in FIG. 3, a positive hole transport layer, an organic light emitting layer, and an electron transport layer may be provided in sequence by vapor deposition through desired pattern masks, a second electrode made of Al is then formed on the entire upper surface of the substrate, and the substrate was sealed with a sealing glass plate is carried out using an ultraviolet curing type epoxy resin by lamination, thus obtaining an active matrix type organic EL display device in which a TFT 1 is connected to each organic EL element in order to drive the elements.

As another embodiments of the organic EL display device, a pixel separation film (19) and a flattened film (17) shown in FIG. 1 of JP2012-203121A may be formed using the photosensitive resin composition of the present invention. In addition, a high resistance layer (18), a inter-pixel insulating film (16), an interlayer insulating film (14), and an interlayer insulating film (12c) shown in FIG. 1 of JP2013-196919A may be formed using the photosensitive resin composition of the present invention.

Since the photosensitive resin composition of the present invention exhibits good sensitivity and excellent pattern adhesiveness during development, the photosensitive resin composition of the present invention is used for structural members for a micro electro mechanical systems (MEMS) device by using a resist pattern formed using the photosensitive resin composition as a partition wall, or incorporating the photosensitive composition as a part of a machine driving component. Examples of such a MEMS device include components such as a surface acoustic wave (SAW) filter, a bulk acoustic wave (BAW) filter, a gyro sensor, a display microshutter, an image sensor, electronic paper, an inkjet head, a biochip, a sealing agent, and the like. More specific examples are shown in JP2007-522531A, JP2008-250200A, and JP2009-263544A.

Since the photosensitive resin composition of the present invention has excellent flatness and transparency, the photosensitive resin composition may be used for forming, for example, a bank layer (16) and a flattened film (57) shown in FIG. 2 of JP2011-107476A, a partition wall (12) and a flattened film (102) shown in FIG. 4A of JP2010-9793A, a bank layer (221) and a third interlayer insulating film (216b) shown in FIG. 10 of JP2010-27591A, a second interlayer insulating film (125) and a third interlayer insulating film (126) shown in FIG. 4A of JP2009-128577A, a flattened film (12) and a pixel separation insulating film (14) shown in FIG. 3 of JP2010-182638A, and the like. In addition, the photosensitive resin composition may be suitably used for a spacer for keeping the thickness of a liquid crystal layer in a liquid crystal display device constant, a color filter of a liquid crystal display device, a color filter protective film, a facsimile, an electronic copying machine, an optical image forming system of an on-chip color filter such as a solid-state imaging device, or a microlens of an optical fiber connector.

<Touch Panel and Touch Panel Display Device>

The touch panel of the present invention is a touch panel in which the entity or a part of an insulating layer and/or a protective layer is made of a cured product of the photosensitive resin composition of the present invention. It is preferable that the touch panel of the present invention at least has a transparent substrate, an electrode, an insulating layer and/or a protective layer.

It is preferable that a touch panel display device of the present invention is a touch panel display device having the touch panel of the present invention. The touch panel of the present invention may employ a panel of any known type such as resistive film type, electrostatic capacitance type, ultrasonic type or infrared type. Among these, a panel of electrostatic capacitance type is preferable. In addition, the touch panel display device of the present invention maybe a touch panel display device in which the whole or a part of the insulating layer and/or the protective layer of the touch panel or the display device is composed of a cured product of the photosensitive resin composition of the present invention. Examples of the touch panel of electrostatic capacity type include touch panels described in JP2010-28115A and disclosed in WO 2012/057165.

Other types of touch panel display devices include touch panels of so-called, in-cell type (for example, refer to FIGS. 5, 6, 7 and 8 of JP2012-517051A), so-called, on-cell type (for example, refer to FIG. 14 of JP2012-43394A, FIG. 2B of WO 2012/141148, and FIG. 19 of JP2013-168125A) one glass solution (OGS) type, touch on lens (TOL) type, other configurations (for example, refer to FIG. 6 of JP2013-164871A), and various out-cell types (so-called, GG type, G1 type, G2 type, GFF type, GF2 type, GF1 type, GIF type, and the like).

The touch panel of electrostatic capacitance type has a front plate, and at least the following elements (1) to (5) on a non-contact side of the front plate, and the insulating layer of (4) is preferably a cured film formed using the photosensitive resin composition of the present invention.

(1) A frame layer (2) Plural first transparent electrode patterns which are formed of plural pad portions formed to extend in a first direction through connection portions (3) Plural second transparent electrode patterns which are electrically insulated from the first transparent electrode patterns and composed of plural pad portions formed to extend in a direction intersecting the first direction (4) An insulating layer which electrically insulates the first transparent electrode patterns and the second transparent electrode patterns (5) A conductive element other than the first transparent electrode patterns and the second transparent electrode patterns which is electrically connected to at least one of the first transparent electrode patterns or the second transparent electrode patterns It is preferable that a transparent protective layer is provided so as to cover the whole or a part of the above elements (1) to (5) in the electrostatic capacitance type input device of the present invention, and it is more preferable that the transparent protective layer is the cured film of the present invention.

Figure 4:
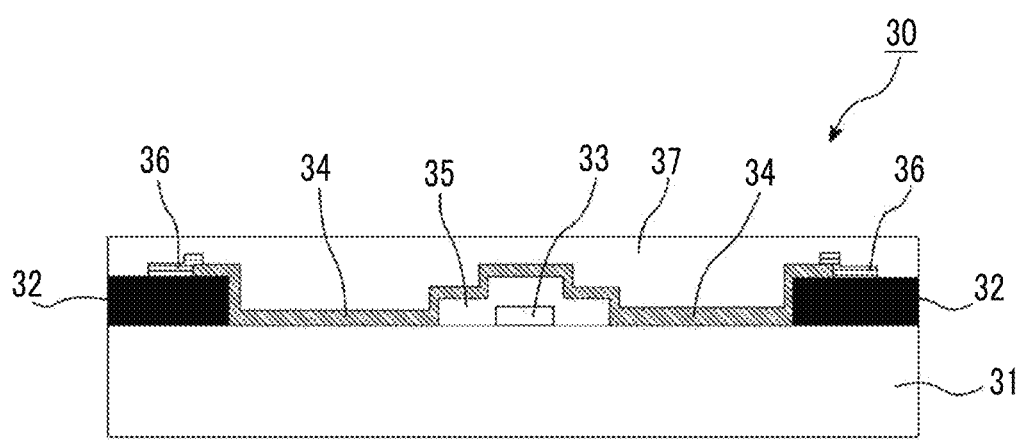
FIG. 4 is a cross-sectional view showing a configuration example of an electrostatic capacitance type touch panel.

First, the configuration of the electrostatic capacitance type touch panel will be described. FIG. 4 is a cross-sectional view showing an example of the configuration of an electrostatic capacitance type touch panel. An electrostatic capacitance type touch panel touch panel 30 in FIG. 4 includes a front plate 31, a frame layer 32, first transparent electrode patterns 33, second transparent electrode patterns 34, an insulating layer 35, a conductive element 36, and a transparent protective layer 37.

The front plate 31 is composed of a transparent substrate such as a glass substrate and tempered glass typified by GORILLA GLASS manufactured by CORNING INC. or the like may be used. Preferable examples of the transparent substrate include a glass substrate, a quartz substrate, and a transparent resin substrate. In FIG. 4, the surface where each component of the front plate 31 is provided is referred to as a non-contact surface. In the electrostatic capacitance type touch panel 30, the contact surface of the front plate 31 (the surface opposite to the non-contact surface) is touched by a finger or the like to perform an input. Hereinafter, the front plate is referred to as a "substrate" in some cases.

In addition, the frame layer 32 is provided on the non-contact surface of the front plate 31. The frame layer 32 is a frame-like pattern around a display region formed on the non-contact surface side of the front plate of the touch panel, and is formed so as to make the wirings or the like invisible.

Figure 5:
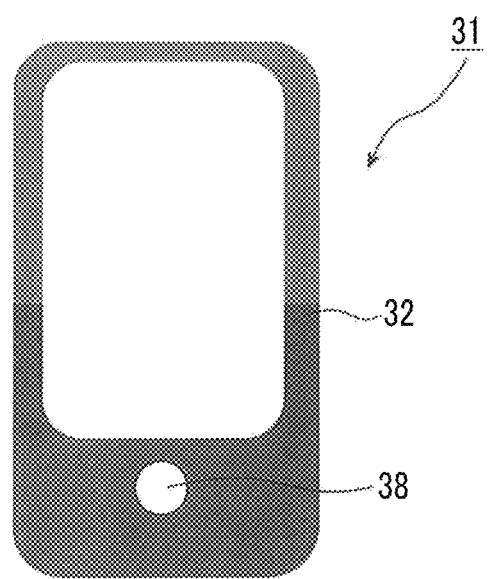
FIG. 5 is an illustration showing an example of a front plate.

As shown in FIG. 5, in the electrostatic capacitance type touch panel, the frame layer 32 may be provided so as to cover a partial region of the front plate 31 (regions other than the input surface in FIG. 5). Further, an opening portion 38 may be provided in a part of the front plate 31 as shown in FIG. 5. In the opening portion 38, a mechanical switch that is operated when pressed may be provided.

Figure 6:
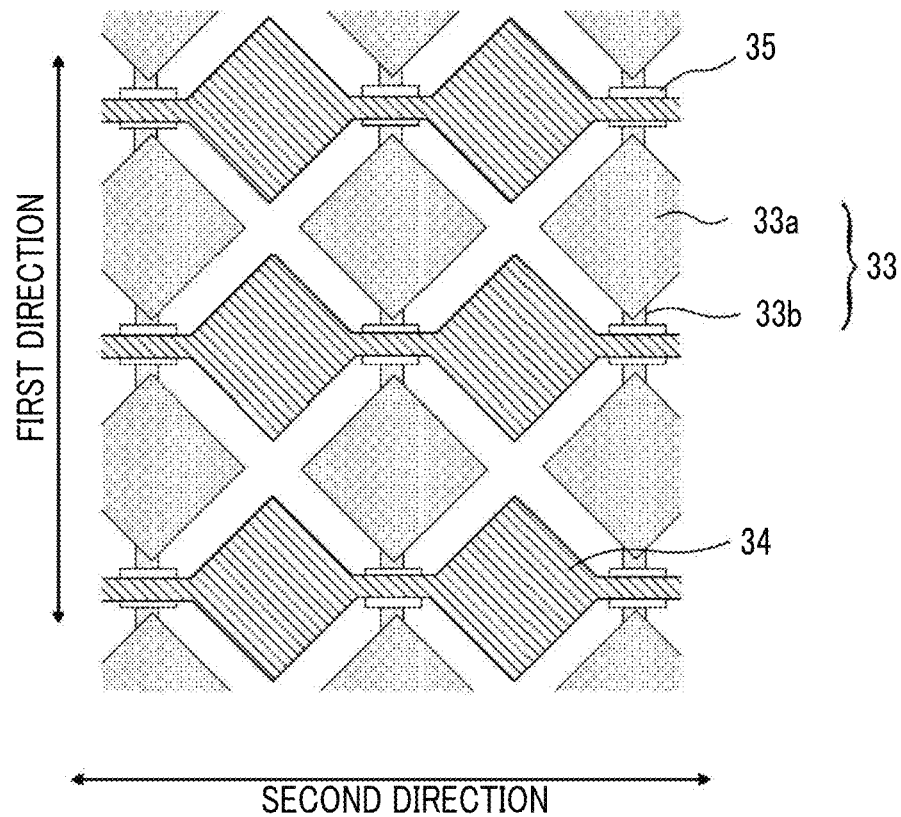
FIG. 6 is an illustration showing examples of first transparent electrode patterns and second transparent electrode patterns.

As shown in FIG. 6, on the contact surface of the front plate 31, the plural first transparent electrode patterns 33 which are formed of plural pad portions formed to extend in a first direction through connection portions, the plural second transparent electrode patterns 34 which are electrically insulated from the first transparent electrode patterns 33 and composed of plural pad portions formed to extend in a direction intersecting the first direction, and the insulating layer 35 which electrically insulates the first transparent electrode patterns 33 and the second transparent electrode patterns 34 are formed. The first transparent electrode patterns 33, the second transparent electrode patterns 34, and the conductive element 36, which will be described later, may be formed with, for example, a metal film. Examples of such a metal film include an indium tin oxide (ITO) film; an indium zinc oxide (IZO) film; a metal film of Al, Cu, Ag, Ti, Mo, or an alloy of these metals; and a metal oxide film such as $SiO_2$. At this time, the film thickness of each component may be set to 10 to 200 nm. In addition, an amorphous ITO film is crystallized into a polycrystal ITO film by baking so that the electrical resistance can be reduced. Further, the first transparent electrode patterns 33, the second transparent electrode patterns 34, and the conductive element 36, which will be described later, may be formed using a photosensitive transfer material having a photosensitive resin composition using a conductive fiber. In addition, in the case of forming first conductive patters using ITO or the like, paragraphs 0014 to 0016 of JP4506785B or the like may be referred to, the content of which is incorporated into the present specification.

At least one of the first transparent electrode patterns 33 or the second transparent electrode patterns 34 may be provided over both regions of the non-contact portion of the front plate 31 and the surface of the frame layer 32 on the opposite side of the front plate 31. In FIG. 4, the second transparent electrode patterns are provided over both regions of the non-contact portion of the front plate 31 and the surface of the frame layer 32 on the opposite side of the front plate 31.

Using FIG. 6, the first transparent electrode patterns 33 or the second transparent electrode patterns 34 will be described. FIG. 6 is an illustration showing examples of first transparent electrode patterns and second transparent electrode patterns. As shown in FIG. 6, the first transparent electrode patterns 33 are formed of plural pad portions 33a to extend in the first direction through connection portions 33b. In addition, the second transparent electrode patterns 34 are electrically insulated from the first transparent electrode patterns 33 and the insulating layer 35 and composed of plural pad portions formed to extend in a direction intersecting the first direction (the second direction in FIG. 6). Here, in the case of forming the first transparent electrode patterns 33, the pad portions 33a and the connection portions 33b may be integrally prepared. Alternatively, only the connection portions 33b may be prepared and then the pad portions 33a and the second transparent electrode patterns 34 may be integrally prepared (patterned). In the case in which the pad portions 33a and the second transparent electrode patterns 34 are integrally prepared (patterned), each layer is formed such that a part of the connection portion 33b and a part of the pad portion 33a are connected to each other as shown in FIG. 6 and the first transparent electrode patterns 33 and the second transparent electrode patterns 34 are electrically insulated by the insulating layer 35.

In FIG. 4, the conductive element 36 is provided on the surface of the frame layer 32 on the opposite side of the front plate 31. The conductive element 36 is electrically connected to at least one of the first transparent electrode patterns 33 or the second transparent electrode patterns 34 and is an element other than the first transparent electrode patterns 33 and the second transparent electrode patterns 34. In FIG. 4, the conductive element 36 is connected to the second transparent electrode patterns 34.

In addition, in FIG. 4, the transparent protective layer 37 is provided so as to cover the entirety of each constitutional component. The transparent protective layer 37 may be configured so as to cover some of each constitutional component. The insulating layer 35 and the transparent protective layer 37 may be formed using the same material or different materials.

The electrostatic capacitance type touch panel and the touch panel display device including the electrostatic capacitance type touch panel as a constitutional element may adopt configurations disclosed in "Advanced Touch Panel Technology" (published on Jul. 6, 2009 by Techno Times Co., Ltd.) edited by Mitani Yuji, "Technologies and Development of Touch Panels", CMC Publishing Co., Ltd. (2004, 12), "FPD International 2009 Forum T-11 lecture textbook", "Cypress Semiconductor Corporation application note AN2292", and the like.

The touch panel of the present invention may be produced, for example as follows.

That is, the touch panel may be produced through Step 1 of applying the photosensitive resin composition of the present invention so as to be in contact with an ITO electrode by various methods such as an ink jet coating method, Step 2 of placing a mask having a predetermined opening pattern shape on the photosensitive resin composition applied to the ITO electrode and exposing the mask by irradiation with actinic energy rays, Step 3 of developing the photosensitive resin composition after the exposure, and Step 4 of heating the photosensitive resin composition after the development.

In Step 1, when the photosensitive resin composition is applied so as to be in contact with the ITO electrode, at least a part of the applied photosensitive resin composition of the present invention may be in contact with the ITO electrode.

Step 2 may be carried out in the same manner as in the above-described exposure step and the preferable embodiment thereof is also the same.

Step 3 may be carried out in the same manner as in the above-described development step and the preferable embodiment thereof is also the same.

Step 4 may be carried out in the same manner as in the above-described post-baking step and the preferable embodiment thereof is also the same.

In addition, a preferable example of the ITO electrode in the touch panel of the present invention includes the above-described pattern shown in FIG. 6.

Figure 7:
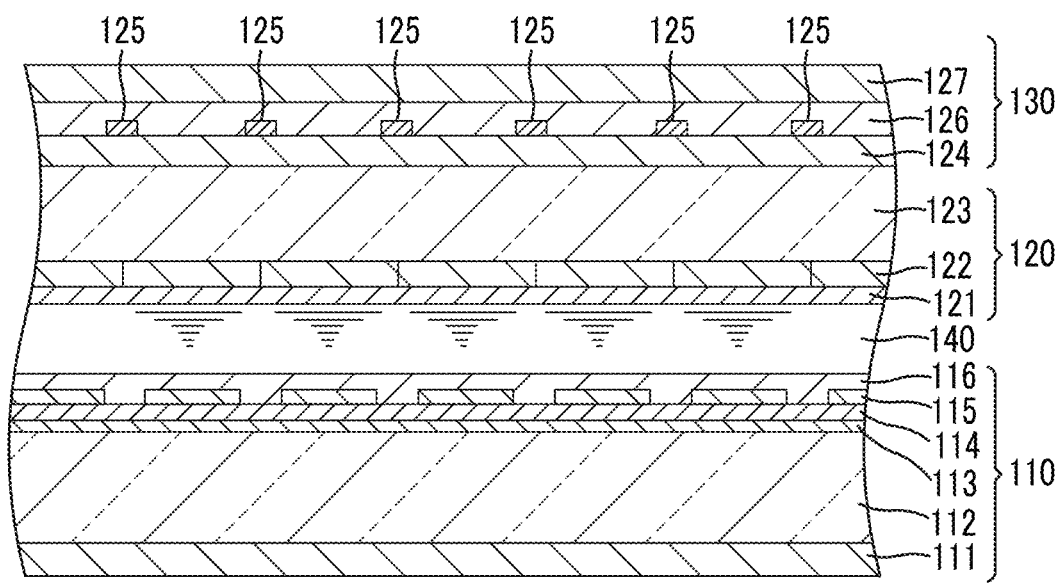
FIG. 7 is a schematic view showing an example of a liquid crystal display device having a function of a touch panel.

FIG. 7 a schematic view showing an example of a liquid crystal display device having a function of a touch panel.

For example, the cured film of the present invention is suitably applied to the protective layer between each layer in FIG. 7 and also suitably applied to an interlayer insulating film which separates the detection electrodes of the touch panel. The detection electrode of the touch panel is preferably a transparent electrode (of indium tin oxide (ITO), indium zinc oxide (IZO), or the like), a metal electrode (of silver, copper, molybdenum, titanium, aluminum, laminates and alloys thereof, or the like), or a laminate thereof.

In FIG. 7, the reference numeral 110 denotes a pixel substrate, the reference numeral 140 denotes a liquid crystal layer, the reference numeral 120 denotes a counter substrate, and the reference numeral 130 denotes a sensor portion, respectively. The pixel substrate 110 has a polarizing plate 111, a transparent substrate 112, a common electrode 113, an insulating layer 114, a pixel electrode 115, and an alignment film 116 in this order from the lower side in FIG. 7. The counter substrate 120 has an alignment film 121, a color filter 122, and a transparent substrate 123 in this order from the lower side in FIG. 7. The sensor portion 130 respectively has a phase difference film 124, an adhesive layer 126, and a polarizing plate 127. In addition, in FIG. 7, the reference numeral 125 denotes a sensor detection electrode. The cured film of the present invention may be used for the insulating layer (114) (also referred to as an interlayer insulating film) and various protective films (not shown) of the pixel substrate portion, various protective films (not shown) of the counter substrate portion, various protective films (not shown) of the sensor portion, and the like.

For the adhesive layer 126 and the polarizing plate 127, known adhesive compositions may be used. Specific examples of the polarizing plate and the adhesive layer include a polarizing plate with an adhesive layer described in Examples 1, 7, and 13 of JP2014-152319A, a polarizing plate with an adhesive layer described in Examples, 3, and 6 of JP2014-191005A, a polarizing plate with an adhesive layer described in Examples 1, 3, 6, 11 and 14 of JP2013-100386A, and an adhesive layer described in Examples 1, 2, 3, and 4 of JP2013-163783A.

Further, a pattern having high designability can be displayed even in the static driving type liquid crystal display device by applying the present invention. For example, the present invention may be applied as a polymer network type liquid crystal insulating film as described in JP2001-125086A.

Figure 8:
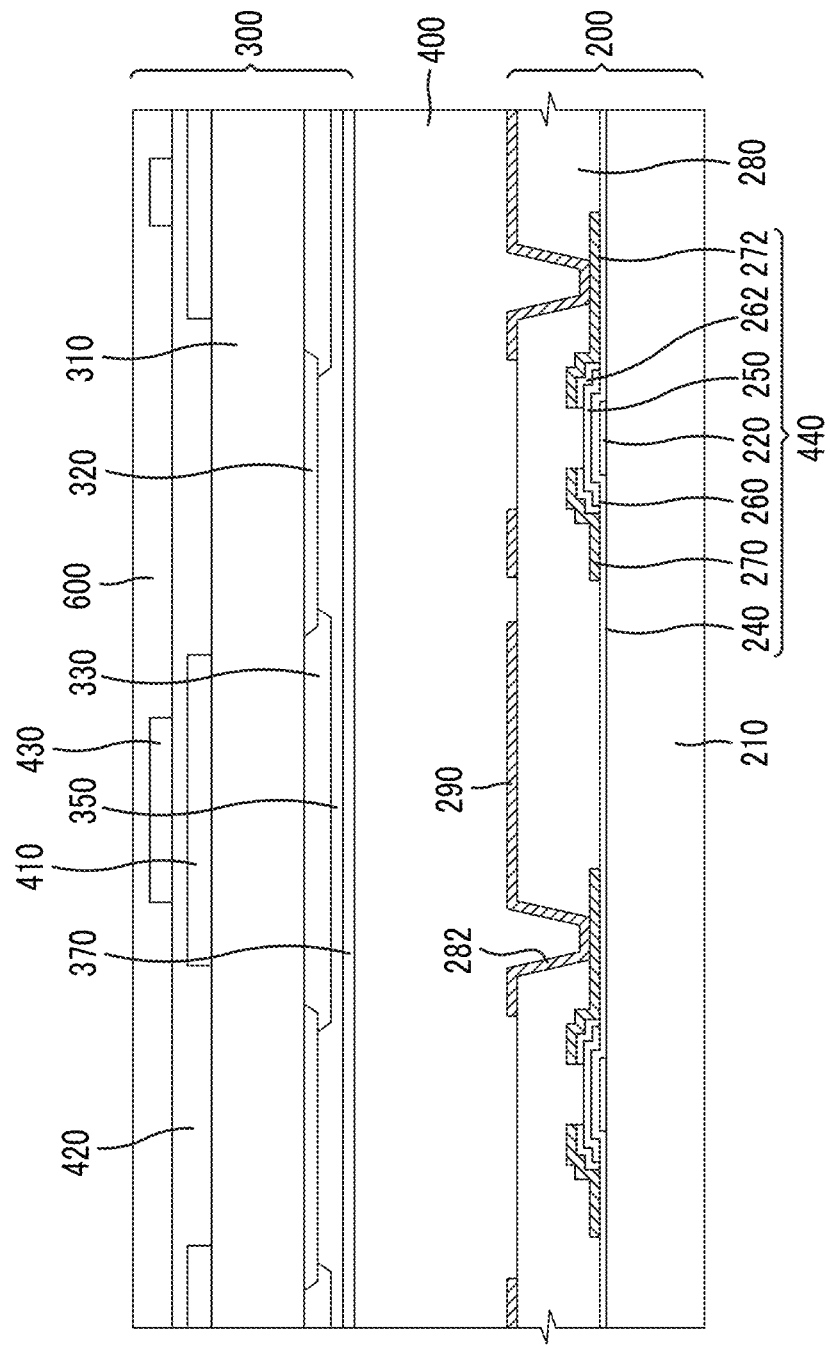
FIG. 8 is a schematic view showing an example of a liquid crystal display device having a function of a touch panel.

FIG. 8 is a schematic view showing another example of a liquid crystal display device having a function of a touch panel. The touch panel includes a lower display plate 200 which is provided with a thin film transistor (TFT) 440 and corresponds to a thin film transistor display plate, an upper display plate 300 which faces the lower display plate 200, is provided with plural color filters 330 on the surface on the opposite side of the lower display plate 200, and corresponds to a color filter display plate, and a liquid crystal layer 400 which is formed between the lower display plate 200 and the upper display plate 300. The liquid crystal layer 400 includes liquid crystal molecules (not shown).

The lower display plate 200 includes a first insulating substrate 210, a thin film transistor (TFT) which is disposed on the first insulating substrate 210, an insulating film 280 which is formed on an upper surface of the thin film transistor (TFT), and a pixel electrode 290 which is disposed on the insulating film 280. The thin film transistor (TFT) may include a gate electrode 220, a gate insulating film 240 which covers the gate electrode 220, a semiconductor layer 250, ohmic contact layers 260 and 262, a source electrode 270, and a drain electrode 272. A contact hole 282 is formed on the insulating film 280 such that the drain electrode 272 of the thin film transistor (TFT) is exposed.

The upper display plate 300 includes a light blocking member 320 which is disposed on one surface of a second insulating substrate 310 and arranged in a matrix shape, a color filter 330 which is disposed on the second insulating substrate 310, an alignment film 350 which is disposed on the light blocking member 320 and the color filter 330, and a common electrode 370 which is disposed on the alignment film 350 and applies a voltage to the liquid crystal layer 400 corresponding to the pixel electrode 290 of the lower display plate 200.

In the liquid crystal display device shown in FIG. 8, a touch sensing electrode 410, an insulating film 420, a touch driving electrode 430, and a protective film 600 are disposed on the other surface of the second insulating substrate 310. In the production of the liquid crystal display device shown in FIG. 4 as described above, when the upper display plate 300 is formed, the touch sensing electrode 410, the insulating film 420, and the touch driving electrode 430, which are constitutional components for a touch screen, may be formed together. Particularly, the cured film obtained by curing the curable composition of the present invention may be applied to the insulating film 280 of the lower display plate 200, the insulating film 420 of the upper display plate 300, and the protective film 600.

EXAMPLES

The present invention will be further specifically described by reference to the following Examples. The materials, amount of material used, proportions, treatment details, treatment procedure, and the like shown in the Examples below may be modified as appropriate as long as the modifications do not depart from the spirit and scope of the present invention. Therefore, the scope of the present invention should not be construed as being limited to the specific Examples shown below. In addition, "parts" and "%" are on a mass basis unless otherwise specified.

<Synthesis of Dicarboxylic Acid Dichloride>

27.55 g (0.160 mol) of 1,4-cyclohexanedicarboxylic acid (cis- and trans-mixture, manufactured by Tokyo Chemical Industry Co., Ltd.) and 64.28 g of N-methyl-2-pyrrolidone (NMP) were put into a three-neck flask equipped with a thermometer, a stirrer, and a nitrogen introduction pipe, and 38.07 g (0.320 mol) of thionyl chloride was added dropwise thereto at room temperature. After the completion of the dropwise addition, the materials were stirred at room temperature for 1 hour and an excessive amount of thionyl chloride was distilled off under reduced pressure. Thus, a NMP solution containing 30% by mass of 1,4-cyclohexanedicarboxylic acid dichloride (cis- and trans-mixture) was obtained.

Other dicarboxylic acid chlorides were synthesized in the same manner and thus 30% by mass NMP solutions were obtained.

<Synthesis of Polybenzoxazole (PBO) Precursor A-1>

73.25 g (0.200 mol) of hexafluoro-2,2-bis(3-amino-4-hydroxyphenyl)propane (Bis-AP-AF, manufactured by Central Glass Co., Ltd.), 31.64 g (0.400 mol) of pyridine, and 293 g of NMP were put into a three-neck flask equipped with a thermometer, a stirrer, and a nitrogen introduction pipe. These materials were stirred at room temperature and cooled to −15° C. in a dry ice/methanol bath. To this solution, while maintaining the reaction temperature at −5° C. to −15° C., a mixed solution of 30.11 g (0.144 mol) of a NMP solution containing 30% by mass of 1,4-cyclohexanedicarboxylic acid dichloride, 3.83 g (0.016 mol) of sebacoyl chloride (manufactured by Tokyo Chemical Industry Co., Ltd.), and 96.25 g of NMP was added dropwise. After the completion of the dropwise addition, the obtained mixture was stirred at room temperature for 16 hours.

Next, the reaction solution was cooled to −5° C. or lower in an ice/methanol bath, and while maintaining the reaction temperature at −0° C. or lower, a mixed solution of 9.59 g (0.090 mol) of butyryl chloride (manufactured by Tokyo Chemical Industry Co., Ltd.) and 34.5 g of NMP was added dropwise thereto. After the completion of the dropwise addition, the mixture was further stirred for 16 hours.

The reaction solution was diluted with 550 g of NMP was poured into 4 L of a deionized water/methanol (having a volume ratio of 80/20) mixture which had been vigorously stirred, the precipitated white powder was collected by filtration and washed with deionized water. A polymer was dried at 50° C. for 2 days under vacuum to obtain a resin A-1a.

25.00 g of the resin A-1a, 125 g of NMP, and 125 g of methyl ethyl ketone were put into a 500 mL flask, and the contents were concentrated under reduced pressure at 60° C. so as to obtain 160 g of a concentrate. Here, 0.43 g (1.85 mmol) of camphorsulfonic acid (manufactured by Tokyo Chemical Industry Co., Ltd.) and 5.12 g (0.065 mol) of 2,3-dihydrofuran (manufactured by Wako Pure Chemical Industries, Ltd.) was added thereto and the materials were stirred at room temperature for 1.5 hours. The obtained solution was diluted by adding 0.37 g of triethylamine and 150 g of NMP.

The obtained solution was poured into 2 L of a deion water/methanol (having a volume ratio of 80/20) mixture which had been vigorously stirred, a precipitated white powder was collected by filtration and washed with deionized water. The polymer was dried at 50° C. for 2 days under vacuum to obtain a polybenzoxazole (PBO) precursor A-1. The weight-average molecular weight of the obtained PBO precursor A-1 was 29,000 (a value in terms of polystyrene obtained by gel permeation chromatography). The hydroxyl group protection rate of the obtained PBO precursor A-1 was 30% with respect to the total hydroxyl group amount (molar weight) of A-1a ($^1$H-NMR). The structure of the PBO precursor A-1 is shown below. In the formula, $^n$Pr represents an n-propyl group.

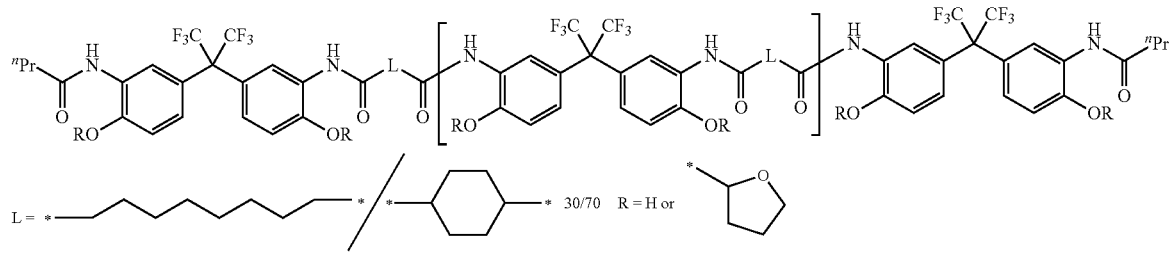

<Synthesis of Polybenzoxazole Precursors A-2 to 62 and R-1 to R-9>

Using raw materials shown in the following tables, PBO precursors A-2 to 62 and R-1 to R-9 were synthesized by the synthesizing method of the PBO precursor A-1. The ratio in the tables is a molar ratio.

<Synthesis of Polybenzoxazole Precursor A-63>

82.41 g (0.225 mol) of hexafluoro-2,2-bis(3-amino-4-hydroxyphenyl)propane (Bis-AP-AF, manufactured by Central Glass Co., Ltd.) and 330 g of NMP were put into a three-neck flask equipped with a thermometer, a stirrer, and a nitrogen introduction pipe. The materials were stirred at 40° C. and then cooled to 3° C. in an ice bath. To the solution, while maintaining the reaction temperature at 0° C. to 10° C., a mixed solution of 29.64 g (0.142 mol) of 1,4-cyclohexanedicarboxylic acid dichloride, 14.53 g (0.0607 mol) of sebacoyl chloride (manufactured by Tokyo Chemical Industry Co., Ltd.), 0.487 g (0.00620 mol) of acetyl chloride (manufactured by Tokyo Chemical Industry Co., Ltd.), and 115.69 g of NMP, and a mixed solution of 32.53 g (0.411 mol) of pyridine (manufactured by Wako Pure Chemical Industries, Ltd.) and 84.70 g of NMP were added dropwise at the same time for 4 hours. After the completion of the dropwise addition, the reaction solution (0.05 g) was diluted with THF (5.00 g) and GPC was measured. The weight-average molecular weight was 20,000 (a value in terms of polystyrene).

Next, to the solution, while maintaining the reaction temperature at 0° C. to 10° C., a mixed solution of 1.65 g (0.00789 mol) of 1,4-cyclohexanedicarboxylic acid dichloride, 0.807 g (0.00338 mol) of sebacoyl chloride (manufactured by Tokyo Chemical Industry Co., Ltd.), 0.0271 g (0.000345 mol) of acetyl chloride (manufactured by Tokyo Chemical Industry Co., Ltd.), and 6.43 g of NMP, and a mixed solution of 1.81 g (0.0229 mol) of pyridine (manufactured by Wako Pure Chemical Industries, Ltd.) and 4.71 g of NMP were added dropwise at the same time for 10 minutes.

Next, while maintaining the temperature of the reaction solution at 0° C. to 10° C., 1.64 g (0.0208 mol) of acetyl chloride (manufactured by Tokyo Chemical Industry Co., Ltd.) and 1.65 g (0.0208 mol) of pyridine were added dropwise. After the completion of the dropwise addition, the mixture was further stirred for 1 hour and warmed to room temperature by removing the ice bath.

The reaction solution was diluted with 300 g of isopropanol and poured into 600 g of a deionized water/isopropanol mixture (having a volume ratio of 80/20) which had been vigorously stirred, with 2,800 g of water. A precipitated white powder was collected by filtration and then washed with a deionized water/isopropanol mixture. The polymer was dried under vacuum at 50° C. for 2 days to obtain a resin A-63a.

25.00 g of the resin A-63a and 225 g of THF were put into a flask, and the contents were concentrated at 80° C. in a nitrogen flow so as to obtain 83 g of a concentrate. 167 g of THF was added thereto and the mixture was concentrated to obtain 83 g of a concentrate. 42 g of THF and 0.24 g (0.00103 mol) of (+)-10-camphorsulfonic acid (manufactured by Tokyo Chemical Industry Co., Ltd.) were added thereto, and the materials were dissolved at room temperature and then cooled to 15° C. 2.35 g (0.0335 mol) of 2,3-dihydrofuran (manufactured by Wako Pure Chemical Industries, Ltd.) was added thereto and the mixture was stirred at 15° C. for 1 hour. When $^1$H-NMR of the obtained solution was measured, the protection rate was 25%. Here, 0.25 g of 2,3-dihydrofuran (manufactured by Wako Pure Chemical Industries, Ltd.) was added thereto and the mixture was stirred at 15° C. for 1 hour. To the obtained solution, 0.16 g of triethylamine and 0.80 g of THF were added to carry out quenching.

The obtained solution was moved to a three-neck flask and 60 g of 2-butanone, 60 g of ethyl acetate, and 90 g of water were added thereto. The mixed solution was stirred at 60° C. for 10 minutes and then moved to a separating funnel and the underlayer was removed. Then, the result solution was moved to a three-neck flask. 20 g of 2-butanone and 90 g of water were added thereto. The mixed solution was stirred at 60° C. for 10 minutes and then moved to a separating funnel. The solution was left to stand still for one night and then the underlayer was removed. 80 g of the remaining upper layer was moved to a flask, 11 g of diethylene glycol ethyl methyl ether (manufactured by Tokyo Chemical Industry Co., Ltd.) and 32 g of ethyl acetate were added thereto and the mixture was concentrated under reduced pressure at 50° C. for 1 hour. 32 g of ethyl acetate was added thereto and further concentrated under reduced pressure for 30 minutes. Thereafter, the temperature was raised to 70° C. and the solution was concentrated under reduced pressure for 2 hours and cooled to room temperature. 3.0 g of diethylene glycol ethyl methyl ether (manufactured by Tokyo Chemical Industry Co., Ltd.) was added thereto and a 30% by mass diethylene glycol ethyl methyl ether solution for a PBO precursor A-63 was obtained. The weight-average molecular weight of the obtained PBO precursor A-63 was 23,000 (a value in terms of polystyrene measured by gel permeation chromatography), and the dispersion degree (Mw/Mn) was 2.1. The hydroxyl group protection rate of the obtained PBO precursor A-63 was 27% with respect to the total hydroxyl group amount (molar amount) of the A-63a ($^1$H-NMR).

<Synthesis of Polybenzoxazole Precursor A-64>

82.41 g (0.225 mol) of hexafluo-2,2-bis(3-amino-4-hydroxyphenyl)propane (Bis-AP-AF, manufactured by Central Glass Co., Ltd.) and 330 g of NMP were put into a three-neck flask equipped with a thermometer, a stirrer, and a nitrogen introduction pipe. The materials were stirred at 40° C. and then cooled to 3° C. in an ice bath. To the solution, while maintaining the reaction temperature at 0° C. to 10° C., a mixed solution of 31.29 g (0.150 mol) of 1,4-cyclohexanedicarboxylic acid dichloride, 15.34 g (0.0641 mol) of sebacoyl chloride (manufactured by Tokyo Chemical Industry Co., Ltd.), 0.514 g (0.00655 mol) of acetyl chloride (manufactured by Tokyo Chemical Industry Co., Ltd.), and 122.12 g of NMP, and a mixed solution of 37.24 g (0.471 mol) of pyridine (manufactured by Wako Pure Chemical Industries, Ltd.) and 89.41 g of NMP were added dropwise at the same time for 4 hours.

Next, while the temperature of the reaction solution was maintained at 0° C. to 10° C., 1.64 g (0.0208 mol) of acetyl chloride (manufactured by Tokyo Chemical Industry Co., Ltd.) and 1.65 g (0.0208 mol) of pyridine were added dropwise. After the completion of the dropwise addition, the mixture was further stirred for 1 hour and warmed to room temperature by removing the ice bath.

The reaction solution was diluted with 300 g of isopropanol and poured into 600 g of a deionized water/isopropanol mixture (having a volume ratio of 80/20), which had been vigorously stirred, with 2,800 g of water. A precipitated white powder was collected by filtration and then washed with a deionized water/isopropanol mixture. The polymer was dried under vacuum at 50° C. for 2 days to obtain a resin A-64a.

25.00 g of the resin A-64a and 225 g of THF were put into a flask, and the contents were concentrated in a water bath at 80° C. in a nitrogen flow so as to obtain 83 g of a concentrate. 167 g of THF was added thereto and the mixture was concentrated to obtain 83 g of a concentrate. 42 g of THF and 0.24 g (0.00103 mol) of (+)-10-camphorsulfonic acid (manufactured by Tokyo Chemical Industry Co., Ltd.) were added thereto, and the materials were dissolved at room temperature and then cooled to 15° C. 2.60 g (0.0371 mol) of 2,3-dihydrofuran (manufactured by Wako Pure Chemical Industries, Ltd.) was added thereto and the mixture was stirred at 15° C. for 1 hour. To the obtained solution, 0.16 g of triethylamine and 0.80 g of THF were added to carry out quenching.

The obtained solution was moved to a three-neck flask and 60 g of 2-butanone, 60 g of ethyl acetate, and 90 g of water were added thereto. The mixed solution was stirred at 60° C. for 10 minutes and then moved to a separating funnel and the underlayer was removed. Then, the result solution was moved to a three-neck flask. 20 g of 2-butanone and 90 g of water were added thereto. The mixed solution was stirred at 60° C. for 10 minutes and then moved to a separating funnel. The solution was left to stand still for one night and then the underlayer was removed. 80 g of the remaining upper layer was moved to a flask, 11 g of diethylene glycol ethyl methyl ether (manufactured by Tokyo Chemical Industry Co., Ltd.) and 32 g of ethyl acetate were added thereto and the mixture was further concentrated under reduced pressure at 50° C. for 1 hour. 32 g of ethyl acetate was added thereto and the mixture was further concentrated under reduced pressure for 30 minutes. Thereafter, the temperature was raised to 70° C. and the solution was concentrated under reduced pressure for 2 hours and cooled to room temperature. 3.0 g of diethylene glycol ethyl methyl ether (manufactured by Tokyo Chemical Industry Co., Ltd.) was added and a 30% by mass diethylene glycol ethyl methyl ether solution for a PBO precursor A-64 was obtained. The weight-average molecular weight of the obtained PBO precursor A-64 was 23,000 (a value in terms of polystyrene obtained by gel permeation chromatography) and the dispersion degree (Mw/Mn) was 2.1. The hydroxyl group protection rate of the obtained PBO precursor A-64 was 27% with respect to the total hydroxyl group amount (molar weight) of A-64a ($^1$H-NMR).

<Synthesis of Polybenzoxazole Precursor A-65 to A-87>

Using raw materials shown in the following tables, PBO precursors A-65 to A-87 were synthesized by the synthesizing method of the PBO precursor A-63. The ratio in the tables is a molar ratio.

TABLE 1

| | PBO precursor | | | | | | | |
|---|---|---|---|---|---|---|---|---|
| | Dicarboxylic acid dichloride (1)-A | Ratio | Dicarboxylic acid dichloride (1)-B | Ratio | Dicarboxylic acid dichloride (2)-A | Ratio | Dicarboxylic acid dichloride (2)-B | Ratio |
| A-1 | 1,4-Cyclohexane- | 9 | — | 0 | Sebacoyl | 1 | — | 0 |
| A-2 | dicarboxylic acid | 8 | — | 0 | chloride | 2 | — | 0 |
| A-3 | dichloride | 7 | — | 0 | | 3 | — | 0 |
| A-4 | (cis/trans mixture) | 5 | — | 0 | | 5 | — | 0 |
| A-5 | | 3 | — | 0 | | 7 | — | 0 |
| A-6 | trans-1,4-cyclohexane- | 9 | — | 0 | | 1 | — | 0 |
| A-7 | dicarboxylic | 8 | — | 0 | | 2 | — | 0 |
| A-8 | acid dichloride | 7 | — | 0 | | 3 | — | 0 |
| A-9 | | 5 | — | 0 | | 5 | — | 0 |
| A-10 | | 3 | — | 0 | | 7 | — | 0 |
| A-11 | 1,3-Cyclohexane- | 9 | — | 0 | | 1 | — | 0 |
| A-12 | dicarboxylic acid | 8 | — | 0 | | 2 | — | 0 |
| A-13 | dichloride | 7 | — | 0 | | 3 | — | 0 |
| A-14 | (cis/trans mixture) | 5 | — | 0 | | 5 | — | 0 |
| A-15 | | 3 | — | 0 | | 7 | — | 0 |
| A-16 | cis-1,3-cyclohexane- | 9 | — | 0 | | 1 | — | 0 |
| A-17 | dicarboxylic acid | 8 | — | 0 | | 2 | — | 0 |
| A-18 | dichloride | 7 | — | 0 | | 3 | — | 0 |
| A-19 | | 5 | — | 0 | | 5 | — | 0 |
| A-20 | | 3 | — | 0 | | 7 | — | 0 |
| A-21 | 1,3-Adamantane | 9 | — | 0 | | 1 | — | 0 |
| A-22 | dicarboxylic acid | 8 | — | 0 | | 2 | — | 0 |
| A-23 | dichloride | 7 | — | 0 | | 3 | — | 0 |
| A-24 | | 5 | — | 0 | | 5 | — | 0 |
| A-25 | | 3 | — | 0 | | 7 | — | 0 |
| A-26 | 1,4-Cyclohexane- | 9 | — | 0 | Adipoyl | 1 | — | 0 |
| A-27 | dicarboxylic acid | 8 | — | 0 | chloride | 2 | — | 0 |
| A-28 | dichloride | 7 | — | 0 | | 3 | — | 0 |
| A-29 | (cis/trans mixture) | 5 | — | 0 | | 5 | — | 0 |
| A-30 | | 3 | — | 0 | | 7 | — | 0 |

| | Dicarboxylic acid dichloride (3)-A | Ratio | Diamine | Terminal sealing agent | Vinyl ether | Protection rate | Mw (×10,000) |
|---|---|---|---|---|---|---|---|
| A-1 | — | 0 | Bis-AP-AF | Butyryl chloride | 2,3-Dihydrofuran | 30% | 2.9 |
| A-2 | — | 0 | | | | 30% | 3.1 |
| A-3 | — | 0 | | | | 30% | 3.0 |
| A-4 | — | 0 | | | | 30% | 3.2 |
| A-5 | — | 0 | | | | 30% | 3.1 |
| A-6 | — | 0 | | | | 30% | 2.8 |
| A-7 | — | 0 | | | | 30% | 2.9 |
| A-8 | — | 0 | | | | 30% | 2.7 |
| A-9 | — | 0 | | | | 30% | 3.1 |
| A-10 | — | 0 | | | | 30% | 3.0 |
| A-11 | — | 0 | | | | 30% | 2.7 |
| A-12 | — | 0 | | | | 30% | 2.9 |
| A-13 | — | 0 | | | | 30% | 3.0 |
| A-14 | — | 0 | | | | 30% | 2.8 |
| A-15 | — | 0 | | | | 30% | 3.3 |
| A-16 | — | 0 | | | | 30% | 3.0 |
| A-17 | — | 0 | | | | 30% | 3.2 |
| A-18 | — | 0 | | | | 30% | 3.1 |
| A-19 | — | 0 | | | | 30% | 2.8 |
| A-20 | — | 0 | | | | 30% | 2.7 |
| A-21 | — | 0 | | | | 30% | 2.7 |
| A-22 | — | 0 | | | | 30% | 3.1 |
| A-23 | — | 0 | | | | 30% | 2.8 |
| A-24 | — | 0 | | | | 30% | 3.3 |
| A-25 | — | 0 | | | | 30% | 3.1 |
| A-26 | — | 0 | | | | 30% | 3.6 |
| A-27 | — | 0 | | | | 30% | 3.4 |

TABLE 1-continued

| | | PBO precursor | | |
|---|---|---|---|---|
| A-28 | — | 0 | 30% | 3.3 |
| A-29 | — | 0 | 30% | 3.1 |
| A-30 | — | 0 | 30% | 3.2 |

TABLE 2

| | PBO precursor | | | | | | |
|---|---|---|---|---|---|---|---|
| | Dicarboxylic acid dichloride (1)-A | Ratio | Dicarboxylic acid dichloride (1)-B | Ratio | Dicarboxylic acid dichloride (2)-A | Ratio | Dicarboxylic acid dichloride (2)-B | Ratio |
| A-31 | 1,4-Cyclohexane-dicarboxylic acid dichloride (cis/trans mixture) | 9 | — | 0 | Dodecanedioic acid dichloride | 1 | — | 0 |
| A-32 | | 8 | — | 0 | | 2 | — | 0 |
| A-33 | | 7 | — | 0 | | 3 | — | 0 |
| A-34 | | 5 | — | 0 | | 5 | — | 0 |
| A-35 | | 3 | — | 0 | | 7 | — | 0 |
| A-36 | | 7 | — | 0 | Sebacoyl chloride | 3 | — | 0 |
| A-37 | | 7 | — | 0 | | 3 | — | 0 |
| A-38 | | 7 | — | 0 | | 3 | — | 0 |
| A-39 | | 7 | — | 0 | | 3 | — | 0 |
| A-40 | | 7 | — | 0 | | 3 | — | 0 |
| A-41 | | 7 | — | 0 | | 3 | — | 0 |
| A-42 | | 7 | — | 0 | | 3 | — | 0 |
| A-43 | | 7 | — | 0 | | 3 | — | 0 |
| A-44 | | 7 | — | 0 | | 3 | — | 0 |
| A-45 | | 7 | — | 0 | | 3 | — | 0 |
| A-46 | | 7 | — | 0 | | 3 | — | 0 |
| A-47 | | 7 | — | 0 | | 3 | — | 0 |
| A-48 | | 7 | — | 0 | | 3 | — | 0 |
| A-49 | | 7 | — | 0 | | 3 | — | 0 |
| A-50 | | 7 | — | 0 | | 3 | — | 0 |
| A-51 | | 7 | — | 0 | | 3 | — | 0 |
| A-52 | | 7 | — | 0 | | 3 | — | 0 |
| A-53 | | 7 | — | 0 | | 3 | — | 0 |
| A-54 | | 7 | — | 0 | | 3 | — | 0 |
| A-55 | | 7 | — | 0 | | 3 | — | 0 |
| A-56 | | 7 | — | 0 | | 3 | — | 0 |
| A-57 | | 7 | — | 0 | | 3 | — | 0 |
| A-58 | | 3.5 | 1,3-Cyclohexane-dicarboxylic acid dichloride (cis/trans mixture) | 3.5 | | 1.5 | Adipoyl chloride | 1.5 |
| A-59 | | 4.9 | — | 0 | | 2.1 | — | 0 |
| A-60 | | 4.9 | — | 0 | | 2.1 | — | 0 |
| A-61 | | 4.9 | — | 0 | | 2.1 | — | 0 |
| A-62 | | 7 | — | 0 | | 3 | — | 0 |

| | Dicarboxylic acid dichloride (3)-A | Ratio | Diamine | Terminal sealing agent | Vinyl ether | Protection rate | Mw (×10,000) |
|---|---|---|---|---|---|---|---|
| A-31 | — | 0 | Bis-AP-AF | Butyryl chloride | 2,3-Dihydrofuran | 30% | 3.2 |
| A-32 | — | 0 | | | | 30% | 3.3 |
| A-33 | — | 0 | | | | 30% | 3.5 |
| A-34 | — | 0 | | | | 30% | 3.1 |
| A-35 | — | 0 | | | | 30% | 2.9 |
| A-36 | — | 0 | AHS | | | 30% | 2.5 |
| A-37 | — | 0 | AHF | | | 30% | 2.7 |
| A-38 | — | 0 | HAB | | | 30% | 2.2 |
| A-39 | — | 0 | Bis-AP-AF | Acetyl chloride | | 30% | 3.1 |
| A-40 | — | 0 | | Propionic acid chloride | | 30% | 3.3 |
| A-41 | — | 0 | | 2-Ethylhexanoic acid chloride | | 30% | 2.9 |
| A-42 | — | 0 | | Cyclohexane carboxylic acid chloride | | 30% | 3.1 |
| A-43 | — | 0 | | Benzoyl chloride | | 30% | 3.0 |
| A-44 | — | 0 | | Naphthoyl chloride | | 30% | 3.0 |
| A-45 | — | 0 | | Acrylic acid chloride | | 30% | 2.8 |
| A-46 | — | 0 | | Nadic anhydride | | 30% | 3.2 |
| A-47 | — | 0 | | Maleic anhydride | | 30% | 3.3 |
| A-48 | — | 0 | | Phthalic anhydride | | 30% | 2.9 |
| A-49 | | 0 | | 4-Ethinyl phthalic anhydride | | 30% | 3.0 |

TABLE 2-continued

| | | | PBO precursor | | | |
|---|---|---|---|---|---|---|
| A-50 | — | 0 | Butyryl chloride | | 5% | 3.1 |
| A-51 | — | 0 | | | 10% | 3.0 |
| A-52 | — | 0 | | | 20% | 2.9 |
| A-53 | — | 0 | | | 40% | 3.1 |
| A-54 | — | 0 | | | 60% | 2.8 |
| A-55 | — | 0 | | | 80% | 2.9 |
| A-56 | — | 0 | | 3,4-Dihydro-2H-pyran | 30% | 3.1 |
| A-57 | — | 0 | | Ethyl vinyl ether | 30% | 3.1 |
| A-58 | — | 0 | | | 30% | 3.3 |
| A-59 | 4,4'-Oxybis(benzoyl chloride) | 3 | | | 30% | 3.1 |
| A-60 | Isophthalic acid dichloride | 3 | | | 30% | 3.2 |
| A-61 | Terephthalic acid dichloride | 3 | | | 30% | 2.9 |
| A-62 | — | 0 | | — | 0% | 3.1 |

TABLE 3

| | | | PBO precursor | | | | |
|---|---|---|---|---|---|---|---|
| | Dicarboxylic acid dichloride (1)-A | Ratio | Dicarboxylic acid dichloride (1)-B | Ratio | Dicarboxylic acid dichloride (2)-A | Ratio | Dicarboxylic acid dichloride (2)-B | Ratio |
| A-63 | 1,4-Cyclohexane-dicarboxylic acid dichloride (cis/trans mixture) | 7 | — | 0 | Sebacoyl chloride | 3 | — | 0 |
| A-64 | | 7 | — | 0 | | 3 | — | 0 |
| A-65 | | 9 | — | 0 | | 1 | — | 0 |
| A-66 | | 8 | — | 0 | | 2 | — | 0 |
| A-67 | | 6 | — | 0 | | 4 | — | 0 |
| A-68 | | 5 | — | 0 | | 5 | — | 0 |
| A-69 | | 3 | — | 0 | | 7 | — | 0 |
| A-70 | | 3 | — | 0 | | 7 | — | 0 |
| A-71 | | 3 | — | 0 | | 7 | — | 0 |
| A-72 | 1,3-Adamantane dicarboxylic acid dichloride | 9 | — | 0 | | 1 | — | 0 |
| A-73 | | 7 | — | 0 | | 3 | — | 0 |
| A-74 | | 5 | — | 0 | | 5 | — | 0 |
| A-75 | | 3 | — | 0 | | 7 | — | 0 |
| A-76 | | 4 | 1,4-Cyclohexane-dicarboxylic acid dichloride (cis/trans mixture) | 3 | Dodecanedioic acid dichloride | 2 | Adipoyl chloride | 1 |
| A-77 | | 4 | | 3 | | 2 | | 1 |
| A-78 | | 3 | | 4 | | 1 | | 2 |
| A-79 | | 3 | | 4 | | 1 | | 2 |
| A-80 | | 3 | | 4 | | 1 | | 2 |
| A-81 | | 3 | | 4 | Sebacoyl chloride | 1 | | 2 |
| A-82 | | 3 | | 4 | | 1 | | 2 |
| A-83 | | 3 | | 4 | | 1 | | 2 |
| A-84 | | 3 | | 4 | | 1 | | 2 |
| A-85 | | 3 | | 4 | | 1 | | 2 |
| A-86 | | 3 | | 4 | | 1 | | 2 |
| A-87 | | 3 | | 4 | | 1 | | 2 |

| | Dicarboxylic acid dichloride (3)-A | Ratio | Diamine | Terminal sealing agent | Vinyl ether | Protection rate | Mw ×10,000 | Dispersion degree Mw/Mn |
|---|---|---|---|---|---|---|---|---|
| A-63 | — | 0 | Bis-AP-AF | Acetyl chloride | 2,3-Dihydrofuran | 27% | 2.3 | 2.1 |
| A-64 | — | 0 | | | | 27% | 2.1 | 2 |
| A-65 | — | 0 | | | | 27% | 2 | 1.9 |
| A-66 | — | 0 | | | | 27% | 2.4 | 2.3 |
| A-67 | — | 0 | | | | 27% | 2.7 | 2.5 |
| A-68 | — | 0 | | | | 27% | 2.9 | 3 |
| A-69 | — | 0 | | | | 27% | 3 | 2.9 |
| A-70 | — | 0 | | | | 40% | 2.3 | 2.1 |
| A-71 | — | 0 | | | | 10% | 2.3 | 2.1 |
| A-72 | — | 0 | | | | 27% | 2.1 | 2.2 |
| A-73 | — | 0 | | | | 27% | 2.6 | 2.8 |
| A-74 | — | 0 | | | | 27% | 2.2 | 2.3 |
| A-75 | — | 0 | | | | 27% | 2.8 | 3 |
| A-76 | — | 0 | | | | 27% | 2.5 | 2.7 |
| A-77 | — | 0 | AHS | | | 27% | 2.2 | 2.3 |
| A-78 | — | 0 | AHF | | | 27% | 2.1 | 2 |
| A-79 | — | 0 | HAB | | | 27% | 2.8 | 3.1 |

TABLE 3-continued

| | | | PBO precursor | | | | |
|---|---|---|---|---|---|---|---|
| A-80 | — | 0 | AHF | | 40% | 2.1 | 2 |
| A-81 | — | 0 | AHF | | 10% | 2.1 | 2 |
| A-82 | — | 0 | Bis-AP-AF | Ethyl vinyl ether | 27% | 2.4 | 2.5 |
| A-83 | — | 0 | | | 40% | 2.4 | 2.5 |
| A-84 | — | 0 | | | 10% | 2.4 | 2.5 |
| A-85 | — | 0 | Acrylic acid chloride | | 27% | 2.2 | 2.3 |
| A-86 | — | 0 | Nadic anhydride | | 40% | 2.9 | 3.1 |
| A-87 | — | 0 | Maleic anhydride | | 10% | 2.9 | 3.1 |

TABLE 4

| | PBO precursor | | | | | | | |
|---|---|---|---|---|---|---|---|---|
| | Dicarboxylic acid dichloride (1)-A | Ratio | Dicarboxylic acid dichloride (1)-B | Ratio | Dicarboxylic acid dichloride (2)-A | Ratio | Dicarboxylic acid dichloride (2)-B | Ratio |
| R-1 | 1,4-Cyclohexane-dicarboxylic acid dichloride (cis/trans mixture) | 10 | — | 0 | — | 0 | — | 0 |
| R-2 | | 9.5 | — | 0 | Sebacoyl chloride | 0.5 | — | 0 |
| R-3 | | 2 | — | 0 | | 8 | — | 0 |
| R-4 | — | 0 | — | 0 | | 10 | — | 0 |
| R-5 | 1,4-Cyclohexane-dicarboxylic acid dichloride (cis/trans mixture) | 7 | — | 0 | Succinyl chloride | 3 | — | 0 |
| R-6 | — | 0 | — | 0 | — | 0 | — | 0 |
| R-7 | — | 0 | — | 0 | Sebacoyl chloride | 5 | — | 0 |
| R-8 | 1,4-Cyclohexane-dicarboxylic acid dichloride (cis/trans mixture) | 5 | — | 0 | — | 0 | — | 0 |
| R-9 | | 4.2 | — | 0 | Sebacoyl chloride | 1.8 | — | 0 |

| | Dicarboxylic acid dichloride (3)-A | Ratio | Diamine | Terminal sealing agent | Vinyl ether | Protection rate | Mw (×10,000) |
|---|---|---|---|---|---|---|---|
| R-1 | — | 0 | Bis-AP-AF | Butyryl chloride | 2,3-Dihydrofuran | 30% | 2.7 |
| R-2 | — | 0 | | | | 30% | 2.9 |
| R-3 | — | 0 | | | | 30% | 3.3 |
| R-4 | — | 0 | | | | 30% | 3.2 |
| R-5 | — | 0 | | | | 30% | 3.0 |
| R-6 | 4,4'-Oxybis(benzoyl chloride) | 10 | | | | 30% | 2.8 |
| R-7 | | 5 | | | | 30% | 3.1 |
| R-8 | | 5 | | | | 30% | 2.9 |
| R-9 | | 4 | | | | 30% | 3.1 |

In the tables, Bis-AP-AF, AHS, AHF, and HAB are compounds having the following structures.

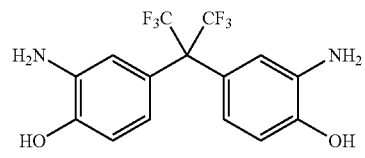

Bis-AP-AF

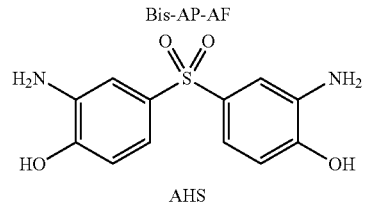

AHS

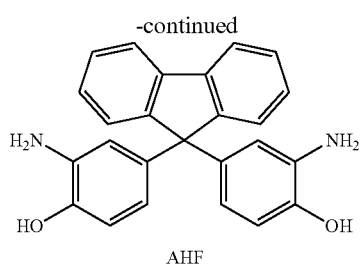

AHF

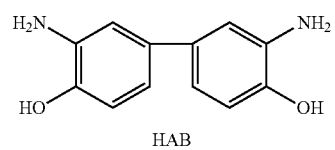

HAB

<Preparation of Photosensitive Resin Composition>

Examples 1 to 60, 63 to 66, 68, and 69 and Comparative Examples 1 to 9

100 parts by mass of each polybenzoxazole precursor shown in the following table, 3 parts by mass of each photoacid generator, 3 parts by mass of the adhesion enhancer shown in the following table, 0.2 parts by mass of the surfactant shown in the following table, and 400 parts by mass of each solvent were mixed and the mixture was filtered using a polytetrafluoro ethylene filter having a pore size of 0.2 μm so as to obtain each photosensitive resin composition. The numerical values without unit in the table are in the unit of parts by mass.

In Examples 1 to 60 and 63 to 66, N-methyl-2-pyrrolidone (NMP) was used as a solvent. In Example 68, γ-butyrolactone (GBL) was used as a solvent. In Example 69, diethylene glycol ethyl methyl ether (MEDG) was used as a solvent.

Examples 61 and 62

100 parts by mass of the polybenzoxazole precursor shown in the following table, 3 parts by mass of each photoacid generator, 1 part by mass of the sensitizer shown in the following table, 3 parts by mass of the adhesion enhancer shown in the following table, 0.2 parts by mass of the surfactant shown in the following table, and 400 parts by mass of N-methyl-2-pyrrolidone (NMP) as a solvent were mixed and the mixture was filtered using a polytetrafluoro ethylene filter having a pore size of 0.2 μm so as to obtain each photosensitive resin composition. The numerical values without unit in the table are in the unit of parts by mass.

Example 67

100 parts by mass of the polybenzoxazole precursor shown in the following table, 25 parts by mass of the photoacid generator (B-7) shown in the following table, 3 parts by mass of the adhesion enhancer shown in the following table, 0.2 parts by mass of the surfactant shown in the following table, and 400 parts by mass of N-methyl-2-pyrrolidone (NMP) as a solvent were mixed and the mixture was filtered using a polytetrafluoro ethylene filter having a pore size of 0.2 μm so as to obtain a photosensitive resin composition. The numerical values without unit in the table are in the unit of parts by mass.

Examples 70 to 105

The polybenzoxazole precursors, photoacid generators, sensitizer, surfactants, other additives, and solvents shown in Table 5 below were mixed, stirred, and dissolved to obtain unit solutions. The solutions were filtered using a polyethylene filter having a pore size of 0.4 μm and further filtered using a polytetrafluoro ethylene filter having a pore size of 0.1 μm so as to obtain each photosensitive resin composition. In the polybenzoxazole precursor, the polybenzoxazole precursor solution obtained in each of the above synthesis examples was added such that the solid content became the amount (parts by mass) shown in table 5 below. In addition, the amount in the table is in terms of parts by mass.

TABLE 5

| | PBO precursor | | Photoacid generator | | Sensitizer | | Surfactant | | Other additives | | Solvent | |
|---|---|---|---|---|---|---|---|---|---|---|---|---|
| | Type | Amount (solid content) | Type | Amount (solid content) | Type | Amount (solid content) | Type | Amount (solid content) | Type | Amount (solid content) | Type | Amount |
| Example 70 | A-63 | 100 | B-1 | 3 | | | F-554 | 0.2 | | | MEDG | 70 |
| Example 71 | A-64 | 100 | B-1 | 3 | | | F-554 | 0.2 | | | MEDG | 70 |
| Example 72 | A-65 | 100 | B-1 | 3 | | | F-554 | 0.2 | | | MEDG | 70 |
| Example 73 | A-66 | 100 | B-1 | 3 | | | F-554 | 0.2 | | | MEDG | 70 |
| Example 74 | A-67 | 100 | B-1 | 3 | | | F-554 | 0.2 | | | MEDG | 70 |
| Example 75 | A-68 | 100 | B-1 | 3 | | | F-554 | 0.2 | | | MEDG | 70 |
| Example 76 | A-69 | 100 | B-1 | 3 | | | F-554 | 0.2 | | | MEDG | 70 |
| Example 77 | A-70 | 100 | B-1 | 3 | | | F-554 | 0.2 | | | MEDG | 70 |
| Example 78 | A-71 | 100 | B-1 | 3 | | | F-554 | 0.2 | | | MEDG | 70 |
| Example 79 | A-72 | 100 | B-1 | 3 | | | F-554 | 0.2 | | | MEDG | 70 |
| Example 80 | A-73 | 100 | B-1 | 3 | | | F-554 | 0.2 | | | MEDG | 70 |
| Example 81 | A-74 | 100 | B-1 | 3 | | | F-554 | 0.2 | | | MEDG | 70 |
| Example 82 | A-75 | 100 | B-1 | 3 | | | F-554 | 0.2 | | | MEDG | 70 |
| Example 83 | A-76 | 100 | B-1 | 3 | | | F-554 | 0.2 | | | MEDG | 70 |
| Example 84 | A-77 | 100 | B-1 | 3 | | | F-554 | 0.2 | | | MEDG | 70 |
| Example 85 | A-78 | 100 | B-1 | 3 | | | F-554 | 0.2 | | | MEDG | 70 |
| Example 86 | A-79 | 100 | B-1 | 3 | | | F-554 | 0.2 | | | MEDG | 70 |
| Example 87 | A-80 | 100 | B-1 | 3 | | | F-554 | 0.2 | | | MEDG | 70 |
| Example 88 | A-81 | 100 | B-1 | 3 | | | F-554 | 0.2 | | | MEDG | 70 |
| Example 89 | A-82 | 100 | B-1 | 3 | | | F-554 | 0.2 | | | MEDG | 70 |
| Example 90 | A-83 | 100 | B-1 | 3 | | | F-554 | 0.2 | | | MEDG | 70 |
| Example 91 | A-84 | 100 | B-1 | 3 | | | F-554 | 0.2 | | | MEDG | 70 |
| Example 92 | A-85 | 100 | B-1 | 3 | | | F-554 | 0.2 | | | MEDG | 70 |
| Example 93 | A-86 | 100 | B-1 | 3 | | | F-554 | 0.2 | | | MEDG | 70 |
| Example 94 | A-87 | 100 | B-1 | 3 | | | F-554 | 0.2 | | | MEDG | 70 |
| Example 95 | A-63 | 100 | B-1 | 5 | | | F-554 | 0.3 | KBM-403 | 10 | PGMEA | 175 |
| | | | | | | | | | Acryl polymer 1 | 7 | MEDG | 125 |
| Example 96 | A-4 | 34 | B-1 | 2 | | | FTX-218 | 0.3 | KBM-403 | 2 | NMP | 300 |
| | A-3 | 33 | B-2 | 1 | | | | | | | GBL | 100 |
| | A-52 | 33 | | | | | | | | | | |
| Example 97 | A-44 | 50 | B-1 | 2 | | | FTX-218 | 0.3 | KBM-303 | 3 | NMP | 200 |
| | A-45 | 50 | B-2 | 1 | | | | | | | GBL | 300 |
| Example 98 | A-52 | 34 | B-5 | 3 | DBA | 3 | FTX-218 | 0.1 | KBE-403 | 4 | NMP | 300 |
| | A-53 | 33 | | | | | | | | | GBL | 100 |
| | A-55 | 33 | | | | | | | | | | |

TABLE 5-continued

| | PBO precursor | | Photoacid generator | | Sensitizer | | Surfactant | | Other additives | | Solvent | |
|---|---|---|---|---|---|---|---|---|---|---|---|---|
| | Type | Amount (solid content) | Type | Amount (solid content) | Type | Amount (solid content) | Type | Amount (solid content) | Type | Amount (solid content) | Type | Amount |
| Example 99 | A-3 | 50 | B-6 | 3 | DBA | 3 | FTX-218 | 0.2 | KBM-403 | 3 | NMP | 100 |
| | A-4 | 50 | | | | | F-554 | 0.1 | | | GBL | 300 |
| Example 100 | A-12 | 50 | B-1 | 1 | | | FTX-218 | 0.3 | KBM-403 | 3 | NMP | 100 |
| | A-24 | 50 | B-2 | 1 | | | | | | | GBL | 300 |
| Example 101 | A-63 | 40 | B-1 | 2 | DBA | 4 | FTX-218 | 0.2 | KBM-403 | 3 | PGMEA | 40 |
| | A-66 | 35 | B-5 | 2 | | | F-554 | 0.2 | EX-321L | 4 | MEDG | 100 |
| | A-67 | 25 | B-6 | 2 | | | | | | | NMP | 20 |
| Example 102 | A-63 | 40 | B-1 | 2 | | | FTX-218 | 0.3 | KBM-403 | 3 | PGMEA | 80 |
| | A-77 | 35 | B-3 | 2 | | | | | MX-270 | 3 | MEDG | 80 |
| | A-86 | 25 | | | | | | | JER157 | 3 | GBL | 20 |
| | | | | | | | | | PEP-36 | 2 | | |
| Example 103 | A-72 | 34 | B-1 | 5 | | | F-554 | 0.3 | KBM-403 | 3 | PGMEA | 100 |
| | A-73 | 33 | | | | | | | 17B-60P | 3 | MEDG | 100 |
| | A-74 | 33 | | | | | | | AO-60 | 1 | | |
| | | | | | | | | | 1035 | 1 | | |
| Example 104 | A-64 | 20 | B-1 | 2 | | | F-554 | 0.3 | DPHA | 12 | PGMEA | 160 |
| | A-86 | 80 | B-2 | 2 | | | | | | | | |
| Example 105 | A-63 | 40 | B-1 | 2 | DBA | 4 | FTX-218 | 0.2 | KBM-403 | 8 | PGMEA | 10 |
| | A-66 | 35 | B-5 | 2 | | | F-554 | 0.2 | MX-270 | 3 | MEDG | 15 |
| | A-67 | 25 | B-6 | 2 | | | | | JER157 | 3 | NMP | 20 |
| | | | | | | | | | Trimellitic acid | 1 | | |
| | | | | | | | | | Acryl polymer 1 | 4 | | |
| | | | | | | | | | PEP-36 | 2 | | |
| | | | | | | | | | AO-60 | 1 | | |

<Solubility in Solvent>

γ-Butyrolactone (50.0 g) was put into a 100 mL beaker and stirred with a stirring bar. The polybenzoxazole precursor (0.50 g) was added thereto and the dissolving behavior was visually observed. The more rapid the dissolution, the more preferable it is. A, B, and C are a practical ranges.

A: The precursor was dissolved at 25° C. within 10 minutes.

B: The precursor was dissolved at 25° C. for a time longer than 10 minutes and within 1 hour.

C: The precursor was not completely dissolved at 25° C. in 1 hour but dissolved at 50° C. in 1 hour.

D: There were a slight amount of insolubles even at 50° C. in 1 hour.

E: White turbidity occurred or the precursor was hardly dissolved even at 50° C. in 1 hour.

<Light Resistance>

Each photosensitive resin composition was applied to a glass substrate (CORNING 1737, 0.7 mm thickness (manufactured by Corning Inc.)) by slit coating and then pre-baked on a hot plate at 100° C. for 90 seconds to volatilize a solvent. Thus, a photosensitive resin composition layer having a film thickness of 3.0 μm was formed. Next, the substrate was heated in an oven at 300° C. in a nitrogen atmosphere for 60 minutes and thus a cured film was obtained. The film thickness of the obtained cured film was measured and then in an environment of a temperature of 30° C. and a humidity of 50%, the substrate was irradiated with a xenon arc lamp of 180 W/m² for 70 hours. The film thickness before the irradiation was compared with the film thickness after the irradiation and the reduction proportion was expressed in percentage. The smaller the numerical value is, the better the light resistance of the cured film is. A, B, and C are practical ranges.

Film thickness reduction ratio (%)=100−(film thickness after irradiation (μm)/film thickness before irradiation (μm)×100)

A: The film thickness reduction ratio was less than 3%.

B: The film thickness reduction ratio was 3% or more and less than 5%.

C: The film thickness reduction ratio was 5% or more and less than 7%.

D: The film thickness reduction ratio was 7% or more and less than 9%.

E: The film thickness reduction ratio was 9% or more.

<Chemical Resistance>

Each photosensitive resin composition was applied to a glass substrate (CORNING 1737, 0.7 mm thickness (manufactured by Corning Inc.)) by slit coating and then pre-baked on a hot plate at 100° C. for 90 seconds to volatilize a solvent. Thus, a photosensitive resin composition layer having a film thickness of 3.0 μm was formed. Next, the substrate was heated in an oven at 300° C. in a nitrogen atmosphere for 60 minutes and thus a cured film was obtained. The film thickness of the obtained cured film was measured and the film was then immersed in N-methyl-2-pyrrolidone at room temperature for 15 minutes. The film was taken out and the liquid on the surface was removed. Immediately after the removal of the liquid, the thickness of the film was measured. The film thickness before the immersion was compared with the film thickness after the immersion. The increase ratio was expressed in percentage. Except in the case in which the cured film dissolves, the smaller the numerical value is, the better the NMP resistance of the cured film is. A, B, and C are practical ranges.

Swelling ratio (%)=film thickness after immersion (μm)/film thickness before immersion (μm)×100

A: The swelling ratio was 100% or more and less than 103%.

B: The swelling ratio was 103% or more and less than 106%.

C: The swelling ratio was 106% or more and less than 109%.

D: The swelling ratio was 109% or more and less than 112%.

E: The swelling ratio was 112% or more or the swelling ratio was less than 100%.

<Sensitivity>

Each photosensitive resin composition was applied to a glass substrate (1,100×1,300 mm size, 0.7 mm thickness, manufactured by Corning Inc.) which had been subjected to a surface treatment in the vapor of hexamethyldisilazane for 1 minute by slit coating with SK-N1300G (manufactured by Dainippon Screen MGF Co., Ltd.), and pre-baked on a hot plate at 100° C. for 90 seconds under a reduced pressure of 0.266 kPa (2.0 Torr) to volatilize a solvent. Thus, a photosensitive resin composition layer having a film thickness of 3.0 μm was formed. Next, the obtained photosensitive resin composition layer was exposed to a 5.0 μm hole pattern using a MPAsp-H760 exposure machine, manufactured by Canon Inc. The composition was heated on a hot plate at 80° C. for 90 seconds, then developed with an alkali developer (an aqueous 0.6% by mass tetramethyl ammonium hydroxide solution) (at 25° C. for 70 seconds), and rinsed with ultra pure water for 30 seconds. Thus, the exposure dose for forming a hole pattern having a bottom diameter of 5.0 μm was determined as sensitivity. The smaller the required exposure dose is (the higher the sensitivity is), the more preferable it is. A, B, and C are practical ranges.

A: The required exposure dose was less than 100 mJ/cm$^2$.

B: The required exposure dose was 100 mJ/cm$^2$ or more and less than 150 mJ/cm$^2$.

C: The required exposure dose was 150 mJ/cm$^2$ or more and less than 200 mJ/cm$^2$.

D: The required exposure dose was 200 mJ/cm$^2$ or more and less than 250 mJ/cm$^2$.

E: The required exposure dose was 250 mJ/cm$^2$ or more.

<Light Transmittance>

A glass substrate (OA-10 (manufactured by Nippon Electric Glass Company, Limited)) was exposed to the vapor of hexamethyldisilazane (HMDS) for 30 seconds, and each photosensitive resin composition was applied to the substrate by slit coating. Then, a solvent was volatilized by vacuum dry and the composition was pre-baked on a hot plate at 120° C. for 120 seconds to from a photosensitive resin composition layer having a film thickness of 2.0 μm. Subsequently, the composition layer was exposed using an ultra-high pressure mercury lamp so as to have a cumulative irradiation dose of 300 mJ/cm$^2$ (energy intensity: 20 mW/cm$^2$), and the substrate was heated in an oven at 300° C. for 60 minutes in a nitrogen atmosphere to obtain a cured film. The light transmittance of the obtained cured film was measured using a spectrophotometer (U-3000, manufactured by Hitachi, Ltd.) at a wavelength of 400 nm. The unit was %. A, B, and C are practical levels.

A: The light transmittance was 90% or more.

B: The light transmittance was 85% or more and less than 90%.

C: The light transmittance was 80% or more and less than 85%.

D: The light transmittance was 75% or more and less than 80%.

E: The light transmittance was less than 75%.

TABLE 6

| | | | | | | | Performance | | | | |
|---|---|---|---|---|---|---|---|---|---|---|---|
| | PBO precursor | Photoacid generator | Sensitizer | Adhesion enhancer | Surfactant | Solvent | Solubility in solvent | Light resistance | Chemical resistance | Sensitivity | Light transmittance |
| Example 1 | A-1 | B-1 | — | KBM-403 | F-554 | NMP | B | A | A | B | A |
| 2 | A-2 | | — | | | | B | A | A | A | A |
| 3 | A-3 | | — | | | | A | A | A | A | A |
| 4 | A-4 | | — | | | | A | A | A | A | A |
| 5 | A-5 | | — | | | | A | A | B | A | A |
| 6 | A-6 | | — | | | | C | A | A | B | A |
| 7 | A-7 | | — | | | | B | A | A | A | A |
| 8 | A-8 | | — | | | | A | A | A | A | A |
| 9 | A-9 | | — | | | | A | A | A | A | A |
| 10 | A-10 | | — | | | | A | A | B | A | A |
| 11 | A-11 | | — | | | | B | A | A | B | A |
| 12 | A-12 | | — | | | | A | A | A | A | A |
| 13 | A-13 | | — | | | | A | A | A | A | A |
| 14 | A-14 | | — | | | | A | A | B | A | A |
| 15 | A-15 | | — | | | | A | A | B | A | A |
| 16 | A-16 | | — | | | | B | A | A | B | A |
| 17 | A-17 | | — | | | | B | A | A | A | A |
| 18 | A-18 | | — | | | | A | A | A | A | A |
| 19 | A-19 | | — | | | | A | A | B | A | A |
| 20 | A-20 | | — | | | | A | A | B | A | A |
| 21 | A-21 | | — | | | | B | A | A | B | A |
| 22 | A-22 | | — | | | | B | A | A | A | A |
| 23 | A-23 | | — | | | | B | A | A | A | A |
| 24 | A-24 | | — | | | | A | A | A | A | A |
| 25 | A-25 | | — | | | | A | A | B | A | A |
| 26 | A-26 | | — | | | | B | A | A | B | A |
| 27 | A-27 | | — | | | | B | A | A | B | A |
| 28 | A-28 | | — | | | | A | A | A | A | A |
| 29 | A-29 | | — | | | | A | A | A | A | A |
| 30 | A-30 | | — | | | | A | A | B | A | A |
| 31 | A-31 | | — | | | | B | A | A | B | A |
| 32 | A-32 | | — | | | | A | A | A | B | A |
| 33 | A-33 | | — | | | | A | A | A | A | A |
| 34 | A-34 | | — | | | | A | A | B | A | A |
| 35 | A-35 | | — | | | | A | A | C | A | A |
| 36 | A-36 | | — | | | | B | A | A | B | A |

TABLE 6-continued

| | PBO precursor | Photoacid generator | Sensitizer | Adhesion enhancer | Surfactant | Solvent | Solubility in solvent | Light resistance | Chemical resistance | Sensitivity | Light transmittance |
|---|---|---|---|---|---|---|---|---|---|---|---|
| 37 | A-37 | | — | | | | B | A | A | B | A |
| 38 | A-38 | | — | | | | C | A | A | B | A |
| 39 | A-39 | | — | | | | B | A | A | B | A |
| 40 | A-40 | | — | | | | A | A | A | A | A |
| 41 | A-41 | | — | | | | A | A | A | A | A |
| 42 | A-42 | | — | | | | A | A | A | A | A |
| 43 | A-43 | | — | | | | A | A | A | A | A |
| 44 | A-44 | | — | | | | A | A | A | A | A |
| 45 | A-45 | | — | | | | A | A | A | A | A |
| 46 | A-46 | | — | | | | A | A | A | A | C |
| 47 | A-47 | | — | | | | A | A | A | A | C |
| 48 | A-48 | | — | | | | A | A | A | A | C |
| 49 | A-49 | | — | | | | A | A | A | A | C |
| 50 | A-50 | | — | | | | A | A | A | C | A |
| 51 | A-51 | | — | | | | A | A | A | B | A |
| 52 | A-52 | | — | | | | A | A | A | A | A |
| 53 | A-53 | | — | | | | A | A | A | A | A |
| 54 | A-54 | | — | | | | A | A | A | B | B |
| 55 | A-55 | | — | | | | A | A | A | C | B |
| 56 | A-56 | | — | | | | A | A | A | A | A |
| 57 | A-57 | | — | | | | A | A | A | A | A |
| 58 | A-3 | B-2 | — | | | | A | A | A | A | A |
| 59 | A-3 | B-3 | — | | | | A | A | A | A | A |
| 60 | A-3 | B-4 | — | | | | A | A | A | A | A |
| 61 | A-3 | B-5 | DBA | | | | A | A | A | A | A |
| 62 | A-3 | B-6 | DBA | | | | A | A | A | A | A |
| 63 | A-58 | B-1 | — | | | | A | A | A | A | A |
| 64 | A-59 | | | | | | A | C | A | A | A |
| 65 | A-60 | | — | | | | A | B | A | A | A |
| 66 | A-61 | | — | | | | B | B | A | A | A |
| 67 | A-62 | B-7 | — | | | | A | A | A | C | C |
| 68 | A-3 | B-1 | — | | | GBL | A | A | A | A | A |
| 69 | A-3 | B-1 | — | | | MEDG | A | A | A | A | A |

TABLE 7

| | Solubility in solvent | Light resistance | Chemical resistance | Sensitivity | Light transmittance |
|---|---|---|---|---|---|
| Example 70 | B | A | A | B | A |
| Example 71 | B | A | A | B | A |
| Example 72 | B | A | A | B | A |
| Example 73 | B | A | A | B | A |
| Example 74 | B | A | B | A | A |
| Example 75 | B | A | B | A | A |
| Example 76 | A | A | C | A | A |
| Example 77 | A | A | C | C | B |
| Example 78 | B | A | C | A | A |
| Example 79 | C | A | A | B | A |
| Example 80 | C | A | A | A | A |
| Example 81 | B | A | B | A | A |
| Example 82 | A | A | C | A | A |
| Example 83 | B | A | A | B | A |
| Example 84 | C | A | A | B | B |
| Example 85 | C | A | A | B | B |
| Example 86 | C | A | A | B | B |
| Example 87 | C | A | A | B | B |
| Example 88 | C | A | A | B | B |
| Example 89 | B | A | B | A | B |
| Example 90 | B | A | B | B | C |
| Example 91 | B | A | B | A | A |
| Example 92 | B | A | B | B | C |
| Example 93 | B | A | B | B | C |
| Example 94 | B | A | B | A | B |
| Example 95 | B | A | A | B | A |
| Example 96 | B | A | A | B | A |
| Example 97 | A | A | A | A | A |
| Example 98 | A | A | A | B | B |
| Example 99 | B | A | A | C | A |
| Example 100 | B | A | A | B | A |
| Example 101 | B | A | B | A | A |
| Example 102 | B | A | B | B | A |
| Example 103 | B | A | B | A | A |
| Example 104 | B | A | B | A | A |
| Example 105 | B | A | B | A | A |

TABLE 8

| | Photo | | | | | | Performance | | | | |
|---|---|---|---|---|---|---|---|---|---|---|---|
| | PBO precursor | acid generator | Sensitizer | Adhesion enhancer | Surfactant | Solvent | Solubility in solvent | Light resistance | Chemical resistance | Sensitivity | Light transmittance |
| Comparative example 1 | R-1 | B-1 | — | KBM-403 | F-554 | NMP | E | A | A | B | A |
| 2 | R-2 | | — | | | | E | A | A | B | A |
| 3 | R-3 | | — | | | | A | A | E | A | A |
| 4 | R-4 | | — | | | | A | A | E | A | A |
| 5 | R-5 | | — | | | | E | A | A | A | A |
| 6 | R-6 | | — | | | | A | E | A | A | A |
| 7 | R-7 | | — | | | | A | E | A | A | A |
| 8 | R-8 | | — | | | | B | E | A | A | A |
| 9 | R-9 | | — | | | | A | E | A | A | A |

From the above results, in the photosensitive resin compositions of Examples exhibited, the solubility in a solvent, light resistance, and chemical resistance were good and all performance satisfied the practical levels.

On the other hand, in the photosensitive resin compositions of Comparative Examples, at least one of solubility in a solvent, light resistance, or chemical resistance satisfied the practical level.

The details of abbreviations for representing each compound used in Examples and Comparative Examples are as follows.

(Photoacid Generator)

B-1: Structure shown below (PAG-103, manufactured by BASF SE)

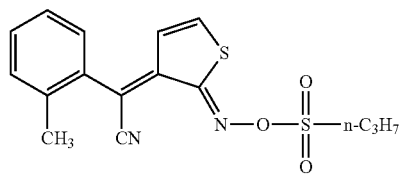

B-2: Structure shown below (PAI-101, manufactured by Midori Kagaku Co., Ltd.), where Me represents a methyl group.

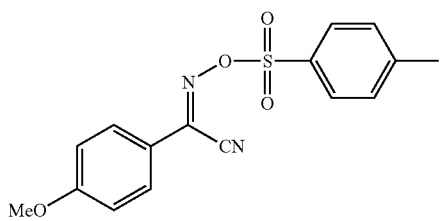 [SMILES: COc1ccc(/C(C#N)=N/OS(=O)(=O)c2ccc(C)cc2)cc1]

B-3: Structure shown below (the synthesis example will be described later)

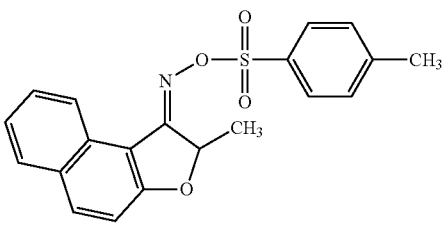 [SMILES: Cc1ccc(S(=O)(=O)O/N=C2/c3c(ccc4ccccc34)OC2C)cc1]

B-4: Structure shown below (the synthesis example will be described later), where Ts represents a tosyl group.

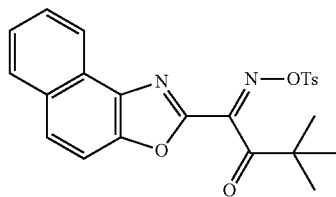 [SMILES: Cc1ccc(S(=O)(=O)O/N=C(\C(=O)C(C)(C)C)c2nc3c(ccc4ccccc43)o2)cc1]

B-5: Structure shown below (the synthesis example will be described later)

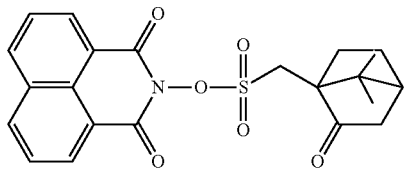 [SMILES: CC1(C)C2CCC1(CS(=O)(=O)ON1C(=O)c3cccc4cccc(c34)C1=O)C(=O)C2]

B-6: Structure shown below (GSID-26-1, triarylsulfonium salt (manufactured by BASF SE))

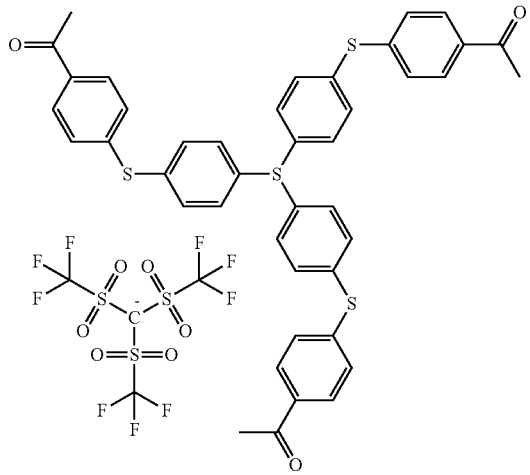

B-7: TAS-200 (naphthoquinone diazide, manufactured by Toyo Gosei Co., Ltd.) (Sensitizer)

DBA: 9,10-dibutoxyanthracene (manufactured by KAWASAKI KASEI CHEMICALS LTD.)

(Surfactant)

F-554: Perfluoroalkyl group-containing nonionic surfactant represented by the structure shown below (F-554, manufactured by DIC Corporation)

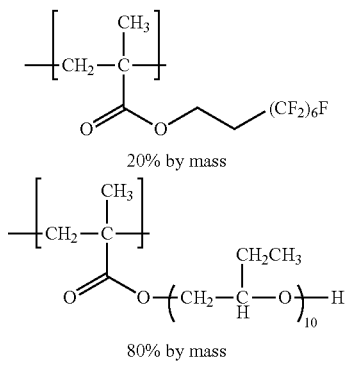

(Adhesion Enhancer)

KBM-403: 3-glycidoxypropyl trimethoxysilane (KBM-403, manufactured by Shin-Etsu Chemical Co., Ltd.)

KBM-303: 2-(3,4-Epoxycyclohexyl)ethyl trimethoxysilane (KBM-303, manufactured by Shin-Etsu Chemical Co., Ltd.)

KBE-403: 3-Glycidoxypropyl triethoxysilane (KBE-403, manufactured by Shin-Etsu Chemical Co., Ltd.)

(Solvent)

NMP: N-methyl-2-pyrrolidone

GBL: γ-butyrolactone

MEDG: Diethylene glycol ethyl methyl ether

PGMEA: Propylene glycol monomethyl ether acetate (Other Additives)

EX-321L: Epoxy crosslinking agent (DENACOL EX-321L, manufactured by Nagase ChemteX Corporation)

Mx-270: Alkoxy methyl group-containing crosslinking agent (NICALACK Mx-270, manufactured by Sanwa Chemical Co., Ltd.)

DPHA: Dipentaerythritol hexaacrylate (KAYARAD DPHA, manufactured by Nippon Kayaku Co., Ltd.)

Trimellitic acid: Trimellitic acid (manufactured by Tokyo Chemical Industry Co., Ltd.)

Acrylic polymer 1: Copolymer of methacrylic acid/glycidyl methacrylate/dicyclopentenyl methacrylate/styrene=35:40:15:10 (molar ratio) (Mw: 12000)

AO-60: ADK STAB AO-60 (manufactured by Adeka Corporation)

PEP-36: ADK STA PEP-36 (manufactured by Adeka Corporation)

1035: IRGANOX 1035 (manufactured by BASF SE)

«Synthesis of B-3»

Aluminum chloride (10.6 g) and 2-chloropropionyl chloride (10.1 g) were added to a suspension solution of 2-naphthol (10 g) and chlorobenzene (30 mL), and the mixed solution was heated to 40° C. for 2 hours to conduct reaction. An aqueous 4NHCl solution (60 mL) was added dropwise to the reaction solution under ice cooling and ethyl acetate (50 mL) was added thereto for liquid separation. Potassium carbonate (19.2 g) was added to the organic layer to conduct reaction at 40° C. for 1 hour. Then, an aqueous 2NHCl solution (60 mL) was added for liquid separation. The organic layer was concentrated, then the crystals were reslurried with diisopropyl ether (10 mL), and filtered and dried to obtain a ketone compound (6.5 g).

To a suspension of the obtained ketone compound (3.0 g) and methanol (30 mL), acetic acid (7.3 g) and an aqueous 50% by mass hydroxylamine solution (8.0 g) were added, followed by heating and refluxing. The mixture was allowed to cool and then separated by adding water (50 mL), and the precipitated crystals were filtered, washed with cold methanol, and dried to obtain an oxime compound (2.4 g).

The obtained oxime compound (1.8 g) was dissolved in acetone (20 mL), triethylamine (1.5 g) and p-toluenesulfonyl chloride (2.4 g) were added under ice cooling, and the temperature was raised to room temperature to conduct reaction for 1 hour. Water (50 mL) was added to the reaction solution, the precipitated crystals were filtered. The filtrate was reslurried with methanol (20 mL), and filtered and dried to obtain a B-3 compound (the above-described structure) (2.3 g).

The $^1$H-NMR spectrum (300 MHz, CDCl$_3$) of B-3 was δ 8=8.3 (d, 1H), 8.0 (d, 2H), 7.9 (d, 1H), 7.8 (d, 1H), 7.6 (dd, 1H), 7.4 (dd, 1H), 7.3 (d, 2H), 7.1 (d, 1H), 5.6 (q, 1H), 2.4 (s, 3H), 1.7 (d, 3H).

«Synthesis of B-4»

To a suspension of 4.0 g of 1-amino-2-naphthol hydrochloride (manufactured by Tokyo Chemical Industry Co., Ltd.) in 16 g of N-methylpyrrolidone (manufactured by Wako Pure Chemical Industries, Ltd.), 3.4 g of sodium bicarbonate (manufactured by Wako Pure Chemical Industries, Ltd.) was added, and then 4.9 g of methyl 4,4-dimethyl-3-oxovalerate (manufactured by Wako Pure Chemical Industries, Ltd.) was added dropwise, and the mixture was heated at 120° C. in a nitrogen atmosphere for 2 hours. The reaction mixed solution was allowed to cool, and then separated into water and ethyl acetate, and the organic phase was dried over magnesium sulfate, filtered, and concentrated to obtain a crude B-1-2A. The crude B-1-2A was purified by column chromatography on silica gel to obtain 1.7 g of an intermediate B-1-2A.

To a mixture of B-1-2A (1.7 g) and p-xylene (6 mL), 0.23 g of p-toluenesulfonic acid monohydrate (manufactured by Wako Pure Chemical Industries, Ltd.) was added, and the mixture was heated at 140° C. for 2 hours. The reaction mixed solution was allowed to cool, and then separated into water and ethyl acetate, and the organic phase was dried over magnesium sulfate, and then filtered and concentrated to obtain a crude B-1-2B.

To a mixture of tetrahydrofuran (THF) (2 mL) and the entire amount of the crude B-1-2B, 6.0 mL of a 2 M hydrochloric acid/THF solution and then isopentyl nitrite (manufactured by Wako Pure Chemical Industries, Ltd.) (0.84 g) were added dropwise under ice cooling, the mixture was warmed to room temperature and then stirred for 2 hours. The obtained reaction mixture was separated into water and ethyl acetate by adding ethyl acetate, and the organic layer was washed with water, then dried over magnesium sulfate, filtered, and concentrated to obtain a crude intermediate B-1-2C.

To a mixture of the entire amount of the crude intermediate B-1-2C and acetone (10 mL), triethylamine (manufactured by Wako Pure Chemical Industries, Ltd.) (1.2 g) and p-toluenesulfonyl chloride (manufactured by Tokyo Chemical Industry Co., Ltd.) (1.4 g) were added dropwise under ice cooling, and then the mixture was warmed to room temperature and stirred for 1 hour. The obtained reaction mixed solution was separated into water and ethyl acetate, and the organic phase was dried over magnesium sulfate, and then filtered and concentrated to obtain a crude B-4. The crude B-4 was reslurried with cold methanol, and then filtered and dried to obtain B-4 (1.2 g).

The $^1$H-NMR spectrum of B-4 (300 MHz, CDCl$_3$) was δ=8.5-8.4 (m, 1H), 8.0-7.9 (m, 4H), 7.7-7.6 (m, 2H), 7.6-7.5 (m, 1H), 7.4 (d, 2H), 2.4 (s, 3H), 1.4 (s, 9H).

«Synthesis of B-5»

33.6 g of N-hydroxynaphthalimide sodium salt, 0.72 g of 4-dimethylamino pyridine, and 300 mL of tetrahydrofuran were put into a separatable flask equipped with a stirrer and a thermometer, and the materials were dissolved under stirring at room temperature of 25° C. Next, 42 g of (+) 10-camphorsulfonyl chloride was added thereto and the mixture was further stirred for 3 hours. Then, 15 g of triethylamine was added and then the mixture was stirred at room temperature for 10 hours. Next, the reaction solution was poured into 300 mL of distilled water and the precipitate was separated by filtration. The precipitate was subjected to a re-precipitation treatment several times using acetone and hexane to obtain a12 g of N-camphorsulfony oxime-1,8-naphthalimide.

<Production of Organic EL Display Device>

Example 201

The organic EL display device using a thin film transistor (TFT) was prepared in the following manner (refer to FIG. 3).

A bottom gate type TFT 1 was formed on a glass substrate 6, and an insulating film 3 made of Si$_3$N$_4$ was formed in a state in which the insulating film covered the TFT 1. Next, a contact hole (not shown) was formed in the insulating film 3 and then a wiring 2 (having a height of 1.0 μm) connected to the TFT 1 through the contact hole was formed on the insulating film 3. The wiring 2 was provided to connect the TFTs 1 or an organic EL element which was to be formed in the subsequent step, and the TFT 1.

Further, in order to flatten roughness resulting from the formation of the wiring 2, a flattened film 4 was formed on the insulating film 3 in a state in which roughness resulting from the wiring 2 was embedded. The formation of the flattened film 4 on the insulating film 3 was carried out by applying the photosensitive resin composition of Example 3 to the substrate by spin coating, pre-baking the composition on a hot plate (at 90° C. for 120 seconds), then irradiating the composition with i-line (365 nm) from a mask using a high pressure mercury lamp at 45 mJ/cm$^2$ (energy intensity: 20 mW/cm$^2$), heating the composition on the hot plate at 90° C. at 90° C. for 120 seconds, developing the composition with an alkali aqueous solution (0.4% TMAH solution) to form a pattern, and irradiating the entire surface using an ultra-high pressure mercury lamp so as to have a cumulative irradiation dose of 300 mJ/cm$^2$(energy intensity: 20 mW/cm$^2$, i-line) and heating the composition at 300° C. for 60 minutes.

The coatability when the photosensitive resin composition was applied to the substrate was good and in the cured film obtained after exposure, development, and baking, the occurrence of wrinkling and cracking was not confirmed. Further, the average step difference of the wiring 2 was 500 nm, and the film thickness of the prepared flattened film 4 was 2,000 nm.

Next, a bottom emission type organic EL element was formed on the obtained flattened film 4. First, a first electrode 5 made of ITO was formed on the flattened film 4 to be connected to the wiring 2 through the contact hole 7. Thereafter, a resist was applied, pre-baked, exposed through a mask having a desired pattern, heated, and developed. The resist pattern was used as a mask and pattern processing was carried out by wet etching using an ITO etchant. Then, a resist peeling liquid (REMOVER 100, manufactured by AZ Electronic Materials) was used to peel off the resist pattern at 50° C. The first electrode 5 obtained as described above corresponds to an anode of the organic EL element.

Next, an insulating film 8 was formed so as to cover the edge of the first electrode 5. The insulating film 8 was formed in the same manner as in the above-described manner using the photosensitive resin composition of Example 3 for the insulating film 8. By providing the insulating film 8, a short circuit between the first electrode 5 and a second electrode to be formed in the subsequent step can be prevented.

Further, a positive hole transport layer, an organic light emitting layer, and an electron transport layer were provided in sequence in a vacuum deposition device through desired pattern masks. Next, a second electrode made of Al was formed on the entire upper surface of the substrate. The obtained substrate was taken out from the deposition device and sealed with a sealing glass and an ultraviolet curing type epoxy resin by lamination.

In this manner, an active matrix type organic EL display device in which a TFT 1 was connected to each organic EL element in order to drive the elements was obtained. When a voltage was applied to the element through the driving circuit, it was found that the organic EL display device exhibited good surface properties and high reliability.

<Preparation of Liquid Crystal Display Device>

Example 202

In an active matrix type liquid crystal display device shown in FIG. 1 of JP3321003B, a cured film 17 was formed as an interlayer insulating film in the following manner, and thus a liquid crystal display device of Example 202 was obtained. That is, using the photosensitive resin composition of Example 3, a cured film 17 was formed as an interlayer insulating film.

That is, for the pre-treatment for improving the wettability of the substrate and the interlayer insulating film 17 in paragraph 0058 of JP3321003B, the substrate was exposed to the vapor of hexamethyldisilazane (HMDS) for 30 seconds and then the photosensitive resin composition of Example 3 was applied to the substrate by spin coating and then pre-baked on a hot plate at 90° C. for 2 minutes to volatilize a solvent. Thus, a photosensitive resin composition layer having a film thickness of 3 μm was formed. Next, the obtained photosensitive resin composition layer was exposed using a MPA 5500CF (high pressure mercury lamp) manufactured by Canon Inc., through a hole pattern mask having a diameter of 10 μm to have a cumulative irradiation dose of 40 mJ/cm$^2$ (energy intensity: 20 mW/cm$^2$, i-line). The photosensitive resin composition layer after exposure was heated on a hot plate at 90° C. for 2 minutes and then subjected to puddle development with an alkali developer (an aqueous 0.4% tetramethylammonium hydroxide solution) at 23° C. for 60 second. Then, the composition was rinsed with ultra pure water for 20 seconds. Subsequently, the entire surface of the composition layer was exposed using an ultra-high pressure mercury lamp so as to have a cumulative irradiation dose of 300 mJ/cm$^2$ (energy intensity: 20 mW/cm$^2$, i-line) and then the substrate was heated in an oven at 300° C. for 60 minutes to obtain a cured film.

The coatability when the photosensitive resin composition was applied to the substrate was good and in the cured film obtained after exposure, development, and baking, the occurrence of wrinkling and cracking was not confirmed.

When a driving voltage was applied to the obtained liquid crystal display device, it was found that the liquid crystal display device exhibited good surface properties and high reliability.

Example 203

A liquid crystal display device was prepared in the same manner as in Example 202 except that in Example 202, instead of using the photosensitive resin composition of Example 3, the photosensitive resin composition of Example 60 was used. When a driving voltage was applied to the obtained liquid crystal display device, it was found that the liquid crystal display device exhibited good surface properties and high reliability.

Example 204

A liquid crystal display device was prepared in the same manner as in Example 202 except that in Example 202, instead of using the photosensitive resin composition of Example 3, the photosensitive resin composition of Example 61 was used. When a driving voltage was applied to the obtained liquid crystal display device, it was found that the liquid crystal display device exhibited good surface properties and high reliability.

Example 205

A liquid crystal display device was prepared in the same manner as in Example 202 except that in Example 202, instead of using the photosensitive resin composition of Example 3, the photosensitive resin composition of Example 62 was used. When a driving voltage was applied to the obtained liquid crystal display device, it was found that the liquid crystal display device exhibited good surface properties and high reliability.

Example 206

In the liquid crystal display device shown in FIG. 1 of JP2007-328210A, an organic insulating film PAS was formed in the following manner and thus a liquid crystal display device was obtained.

First, an array substrate just before an organic insulating film PAS was formed in the liquid crystal display device shown in FIG. 1 of JP2007-328210A was prepared according to JP2007-328210A.

Next, the substrate was exposed to the vapor of HMDS for 30 seconds and then the photosensitive resin composition of Example 3 was applied to the substrate by slit coating. Thereafter, the composition was pre-baked on a hot plate at 90° C. for 2 minutes to volatilize a solvent. Thus, a photosensitive resin composition layer having a predetermined film thickness was formed.

Next, the obtained photosensitive resin composition layer was exposed through a 5 µmφ hole pattern mask using MPA 7800CF manufactured by Cannon Inc. in an optimum exposure dose mJ/cm$^2$ (energy intensity: 20 mW/cm$^2$, i-line) and heated on a hot plate at 80° C. for 90 seconds. Then, the resin composition layer after exposure was developed with an alkali developer (aqueous 0.6% tetramethylammonium hydroxide solution) and then rinsed with ultra pure water. Subsequently, the entire surface of the composition layer was exposed using an ultra-high pressure mercury lamp so as to have a cumulative irradiation dose of 300 mJ/cm$^2$ (measured at energy intensity: 20 mW/cm$^2$ with i-line) and then the substrate was heated in an oven at 300° C. for 60 minutes to obtain an organic insulating film PAS.

A liquid crystal display device was obtained according to JP2007-328210A in the following steps. Since a material having high heat resistance was used for PAS in Examples, the interlayer insulating film IN3 was formed at the same temperature as in the formation of the interlayer insulating film IN2. Accordingly, IN3 could be formed into a dense film.

When a driving voltage was applied to the obtained liquid crystal display device, it was found that the liquid crystal display device exhibited very good surface properties and high reliability.

Example 207

A liquid crystal display device was prepared in the same manner as in Example 206 except that in Example 206, instead of using the photosensitive resin composition of Example 3, the photosensitive resin composition of Example 60 was used. When a driving voltage was applied to the obtained liquid crystal display device, it was found that the liquid crystal display device exhibited good surface properties and high reliability.

Example 208

A liquid crystal display device was prepared in the same manner as in Example 206 in Example 206, instead of using the photosensitive resin composition of Example 3, the photosensitive resin composition of Example 61 was used. When a driving voltage was applied to the obtained liquid crystal display device, it was found that the liquid crystal display device exhibited good surface properties and high reliability.

Example 209

A liquid crystal display device was prepared in the same manner as in Example 206 in Example 206, instead of using the photosensitive resin composition of Example 3, the photosensitive resin composition of Example 62 was used. When a driving voltage was applied to the obtained liquid crystal display device, it was found that the liquid crystal display device exhibited good surface properties and high reliability.

<Preparation of Touch Panel>

Example 210

A touch panel display device was prepared in the following manner.
<Formation of First Transparent Electrode Pattern>
«Formation of Transparent Electrode Layer»

A front plate of reinforced glass on which a frame layer was formed in advance (300 mm×400 mm×0.7 mm) was introduced into a vacuum chamber and an ITO target having a content of $SnO_2$ of 10% by mass (indium:tin=95:5 (molar ratio)) was used to form an ITO thin film having a thickness of 40 nm by DC magnetron sputtering (conditions: temperature of substrate: 250° C., argon pressure: 0.13 Pa, and oxygen pressure: 0.01 Pa). Thus, a front plate on which a transparent electrode layer was formed was obtained. The surface electrical resistance of the ITO thin film was 80 Ω/□.

Next, a commercially available etching resist was applied on the ITO and dried to form an etching resist layer. A distance between the surface of an exposure mask (quartz exposure mask having a transparent electrode pattern) and the etching resist layer was set to 100 μm and pattern exposure was carried out at an exposure dose of 50 mJ/cm$^2$ (i-line). Then, the resist layer was developed with a developer and further post-baked at 130° C. for 30 minutes and thus a front plate on which the transparent electrode layer and the photosensitive resin layer pattern for etching were formed was obtained.

The front plate on which the transparent electrode layer and the photosensitive resin layer pattern for etching were formed was immersed in an etching tank containing an ITO etchant (hydrochloric acid, aqueous potassium chloride solution, liquid temperature: 30° C.) and treated for 100 seconds. The transparent electrode layer in the exposed portions which were not covered with the etching resist layer was removed by dissolution and thus a front surface layer having a transparent electrode layer pattern with an etching resist layer pattern was obtained.

Next, the front surface layer having a transparent electrode layer pattern with an etching resist layer pattern was immersed in an exclusive resist peeling liquid and the photosensitive resin layer pattern for etching was removed to obtain a front plate on which the frame layer and the first transparent electrode pattern were formed.

«Formation of Insulating Layer»

The photosensitive resin composition of Example 3 was applied to the front plate on which the frame layer and the first transparent electrode pattern were formed, and dried (film thickness: 1 μm, at 90° C. for 120 seconds) to obtain a photosensitive resin composition layer. A distance between the surface of an exposure mask (quartz exposure mask having an insulating layer pattern) and the photosensitive resin composition layer was set to 30 μm and pattern was exposed in the optimum exposure dose obtained in the sensitivity evaluation.

Next, the composition was heated on a hot plate at 90° C. for 2 minutes, then developed at 23° C. for 15 seconds with an aqueous 2.38% by mass tetramethylammonium hydroxide solution by puddle method and further rinsed with ultra pure water for 10 seconds. Subsequently, a post-baking treatment was carried out at 300° C. for 60 minutes and a front plate on which the frame layer, the first transparent electrode pattern, and the insulating layer pattern were formed was obtained.

<Formation of Second Transparent Electrode Pattern>
«Formation of Transparent Electrode Layer»

A front surface on which an insulating layer pattern was formed was subjected to a DC magnetron sputtering treatment (conditions: temperature of substrate: 50° C., argon pressure: 0.13 Pa, and oxygen pressure: 0.01 Pa) in the same manner as in the formation of the above first transparent electrode pattern to obtain an ITO thin film having a thickness of 80 nm. Thus, a front plate on which a transparent electrode layer was formed was obtained. The surface electrical resistance of the ITO thin film was 110 Ω/□.

Further, etching was carried out in the same manner as in the formation of the first transparent electrode pattern to remove the etching resist layer. Thus, a front plate on which the frame layer, the first transparent electrode pattern, the insulating layer pattern formed using the photosensitive resin composition of Example 3, and the second transparent electrode pattern were formed was obtained.

<Formation of Conductive Element Other than First and Second Transparent Electrode Patterns>

The front plate on which the frame layer, the first transparent electrode pattern, the insulating layer pattern formed using the photosensitive resin composition of Example 3, and the second transparent electrode pattern were formed was subjected to a DC magnetron sputtering treatment in the same manner as in the formation of the first and second transparent electrode patterns to obtain a front plate on which an aluminum (Al) thin film having a thickness of 200 nm was formed.

Further, etching was carried out in the same manner as in the formation of the first transparent electrode pattern to remove the etching resist layer. Thus, front plate on which the frame layer, the first transparent electrode pattern, the insulating layer pattern formed using the photosensitive resin composition of Example 3, the second transparent electrode pattern, and a conductive element other than the first and second transparent electrode patterns were formed was obtained.

<Formation of Transparent Protective Layer>

The photosensitive resin composition of Example 3 was applied to the front plate on which the conductive element other than the first and second transparent electrode patterns and dried (film thickness: 1 m at 90° C. for 120 seconds) in the same manner as in the formation of the insulating layer to obtain a photosensitive resin composition film. Further, exposure, a heating treatment, development, post-exposure (1,000 mJ/cm$^2$), and post-baking treatment were carried out and thus a front plate on which an insulating layer (transparent protective layer) formed using the photosensitive resin composition of Example 3 was formed so as to cover all of the frame layer, the first transparent electrode pattern, the insulating layer pattern formed using the photosensitive resin composition of Example 3, the second transparent electrode pattern, and the conductive element other than the first and second transparent electrode patterns is laminated was obtained.

<Preparation of Touch Panel Display Device>

The front plate prepared in advance was attached to the liquid crystal display element produced by the method described in JP2009-47936A and thus a touch panel display device including an electrostatic capacitance type touch panel as a constitutional element was prepared in a known method.

<Evaluation of Front Plate and Touch Panel Display Device>

While there was no problem in conductivity of each of the first transparent electrode pattern, the second transparent electrode pattern, and the conductive element other than the first and second transparent electrode patterns, the first transparent electrode pattern and the second transparent electrode pattern were insulated from each other and good display properties as a touch panel were obtained.

Example 211

A touch panel display device was prepared in the following manner.

A touch panel display device shown in FIG. 19 of JP2013-168125A was prepared according to JP2013-168125A. At this time, an insulating film 1800 of a lower display plate 1000 was prepared using the photosensitive resin composition of Example 95.

In addition, an insulating film 1800 and an insulating film 1400 of an upper display plate 2000 were prepared using the following curable composition.

KAYARAD DPHA (manufactured by Nippon Kayaku Co., Ltd.): 200 parts

Succinic acid mono-[3-(3-acryloyloxy-2,2-bis-acryloyloxymethyl-propoxy)-2,2-bis-acryloyloxymethyl-propyl]ester: 10 parts Polyfunctional urethane acrylate UN-3320HS (manufactured by Negami Chemical Industrial Co., Ltd.): 10 parts IRGACURE OXE-01 (manufactured by BASF SE): 8 parts IRGACURE 907 (manufactured by BASF SE): 4 parts EPIKOTE 157S65 (manufactured by Japan Epoxy Resins Co., Ltd.): 10 parts PGMEA: 300 parts MEDG: 400 parts FTX-218 (manufactured by Neos Corporation): 0.7 parts (Formation of Insulating Film 1800 of Upper Display Plate 2000)

To the substrate on which a layer just before the insulating film 1800 of the upper display plate 2000 was formed was prepared, the curable composition was applied by ink jet coating and a solvent was removed to form a film having a thickness of 1.2 μm.

The composition was exposed in a nitrogen atmosphere using a high pressure mercury lamp at 300 mJ/cm² and heated at 100° C. for 60 minutes.

The insulating film 1400 of the upper display plate 2000 was formed in the same manner.

The device prepared in the above-described manner exhibited good display performance and touch performance.

Example 301

<Formation of Hole Pattern (Spin Coating)>
«Determination of Optimum Exposure Dose»

The photosensitive resin composition of Example 95 was applied to a glass substrate which had been subjected to a surface treatment in the vapor of hexamethyldisilazane for 1 minute (1,100 mm×1,300 mm size, 0.7 mm thickness, manufactured by Corning Inc.) by slit coating and then pre-baked on a hot plate at 100° C. for 90 seconds under a reduced pressure of 266 Pa (2.0 Torr) to volatilize a solvent. Thus, a photosensitive resin composition layer having a film thickness of 3.0 μm was formed. Next, the obtained photosensitive resin composition layer was exposed to a 6.0 μm hole pattern using a MPAsp-H760 exposure machine manufactured by Canon Inc. The composition was heated on a hot plate at 80° C. for 90 seconds, then subjected to puddle development with an alkali developer (aqueous 2.38% by mass tetramethylammonium hydroxide solution) (25° C. for 60 seconds) and rinsed with ultra pure water for 30 seconds. Thus, the exposure dose for forming a hole pattern having a bottom diameter of 6.0 μm was determined as the optimum exposure dose. The viscosity of the photosensitive resin composition of Example 95 at 25° C. was 9 mPa·s and the surface tension was 27 mN/m.

«Formation of Hole Pattern after Development»

The photosensitive resin composition of Example 95 was applied to a glass substrate which had been subjected to a surface treatment in the vapor of hexamethyldisilazane for 1 minute (1,100 mm×1,300 mm size, 0.7 mm thickness, manufactured by Corning Inc.), and then pre-baked on a hot plate at 100° C. for 90 seconds under a reduced pressure of 266 Pa (2.0 Torr) to volatilize a solvent. Thus, a photosensitive resin composition layer having a film thickness of 3.0 m was formed. Next, the obtained photosensitive resin composition layer was exposed to a 6.0 μm hole pattern using a MPAsp-H760 exposure machine manufactured by Canon Inc. by the optimum exposure dose obtained above. The composition was heated on a hot plate at 80° C. for 90 seconds, then subjected to puddle development with an alkali developer (aqueous 2.38% by mass tetramethylammonium hydroxide solution) (25° C. for 60 seconds) and rinsed with ultra pure water for 30 seconds. Thus, a hole pattern after development was formed.

«Formation 1 of Hole Pattern after Heating»

The substrate on which the hole pattern after development was formed was heated in an oven purged with nitrogen (oxygen concentration: 240 ppm) at 350° C. for 60 minutes. Thus, the final hole pattern was formed. A hole pattern having a fine round shape could be formed. When the taper angle was measured from the image of the cross section of the hole, the taper angle was 11°.

«Formation 2 of Hole Pattern after Heating»

The substrate on which the hole pattern after development was formed was exposed using an ultra-high pressure mercury lamp at an exposure dose of 210 mJ/cm², then heated in an oven purged with nitrogen (oxygen concentration: 999 ppm) at 110° C. for 30 minutes and then heated in an oven purged with nitrogen (oxygen concentration: 102 ppm) at 320° C. for 60 minutes. Thus, the final hole pattern was formed. A hole pattern having a fine round shape could be formed. When the taper angle was measured from the image of the cross section of the hole, the taper angle was 480°.

«Formation 3 of Hole Pattern after Heating»

The substrate on which the hole pattern after development was formed was exposed using an ultra-high pressure mercury lamp at an exposure dose of 590 mJ/cm² and then heated in an oven purged with nitrogen (oxygen concentration: 490 ppm) by raising the temperature from 20° C. to 370° C. by 2° C. every minute. Thus, the final hole pattern was formed. A hole pattern having a fine round shape could be formed. When the taper angle was measured from the image of the cross section of the hole, the taper angle was 72°.

Example 302

The photosensitive resin compositions of Examples 72 to 94 and 96 to 104 were used to form a hole pattern in the same manner as in the hole pattern formation of the photosensitive resin composition of Example 301. A hole pattern having a fine round shape could be formed.

Example 303

A mixed composition in which the photosensitive resin composition of Example 102, the photosensitive resin composition of Example 103, and the photosensitive resin composition of Example 105 were mixed in the same amount respectively was used to form a hole pattern in the same manner as in the hole pattern formation of the photosensitive resin composition of Example 301. A hole pattern having a fine round shape could be formed.

Example 304

A mixed composition in which the photosensitive resin composition of Example 96 and the photosensitive resin composition of Example 98 were mixed in the same amount respectively was used to form a hole pattern in the same manner as in the hole pattern formation of the photosensitive resin composition of Example 301. A hole pattern having a fine round shape could be formed.

Example 305

A mixed composition in which the photosensitive resin composition of Example 84, the photosensitive resin composition of Example 85, and the photosensitive resin composition of Example 86 were mixed in the same amount respectively was used to form a hole pattern in the same manner in the hole pattern formation of the photosensitive resin composition of Example 301. A hole pattern having a fine round shape could be formed.

Example 401

<Formation of Hole Pattern (Spin Coating)>
«Determination of Optimum Exposure Dose»

The photosensitive resin composition of Example 105 was applied to a glass substrate which had been subjected to a surface treatment in the vapor of hexamethyldisilazane for 1 minute (300×400 mm size, 1.2 mm thickness) by spin coating and then pre-baked on a hot plate at 100° C. for 90 seconds under a reduced pressure of 266 Pa (2.0 Torr) to volatilize a solvent. Thus, a photosensitive resin composition layer having a film thickness of 2.5 μm was formed. Next, the obtained photosensitive resin composition layer was exposed to a 4.0 μm hole pattern using a YAG laser (wavelength: 355 nm). The composition layer was heated on a hot plate at 80° C. for 120 seconds, then subjected to puddle development with an alkali developer (aqueous 1.5% by mass tetramethylammonium hydroxide solution) (23° C. for 60 seconds) and rinsed with ultra pure water for 30 seconds. Thus, the exposure dose for forming a hole pattern having a bottom diameter of 4.0 μm was determined as the optimum exposure dose.

The viscosity of the photosensitive resin composition of Example 105 at 25° C. was 30 mPa·s and the surface tension was 27 mN/m.

«Formation 1 of Hole Pattern after Heating»

The substrate on which the hole pattern after development was formed was heated in an oven purged with nitrogen (oxygen concentration: 45 ppm) at 290° C. for 90 minutes. Thus, the final hole pattern was formed. A hole pattern having a fine round shape could be formed. When the taper angle was measured from the image of the cross section of the hole, the taper angle was 15°.

«Formation 2 of Hole Pattern after Heating»

The substrate on which the hole pattern after development was exposed using an ultra-high pressure mercury lamp at an exposure dose of 350 mJ/cm², then heated in an oven purged with nitrogen (oxygen concentration: 11,100 ppm) at 98° C. for 40 minutes, and heated in an oven purged with nitrogen (oxygen concentration: 1,100 ppm) at 320° C. for 60 minutes. Thus, the final hole pattern was formed. A hole pattern having a fine round shape could be formed. When the taper angle was measured from the image of the cross section of the hole, the taper angle was 58°.

«Formation 3 of Hole Pattern after Heating»

The substrate on which the hole pattern after development was exposed using an ultra-high pressure mercury lamp at an exposure dose of 810 mJ/cm² and then heated in an oven purged with nitrogen (oxygen concentration: 8,000 ppm) by raising the temperature from 20° C. to 370° C. by 2° C. every minute. Thus, the final hole pattern was formed. A hole pattern having a fine round shape could be formed. When the taper angle was measured from the image of the cross section of the hole, the taper angle was 81°.

Example 402

The photosensitive resin compositions of Examples 70 to 104 were used to form a hole pattern in the same manner as in the hole pattern formation of the photosensitive resin composition of Example 401. A hole pattern having a fine round shape could be formed in all photosensitive resin compositions.

EXPLANATION OF REFERENCES

1: TFT
2: wiring
3: insulating film
4: flattened film
5: first electrode
6: glass substrate
7: contact hole
8: insulating film
10: liquid crystal display device
12: backlight unit
14, 15: glass substrate
16: TFT
17: cured film
18: contact hole
19: ITO transparent electrode
20: liquid crystal
22: color filter
30: electrostatic capacitance type touch panel
31: front plate
32: frame layer
33: first transparent electrode pattern
33a: pad portion
33b: connection portion
34: second transparent electrode pattern
35: insulating layer
36: conductive element
37: transparent protective layer
38: opening portion
110: pixel substrate
111: polarizing plate
112: transparent substrate
113: common electrode
114: insulating layer
115: pixel electrode
116: alignment film
120: counter substrate
121: alignment film
122: color filter
123: transparent substrate
124: phase difference film
126: adhesive layer
127: polarizing plate
130: sensor portion
200: lower display plate
210: insulating substrate
220: gate electrode
240: gate insulating film
250: semiconductor layer
260: ohmic contact layer
270: source electrode
272: drain electrode
280: insulating film
282: contact hole
290: pixel electrode
300: upper display plate
310: insulating substrate
320: light blocking member
330: color filter
350: alignment film
370: common electrode

400: liquid crystal layer
410: sensing electrode
420: insulating film
430: touch driving electrode
600: protective film
CT: counter electrode
GI: gate insulating film
GT: gate electrode
IN1: first interlayer insulating film
IN2: second interlayer insulating film
IN3: third interlayer insulating film
PAS: organic insulating film
PS: semiconductor film
PX: pixel electrode
RAL: reflective film
SD1: drain electrode
SD2: source electrode
SUB1: glass substrate
UC: base film

What is claimed is:

1. A photosensitive resin composition comprising:
a polybenzoxazole precursor;
at least one selected from a photoacid generator which generates an acid having a pKa of 3 or less, and a quinone diazide compound; and
a solvent,
wherein the polybenzoxazole precursor contains a total of 70 mol % or more of a repeating unit represented by the following Formula (1) and a repeating unit represented by the following Formula (2) with respect to the total repeating units in the polybenzoxazole precursor, and a content ratio between the repeating unit represented by Formula (1) and the repeating unit represented by Formula (2) is 9:1 to 3:7 in a molar ratio,

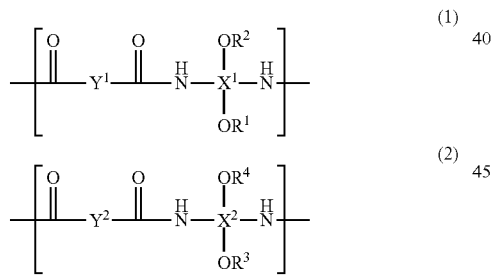

in Formulae (1) and (2), $X^1$ and $X^2$ each independently represent a tetravalent organic group,
$R^1$ to $R^4$ each independently represent a hydrogen atom, an alkyl group, an acid decomposable group or a group represented by —CORc, and at least one of $R^1$ to $R^4$ represents a hydrogen atom or an acid decomposable group,
Rc represents an alkyl group or an aryl group,
$Y^1$ represents a cyclic aliphatic group having 3 to 15 carbon atoms, and
$Y^2$ represents a linear or branched aliphatic group having 4 to 20 carbon atoms.

2. The photosensitive resin composition according to claim 1,
wherein the photosensitive resin composition comprises a photoacid generator which generates an acid having a pKa of 3 or less, and 10 to 60% of acid groups of the total repeating units of the polybenzoxazole precursor are protected with the acid decomposable group in the polybenzoxazole precursor.

3. The photosensitive resin composition according to claim 1,
wherein the polybenzoxazole precursor has a structure in which a terminal is sealed with a monofunctional acid chloride.

4. The photosensitive resin composition according to claim 1,
wherein $Y^1$ in Formula (1) is a cyclohexylene group or a biscyclohexylene group.

5. The photosensitive resin composition according to claim 1,
wherein $X^1$ in Formula (1) and $X^2$ in Formula (2) each independently represent one selected from the following Formulae (X-1) to (X-4),

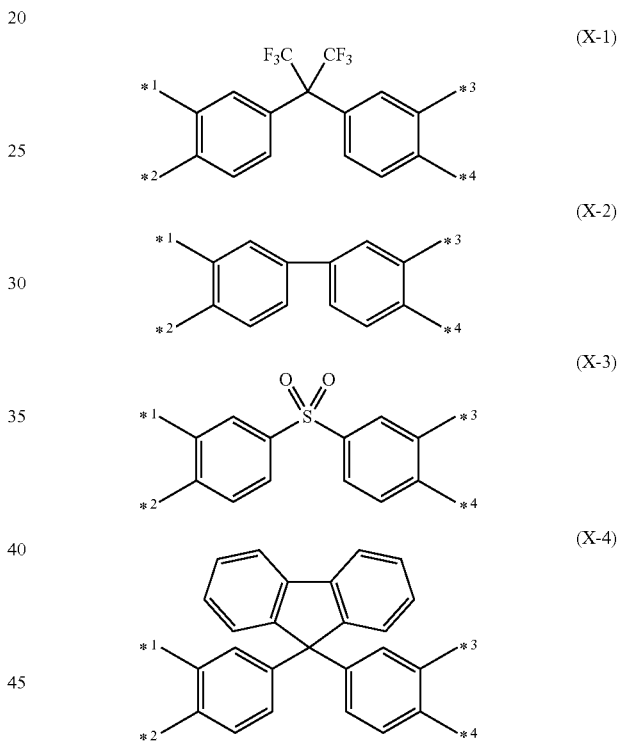

in Formulae (X-1) to (X-4), one of *1 or *2 represents a coupler hand with —$OR^1$ or —$OR^3$ and the other represents a coupler hand with a polymer main chain, and
one of *3 or *4 represents a coupler hand with —$OR^2$ or —$OR^4$ and the other represents a coupler hand with a polymer main chain.

6. A method for producing a cured film comprising:
applying the photosensitive resin composition according to claim 1 to a substrate;
removing a solvent from the applied photosensitive resin composition;
exposing the photosensitive resin composition from which the solvent is removed to active radiation;
developing the exposed photosensitive resin composition with a developer; and
thermosetting the developed photosensitive resin composition.

7. The method for producing a cured film according to claim 6, further comprising:
   exposing the developed photosensitive resin composition after the developing and before the thermosetting.

8. A cured film which is formed by curing the photosensitive resin composition according to claim 1.

9. The cured film according to claim 8 which is an interlayer insulating layer.

10. A liquid crystal display device comprising:
   the cured film according to claim 8.

11. An organic electroluminescent display device comprising:
   the cured film according to claim 8.

12. A touch panel comprising:
   the cured film according to claim 8.

13. The photosensitive resin composition according to claim 1, wherein the composition is free from a basic compound.

14. The photosensitive resin composition according to claim 1, wherein the composition contains a crosslinking agent.

15. The photosensitive resin composition according to claim 14, wherein the crosslinking agent contains a blocked isocyanate compound.

\* \* \* \* \*